United States Patent [19]

Oguchi et al.

[11] Patent Number: 5,701,031
[45] Date of Patent: Dec. 23, 1997

[54] SEALED STACKED ARRANGEMENT OF SEMICONDUCTOR DEVICES

[75] Inventors: Satoshi Oguchi, Ohme; Masamichi Ishihara; Kazuya Ito, both of Hamura-machi; Gen Murakami, Tama; Ichiro Anjoh, Koganei; Toshiyuki Sakuta; Yasunori Yamaguchi, both of Ohme; Yasuhiro Kasama, Tokyo; Tetsu Udagawa, Iruma; Eiji Miyamoto, Tokyo; Youichi Matsuno, Koganei; Hiroshi Satoh, Kodaira; Atsusi Nozoe, Ohme, all of Japan

[73] Assignee: Hitachi, Ltd., Tokyo, Japan

[21] Appl. No.: 280,381

[22] Filed: Jul. 25, 1994

Related U.S. Application Data

[62] Division of Ser. No. 691,985, Apr. 26, 1991, Pat. No. 5,332,922.

[30] Foreign Application Priority Data

Apr. 26, 1990 [JP] Japan ................... 2-108621
Mar. 31, 1991 [JP] Japan ................... 3-74530

[51] Int. Cl.⁶ ........................ H01L 23/28; H01L 23/535; H01L 23/538; H01L 25/065
[52] U.S. Cl. ........................ 257/686; 257/724; 257/786; 257/787
[58] Field of Search ................ 257/686, 724, 257/786, 787; 437/915, 208

[56] References Cited

U.S. PATENT DOCUMENTS

| | | | |
|---|---|---|---|
| 3,681,757 | 8/1972 | Allen et al. | 340/172.5 |
| 4,694,183 | 9/1987 | Merrick et al. | 250/551 |
| 4,751,564 | 6/1988 | Landis | 357/75 |
| 4,763,188 | 8/1988 | Johnson | 357/74 |
| 4,878,106 | 10/1989 | Sachs | 357/72 |
| 4,941,033 | 7/1990 | Kishida | 357/75 |
| 4,992,984 | 2/1991 | Busch et al. | 365/200 |
| 5,068,712 | 11/1991 | Murakami et al. | 357/72 |
| 5,083,189 | 1/1992 | Sawaya | 357/72 |
| 5,138,438 | 8/1992 | Masayuki et al. | 357/75 |
| 5,147,815 | 9/1992 | Casto | 437/208 |
| 5,208,782 | 5/1993 | Sakuta et al. | 257/786 |
| 5,334,875 | 8/1994 | Sugano et al. | 257/686 |

FOREIGN PATENT DOCUMENTS

| | | | |
|---|---|---|---|
| 0198194 | 10/1986 | European Pat. Off. . | |
| 0270069 | 6/1988 | European Pat. Off. . | |
| 55-143059 | 11/1980 | Japan | 257/686 |
| 062350 | 5/1981 | Japan . | |
| 137665 | 10/1981 | Japan . | |
| 080846 | 4/1986 | Japan . | |
| 284951 | 12/1986 | Japan . | |
| 065447 | 3/1987 | Japan . | |
| 119952 | 6/1987 | Japan . | |
| 283634 | 12/1987 | Japan . | |

(List continued on next page.)

OTHER PUBLICATIONS

Pat. Abstracts of Japan, vol. 013, No. 298, Jul. 10, 1989.
Pat. Abstracts of Japan, vol. 014, No. 564, Dec. 14, 1990.

(List continued on next page.)

*Primary Examiner*—David Graybill
*Attorney, Agent, or Firm*—Antonelli, Terry, Stout & Kraus, LLP.

[57] ABSTRACT

A pair of DRAM chips 1A and 1B are mounted opposedly to each other with wiring means such as lead frames put therebetween, the lead frames being substantially integral with external terminals 3B. Then, these DRAM chips and lead frames are connected together by the conventional wire bonding method. Plural pairs of the thus-connected DRAM chips and lead frames are stacked and corresponding leads of the lead frames are connected in common to form a laminate. The plural DRAM chips thus mounted are activated selectively in accordance with a predetermined chip selection signal. Additionally, partial DRAM chips capable of partially functioning normally are combined together by utilizing the above chip mounting method to constitute a single DRAM package.

16 Claims, 45 Drawing Sheets

FOREIGN PATENT DOCUMENTS

| | | | |
|---|---|---|---|
| 004636 | 1/1988 | Japan . | |
| 018654 | 1/1988 | Japan . | |
| 136642 | 6/1988 | Japan . | |
| 248154 | 10/1988 | Japan . | |
| 641269 | 1/1989 | Japan | 257/686 |
| 077135 | 3/1989 | Japan . | |
| 184860 | 7/1989 | Japan . | |
| 1-303730 | 12/1989 | Japan | 437/208 |
| 2-32547 | 2/1990 | Japan | 437/208 |
| 066965 | 3/1990 | Japan . | |
| 073662 | 3/1990 | Japan . | |
| 273662 | 3/1990 | Japan | 257/724 |
| 184063 | 7/1990 | Japan . | |
| 246125 | 10/1990 | Japan . | |
| 208959 | 11/1990 | Japan . | |
| 016162 | 1/1991 | Japan . | |
| 2170657 | 8/1986 | United Kingdom . | |

OTHER PUBLICATIONS

Pat. Abstracts of Japan, vol. 012, No. 395, Oct. 20, 1988.
Pat. Abstracts of Japan, vol. 013, No. 470, Oct. 24, 1989.
Pat. Abstracts of Japan, vol. 014, No. 502, Aug. 20, 1990.
Pat. Abstracts of Japan, vol. 011, No. 338, Nov. 5, 1987.
Pat. Abstracts of Japan, vol. 012, No. 207, Jun. 14, 1988.
Pat. Abstracts of Japan, vol. 005, No. 125, Aug. 12, 1981.
Pat. Abstracts of Japan, vol. 013, No. 058, Feb. 9, 1988.
Pat. Abstracts of Japan, vol. 006, No. 016, Jan. 29, 1982.
Pat. Abstracts of Japan, vol. 014, No. 252, May 30, 1990.
Pat. Abstracts of Japan, vol. 012, No. 225, Jun. 25, 1988.
Pat. Abstracts of Japan, vol. 014, No. 244, May 24, 1990.
Pat. Abstracts of Japan, vol. 015, No. 135, Apr. 4, 1991.
Pat. Abstracts of Japan, vol. 014, No. 457, Oct. 2, 1990.
Pat. Abstracts of Japan, vol. 011, No. 254, Aug. 18, 1987.
Pat. Abstracts of Japan, vol. 010, No. 251, Aug. 28, 1986.
Electronics, vol. 39, No. 48, Nov. 25, 1960, pp. 78–80.
IBM Technical Disclosure Bulletin, vol. 015, No. 011, Apr. 1973, pp. 3453–3454.
IBM Technical Disclosure Bulletin, vol. 015, No. 010, Mar. 1973, pp. 3050–3051.
IBM Technical Disclosure Bulletin, vol. 021, No. 009, Feb. 1979, pp. 3582–3583.
Proceedings of the 19th IEEE Computer Society International Conference, COMPCON, Sep. 4, 1979, Washington, D.C., pp. 425–427.
IBM Technical Disclosure Bulletin, vol. 032, No. 007, Dec. 1989, pp. 183–184.

FIG. 3

STANDARD SPECIFICATION OF 64M DRAM SUB CHIP

| ITEM | | SPECIFIGURATION | | |
|---|---|---|---|---|
| BIT CONFIGUCATION | | 64megaword x 1bit | 16megaword x 4bits | 8megaword x 8bits |
| ADDRESS | CHIP | X13 | X13 | X13 |
| | ROW | X0~X12 | X0~X12 | X0~X12 |
| | COLUMN | Y0~Y12 | Y0~Y10 | Y0~Y9 |
| PACKAGE | | 32PINS  SOJ  300 x 850 mil | | |
| NUMBER OF PINS USED | | 23PINS<br>CLOCK : 3<br>ADDRESS : 14<br>I/O : 2<br>POWER SOURCE: 4 | 26PINS<br>CLOCK : 4<br>ADDRESS : 14<br>I/O : 4<br>POWER SOURCE: 4 | 32PINS<br>CLOCK : 4<br>ADDRESS : 14<br>I/O : 8<br>POWER SOURCE: 6 |
| REFRESH | | 8192 CYCLE / 64 ms | | |
| STANDARD PARALLEL TEST | | 8-bit PARALLEL PROCESSING (ALL I/O SAME DATA OUTPUT) | | |
| HIGH SPEED COLUMN MODE | | FAST PAGE<br>STATIC COLUMN<br>NIBBLE | FAST PAGE<br>STATIC COLUMN | FAST PAGE<br>STATIC COLUMN |
| | | THE COLUMNDEPTH IN FP AND SC MODES IS 8K bits AT MOST | | |

BASIC LAYOUT OF 64M DRAM SUB CHIP

CONCEPTUAL DIAGRAM OF 64M DRAM SUB CHIP SELECTION

VARIATIONS OF 128M DRAM PACKAGE

| 64M DRAM SUB CHIP | | | 128M DRAM PACKAGE | | | REMARKS |
|---|---|---|---|---|---|---|
| WORD CONFIGURATION | BIT CONFIGURATION | ACCESS | WORD CONFIGURATION | BIT CONFIGURATION | CORRESPONDING DIAGRAM | |
| 64mega | x 1 | SELECTIVE | 128mega | x 1 | FIG. 1 | |
| 64mega | x 1 | SIMULTANEOUS | 64mega | x 2 | FIG. 8 | |
| 16mega | x 4 | SELECTIVE | 32mega | x 4 | FIG. 9 | |
| 16mega | x 4 | SIMULTANEOUS | 16mega | x 8 | FIG. 10 | |
| 8mega | x 8 | SELECTIVE | 16mega | x 8 | FIG. 11 | |
| 8mega | x 8 | SIMULTANEOUS | 8mega | x 16 | FIG. 12 | |

PROCESS 1: BONDING TO PELLET

PROCESS 2: WIRE BONDING

PROCESS 3: LEAD CUTTING AND BONDING

PROCESS 4: SEALING (LEAD CUT AND BONDED PORTIONS ARE LOCATED WITHIN RESIN.)

PROCESS 5: LEAD FORMING

FIG. 30
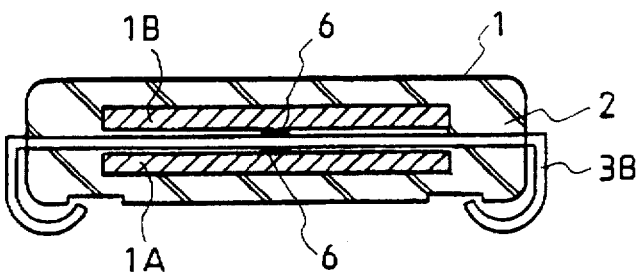
FIG. 31
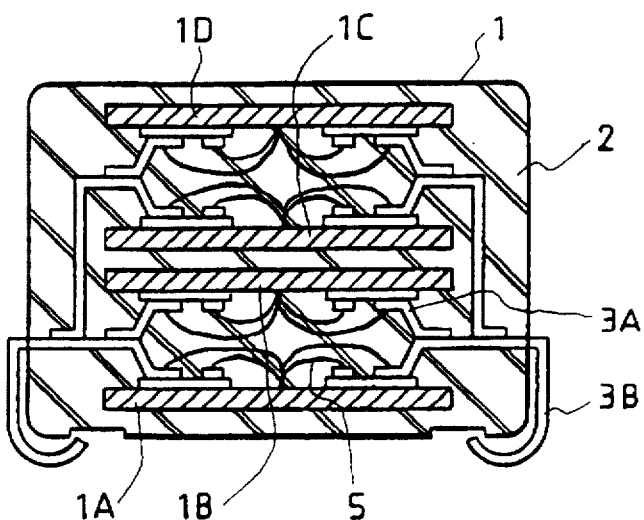
FIG. 32
BONDING OPTIONS OF 64M DRAM SUB CHIPS
| F1  | F2  | F3  | TC  | BIT CONFIGURATION | CHIP SELECT      | I/O TERMINAL |
|-----|-----|-----|-----|-------------------|------------------|--------------|
| VCC | VCC | --  | NC  | x 1               | NORMAL SELECT    | Din/Dout     |
| VCC | NC  | --  | NC  | x 4               | NORMAL SELECT    | DIO0~DIO3    |
| NC  | NC  | --  | NC  | x 8               | NORMAL SELECT    | DIO0~DIO7    |
| --  | --  | NC  | VCC | --                | SELECT AT X13=H  | --           |
| --  | --  | VCC | VCC | --                | SELECT AT X1L L  | --           |
NC: NO SELECT
--: DON'T CARE (CORRESPONDING TO FIG. 9)

(CORRESPONDING TO FIG. 10)

FIG. 53
BONDING OPTIONS OF 64M DRAM PARTIAL CHIPS

| F3  | TC  | PTA | PTX | PTY | BX12  | BY12  | CHIP SELECT     | IO OPERATION     |
|-----|-----|-----|-----|-----|-------|-------|-----------------|------------------|
| --  | NC  | --  | NC  | NC  | X12   | Y12   | NORMAL SELECT   | NORMAL EXECUTE   |
| NC  | VCC | --  | NC  | NC  | X12   | Y12   | SELECT AT X13=H | NORMAL EXECUTE   |
| VCC | VCC | --  | NC  | NC  | X12   | Y12   | SELECT AT X13=L | NORMAL EXECUTE   |
| NC  | VCC | NC  | VCC | NC  | H FIX | Y12   | SELECT AT X12=H | NORMAL EXECUTE   |
| NC  | VCC | VCC | VCC | NC  | L FIX | Y12   | SELECT AT X12=H | NORMAL EXECUTE   |
| VCC | VCC | NC  | VCC | NC  | H FIX | Y12   | SELECT AT X12=L | NORMAL EXECUTE   |
| VCC | VCC | VCC | VCC | NC  | L FIX | Y12   | SELECT AT X12=L | NORMAL EXECUTE   |
| NC  | NC  | NC  | NC  | VCC | X12   | H FIX | NORMAL SELECTH  | EXECUTE AT Y12=H |
| NC  | NC  | VCC | NC  | VCC | X12   | L FIX | NORMAL SELECT   | EXECUTE AT Y12=H |
| VCC | NC  | NC  | NC  | VCC | X12   | H FIX | NORMAL SELECT   | EXECUTE AT Y12=L |
| VCC | NC  | VCC | NC  | VCC | X12   | L FIX | NORMAL SELECT   | EXECUTE AT Y12=L |

FIG. 54
VARIATIONS OF 64M DRAM PACKAGE

| 64M DRAM PARTIAL CHIP | | | | 64M DRAM PACKAGE | | | REMARKS |
|---|---|---|---|---|---|---|---|
| WORD CON-FIGURATION | BIT CON-FIGURATION | NORMAL PORTION | ACCESS | WORD CON-FIGURATION | BIT CON-FIGURATION | CORRESPOND-ING DIAGRAM | |
| 32mega | x 1 | ROW 1/2    | SELECTIVE   | 64mega | x 1 | FIG. 47 | |
| 32mega | x 1 | COLUMN 1/2 | SIMULTANEOUS| 64mega | x 1 | FIG. 50 | IO SELECTIVE EXECUTE |
| 16mega | x 2 | COLUMN 1/2 | SIMULTANEOUS| 16mega | x 4 | FIG. 55 | IO SIMULTANEOUS EXECUTE |
| 8mega  | x 4 | ROW 1/2    | SELECTIVE   | 16mega | x 4 | FIG. 56 | |
| 8mega  | x 4 | COLUMN 1/2 | SIMULTANEOUS| 16mega | x 4 | FIG. 57 | IO SELECTIVE EXECUTE |
| 8mega  | x 4 | COLUMN 1/2 | SIMULTANEOUS| 8mega  | x 8 | FIG. 58 | IO SIMULTANEOUS EXECUTE |
| 4mega  | x 8 | ROW 1/2    | SELECTIVE   | 8mega  | x 8 | FIG. 59 | |

FIG. 60
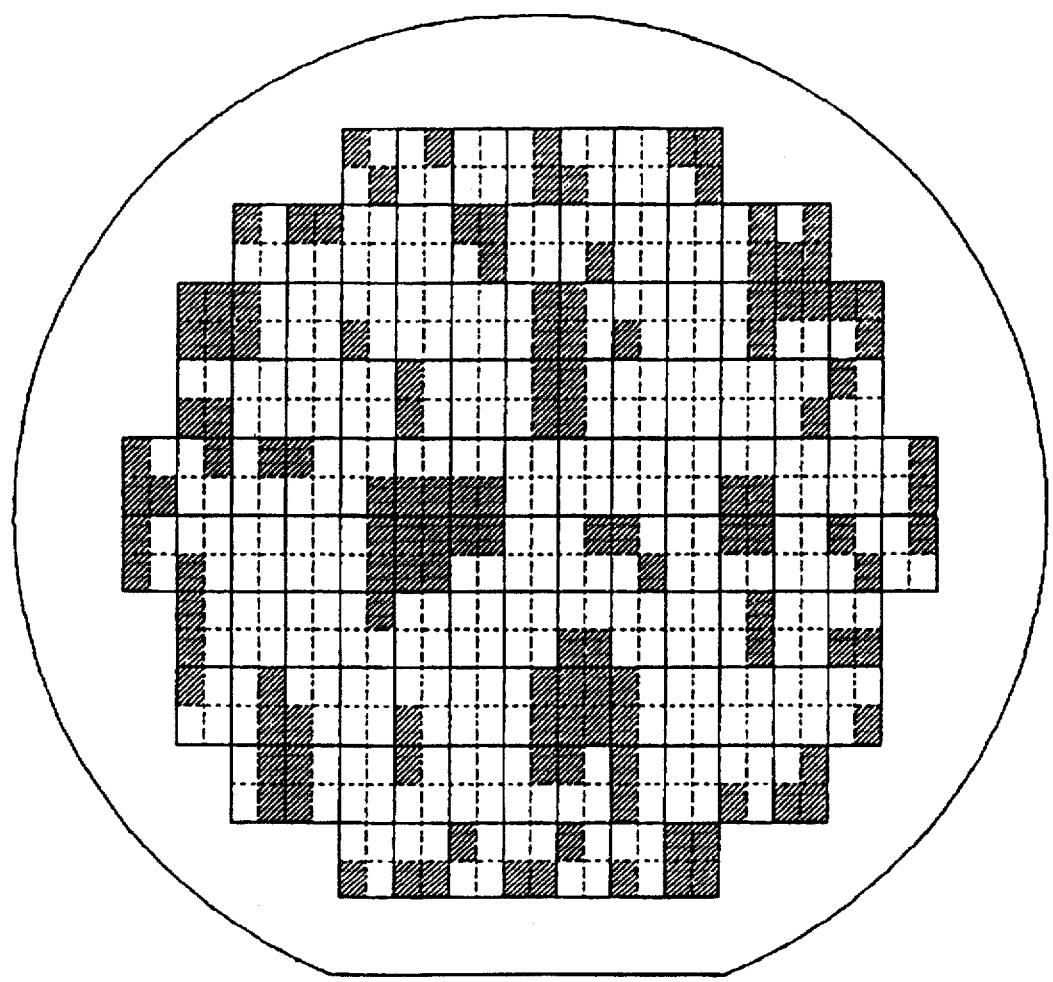
NUMBER OF CONFORMING PRODUCTS (IN 64mega)
CONVENTIONAL METHOD: 45pcs
DOUBULE CHIP PACKAGE METHOD: 75pcs
 64M DRAM CHP
DEFECTIVE PORTION

SEALED STACKED ARRANGEMENT OF SEMICONDUCTOR DEVICES

This is a divisional of application Ser. No. 07/691,985, filed Apr. 26, 1991, U.S. Pat. No. 5,332,922.

BACKGROUND OF THE INVENTION

The present invention relates to a semiconductor device and a method for manufacturing the same. For example, the present invention is concerned with a DRAM package (a semiconductor device with one or plural DRAM chips mounted thereon will hereinafter be referred to herein as "DRAM package") comprising plural DRAM (Dynamic Random Access Memory) chips (a semiconductor chip capable of functioning as DRAM will hereinafter be referred to herein as "DRAM chip"), as well as a technique which is particularly useful in producing such DRAM package.

A DRAM chip having as a basic configuration a memory array comprising lattice-like arranged dynamic memory cells as well as a DRAM package having such DRAM chip as a basic configuration are known. In the conventional DRAM package, usually, one DRAM chip is mounted thereon and bonding pads used therein are connected to corresponding leads of a lead frame integral with external terminals.

As to the DRAM package carrying a single DRAM chip thereon, it is described, for example, in U.S. Ser. No. 496,280 filed Mar. 20, 1990.

Recent success towards higher integration density and larger memory capacity of a DRAM chip has been remarkable and correspondingly the chip area has been increasing. At the same time, the DRAM package which carries a DRAM chip thereon also tends to become larger in size. As a result, there has developed a problem that the packaging efficiency of a memory system or the like comprising a DRAM package has not greatly improved.

To cope with the above problem, as shown in FIGS. 65 to 67, there have been proposed several methods for mounting on a single package a plurality of sub chips (in the case where one package is composed of plural semiconductor chips, those plural constituent semiconductor chips will each be referred to herein as a "sub chip"). More particularly, in FIG. 65, a plurality of sub chips 1E to 1I are mounted on the surface of a circuit board 7A. In FIG. 66, first a relatively large sub chip 1J is mounted on a lead frame 3, then two relatively small sub chips 1K and 1L are mounted as adjacently disposed sub chips on the sub chip 1J. Corresponding pads of the sub chips 1J and 1K, 1L are connected together through a solder bump 10. Further, bonding pads of the sub chip 1J are connected to corresponding external terminals, i.e., outer leads 3B, through bonding wires 5. On the other hand, in FIG. 67, first a sub chip 1N is die-bonded onto a circuit board 7B, and pads provided on the sub chip 1N are bonded to corresponding metallized portions 11 of the circuit board 7B through bonding wires 8. Then, the sub chip 1N is coated with a molding resin 9, and after the surface of the coating is flattened, a sub chip 1M is laminated onto the thus-flattened surface of the coating.

The chip mounting methods illustrated in FIGS. 66 and 67 are described in Japanese Patent Laid Open Nos. 284951/86 and 283634/87, respectively.

SUMMARY OF THE INVENTION

However, with progress of higher integration density and larger capacity of semiconductor chips, the present inventors found out that the following problems were involved in the foregoing chip mounting methods. In FIG. 65, since plural sub chips 1E–1I are mounted on the same plane, the area of the circuit board 7A increases with an increase in the number of semiconductor chips mounted thereon, and hence the package size also becomes larger. In FIG. 66, the lower sub chip 1J must be larger than the upper sub chips 1K and 1L by an amount corresponding to the pad portion required for drawing out the bonding wires 5. Therefore, it is impossible to constitute a package using the same size of sub chips formed in the same manufacturing process, like a DRAM chip for example. In FIG. 67, the heat radiation of the lower sub chip 1N is obstructed, and restriction is placed on the reduction of the package size because it is necessary to use the circuit board 7B. In all of these methods, moreover, the manufacturing process is complicated and the product yield is deteriorated in comparison with, for example, the conventional packaging method involving direct wire bonding to a lead frame.

It is the first object of the present invention to provide an effective chip mounting method capable of mounting plural sub chips of the same size without sacrificing the heat radiation characteristic of a package and the product yield.

It is the second object of the present invention to attain a large memory capacity and low power consumption of a DRAM package and simplify the manufacturing process for the same package while suppressing the increase in size of the package.

It is the third object of the present invention to realize a DRAM package having a memory capacity plural times that of a package of about the same size and comprising a single DRAM chip and thereby expand the limit of memory capacity of DRAM chips, etc.

It is the fourth object of the present invention to enhance the packaging efficiency of a memory system or the like having a DRAM package as a basic configuration and reduce the cost thereof.

It is the fifth object of the present invention to provide concrete means for an effective address system and a manufacturing process both suitable for the new chip mounting method and provide several application examples of this chip mounting method.

It is the sixth object of the present invention to provide an effective manufacturing method suitable for the new chip mounting method.

Of numerous improved aspects disclosed herein, a typical one will now be described briefly. A pair of DRAM chips are mounted oppositely to face each other and are provided on both sides of wiring means such as a lead frame which is substantially integrally formed with external terminals, and these DRAM chips and lead frame are connected together by a conventional wire bonding method for example. Plural pairs of such DRAM chips and lead frames thus connected are stacked and corresponding leads of the lead frames are connected in common to provide a laminate. Further, plural DRAM chips thus mounted are activated selectively in accordance with a predetermined chip select signal. Additionally, partial DRAM chips capable of normally functioning partially are combined, utilizing this chip mounting method, to constitute a single DRAM package.

According to the above means it is possible to provide an effective chip mounting method capable of mounting plural sub chips of the same size without sacrificing the heat radiation characteristic of the package and the product yield. Besides, it is possible to attain large memory capacity and low power consumption of the DRAM package and simplify the manufacturing process for the package. Moreover, it is possible to realize a DRAM package having a memory capacity plural times that of a package comprising a single DRAM chip and thereby expand the limit of memory capacity of DRAM chips; at the same time it is possible to enhance the packaging efficiency of a memory system having a DRAM package as a basic configuration and reduce the cost thereof. Further, it is possible to utilize partial DRAM chips without waste and enhance a substantial product yield of DRAM chips, etc.

BRIEF DESCRIPTION OF THE DRAWINGS

FIG. 3 is a standard specification table of 64M DRAM sub chips which constitute the DRAM package of FIG. 1;

FIG. 30 is a structural sectional view of a DRAM package further embodying the invention;

FIG. 31 is a structural sectional view of a DRAM package further embodying the invention;

FIG. 32 is a list of connections, showing bonding options of the DRAM sub chips shown in FIG. 3;

FIG. 53 is a list of connections, showing bonding options of the DRAM partial chips shown in FIGS. 47 and 50;

FIG. 54 is a list of products, showing variations of a 64M DRAM package consisting of two DRAM partial chips;

FIG. 60 is a plan view showing an example of a wafer from which a DRAM chip is formed;

DESCRIPTION OF PREFERRED EMBODIMENTS 1. 128M DRAM Package according to Double Chip Packaging Method
1.1. Outline of DRAM Package FIG. 1 is a block diagram showing an example of a 128M ("M" or "mega" is assumed equal to the twentieth power of 2 herein) DRAM package according to the present invention, and FIG. 2 is a timing chart in the said DRAM package. With reference to these figures, an outline of this DRAM package and an explanation of a chip selecting method will first be given below. The chip mounting method according to the present invention will herein be designated a double chip packaging method. For a specific description of the double chip packaging method and features thereof, see "1.4. Package Form of DRAM Package."

1.1.1. Block Configuration

A DRAM package 1 according to this embodiment includes two DRAM sub chips 1A and 1B. These sub chips each have a memory capacity of 64 mega. Write data and read data are inputted or outputted each in the unit of one bit through a data input terminal Din or a data output terminal Dout. The sub chips A and B adopt a so-called multiplex method, wherein the address space is designated alternatively in accordance with 13-bit X address signals (row address signals) X0 to X12 and Y address signals (column address signals) Y0 to Y12 which are fed time-sharingwise through thirteen address input terminals A0 to A12. Data input pads Din and data output pads Dout of the sub chips A and B are connected in common to a data input terminal Din and a data output terminal Dout, respectively, of the DRAM package, and address input pads A0 to A13 are connected in common to address input terminals A0 to A13, respectively, of the DRAM package.

As start control signals, a row address strobe signal RASB (as to an inversion signal or inversion signal line whose level is rendered low when it is made effective, the mark "B" is attached to the end of the name, and this will apply also in the following) and a column address strobe signal CASB, as well as a write enable signal WEB, are fed to the DRAM sub chips A and B from external terminals RASB and CASB as well as WEB through corresponding bonding pads. An X address signal X13 as a chip selection signal is fed from an address input terminal A13 through a corresponding bonding pad, and an external source voltage VCC is fed from two external terminals VCC1 and VCC2 through corresponding bonding pads VCC1 and VCC2. Further, an earth potential of the circuit is fed from external terminals VSS1 and VSS2 through corresponding bonding pads VSS1 and VSS2. The external source voltage VCC is set at a positive voltage like +5V for example, and as will be described later, it is lowered by a voltage dropping section of each of the sub chips A and B, then serves as a source voltage for the operation of each sub chip.

1.1.2. Chip Selecting Method

Figure 2:
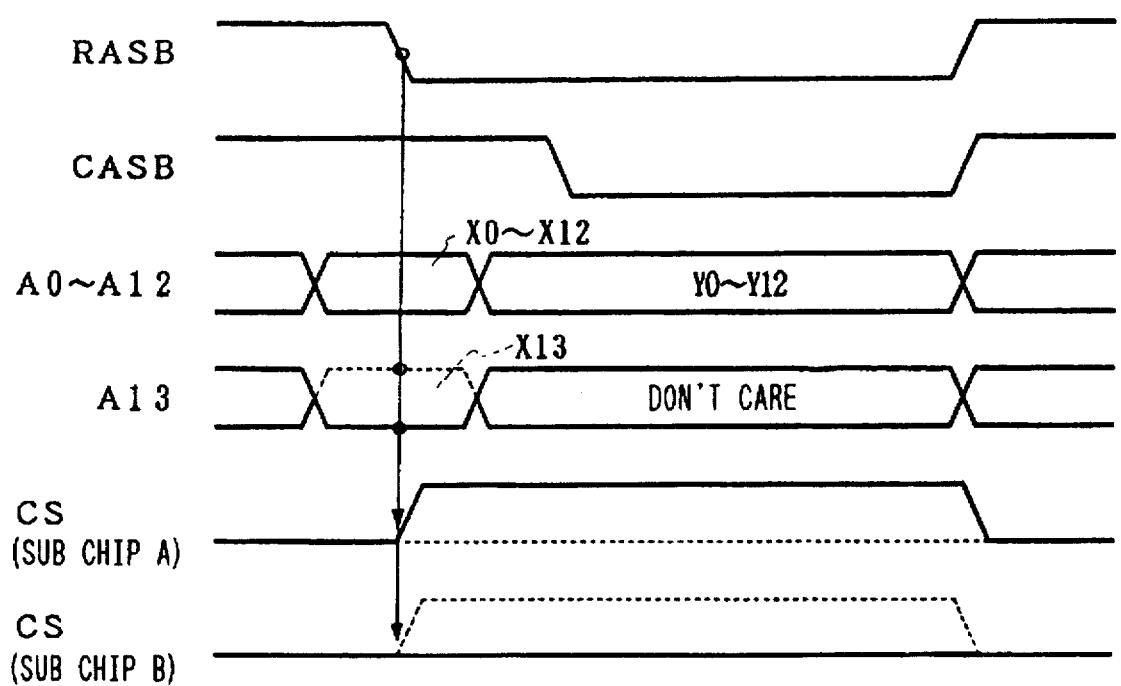
FIG. 2 is a timing chart in the DRAM package of FIG. 1.

When the row address strobe signal RASB and the column address strobe signals CASB are made low in level, the sub chips A and B are selectively brought into a selected state, and the operation mode thereof is set in accordance with a logical level of the write enable signal WEB. To the address input terminals A0–A12 are fed X address signals X0–X12 in synchronism with the trailing edge of the row address strobe signal RASB, while Y address signals Y0–Y12 are fed in synchronism with the trailing edge of the column address strobe signal CASB, as shown in FIG. 2.

In this embodiment, moreover, the selected state of the sub chip A and that of the sub chip B are selectively designated in accordance with a logical level of the chip selection signal, i.e., the X address signal X13. More specifically, when the level of the X address signal X13 is made low, the level of an internal control signal CS in the sub chip A is made high to select the sub chip A in the DRAM package, as indicated by solid line in FIG. 2. On the other hand, when the level of the X address signal X13 is made high, the level of an internal control signal CS in the sub chip B is rendered high to select the sub chip B, as indicated by dotted line in FIG. 2. Thus, the 64M DRAM sub chips A and B are selected in an alternative manner, with the result that the DRAM package possesses a memory capacity twice that of each sub chip, namely, 128 mega×1 bit. Since the sub chips A and B are selected alternatively, the power consumption of the DRAM package is relatively small, corresponding to the power consumption of one of the two sub chips.

1.2. Outline of DRAM Sub Chips

Figure 1:
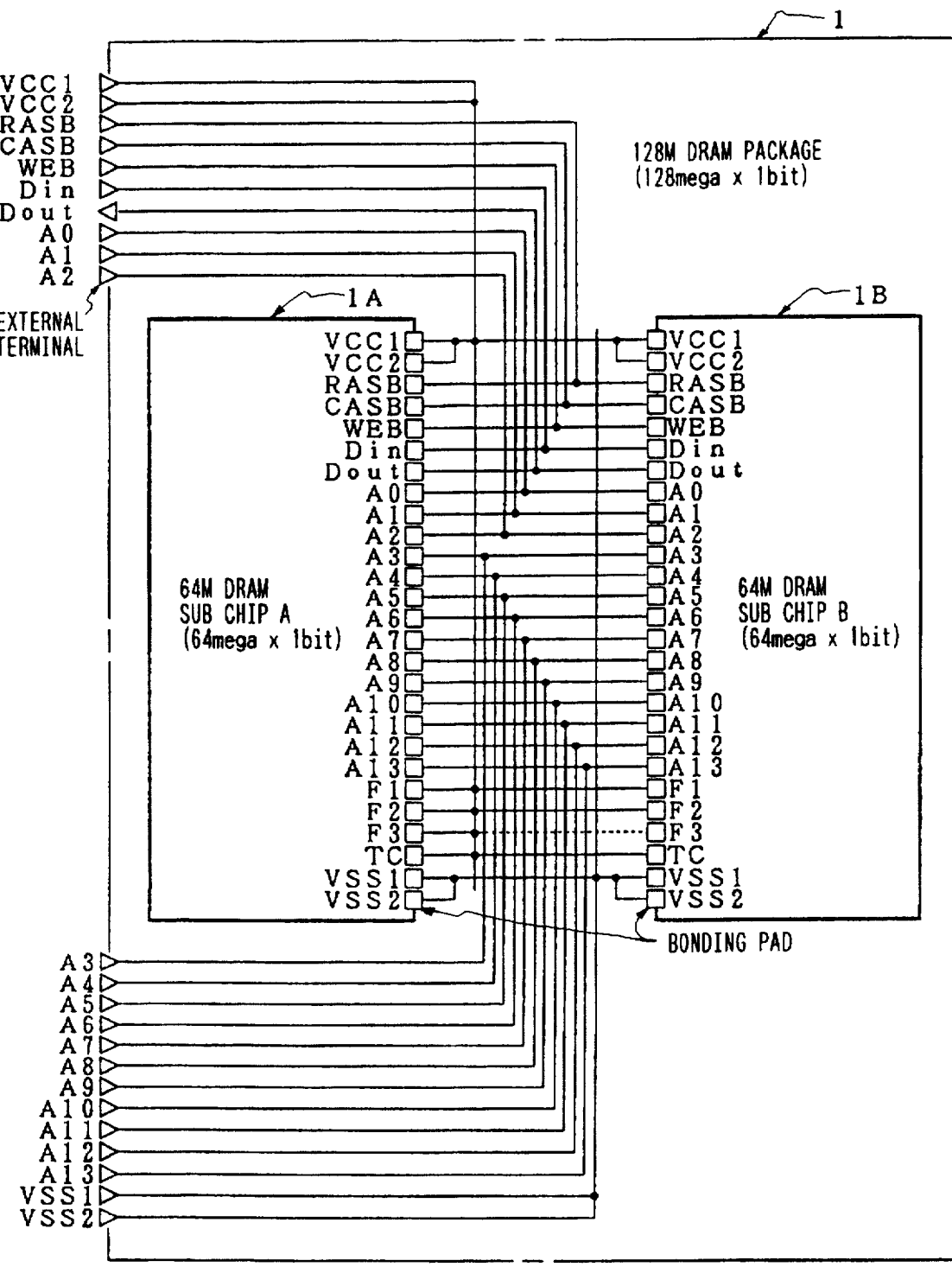
FIG. 1 is a block diagram showing a first example of a 128M DRAM package according to the present invention.
Figure 4:
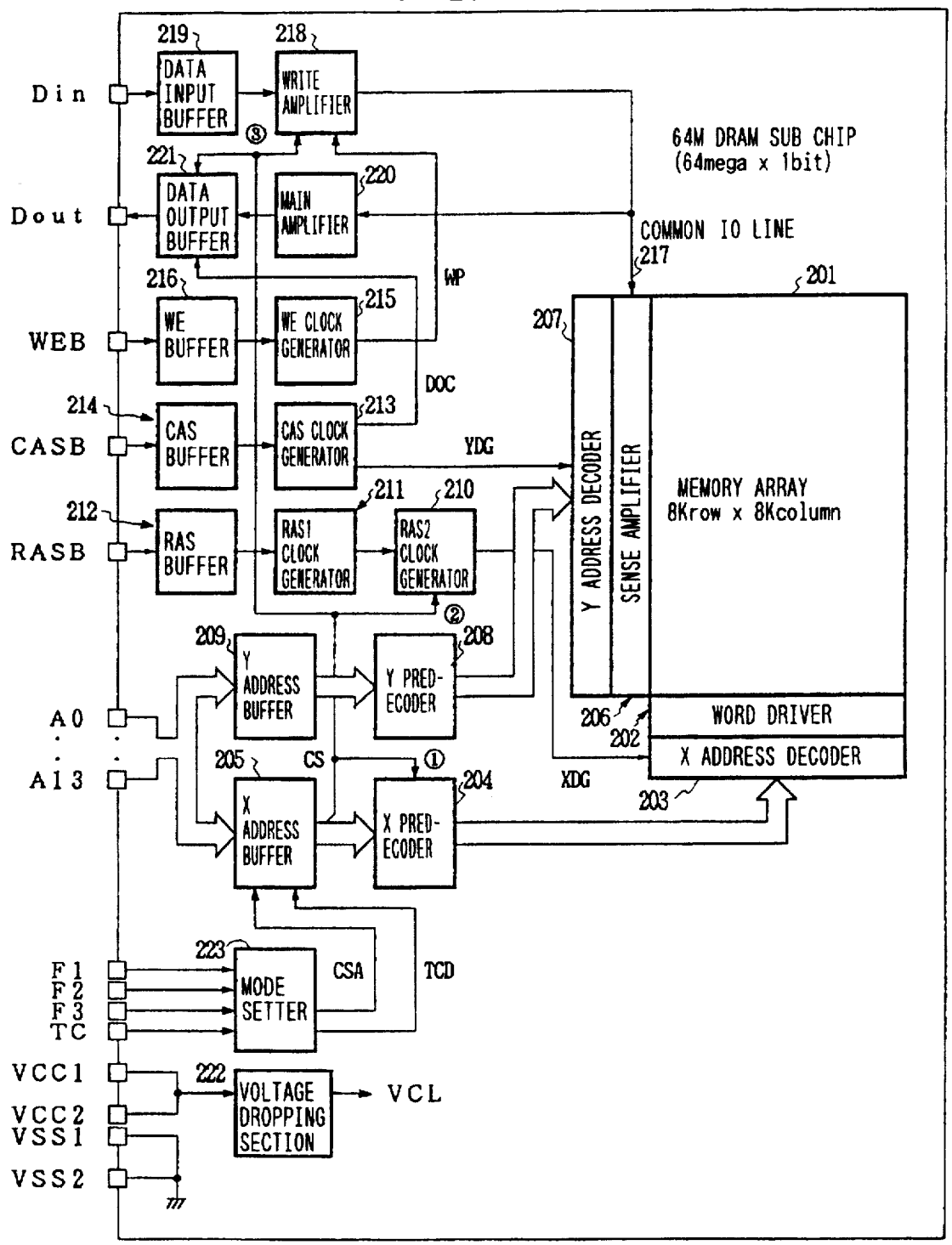
FIG. 4 is a block diagram showing an example of a DRAM sub chip of FIG. 3.
Figure 5:
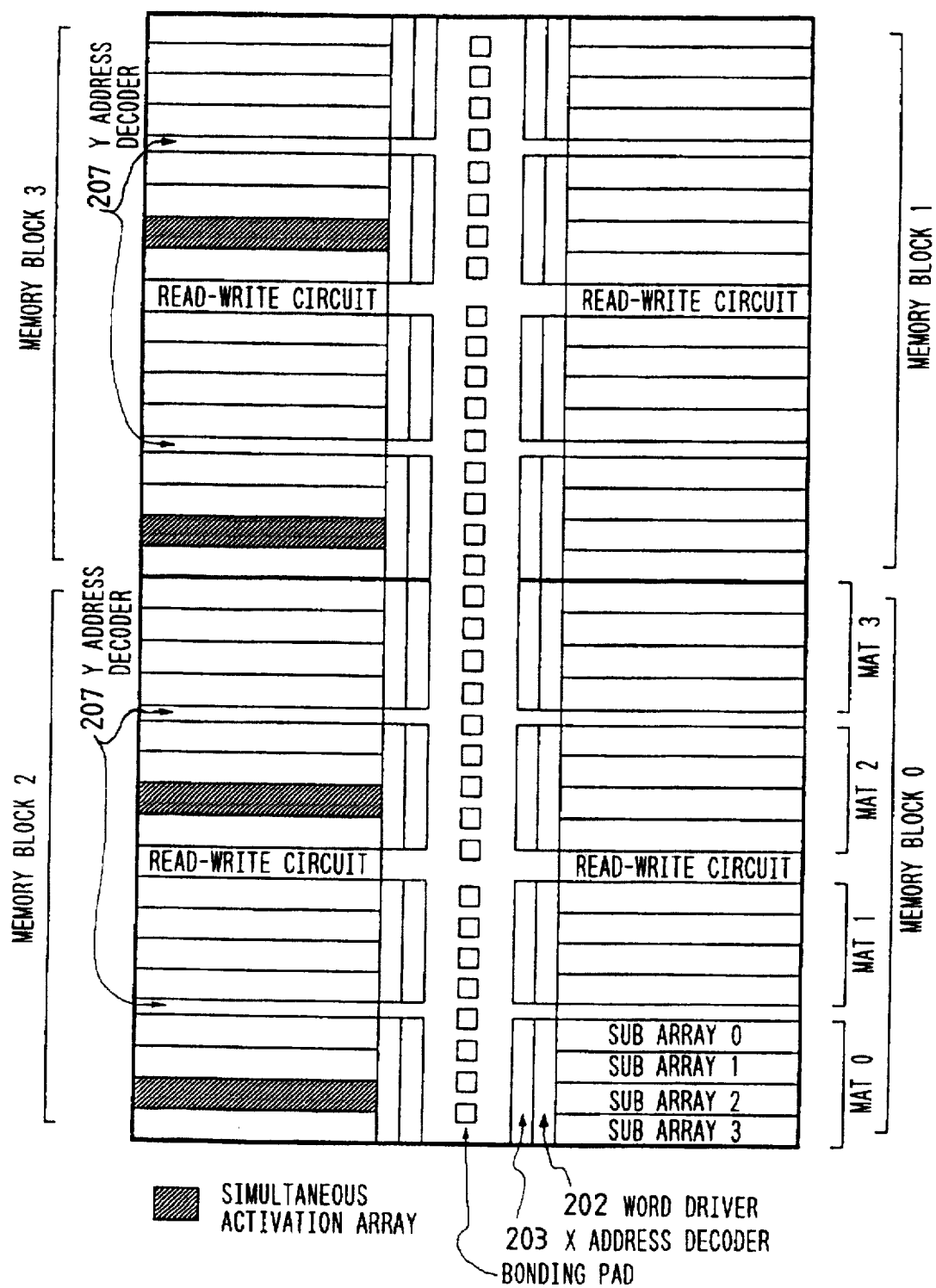
FIG. 5 is a substrate layout diagram in the DRAM sub chip of FIG. 4.
Figure 6:
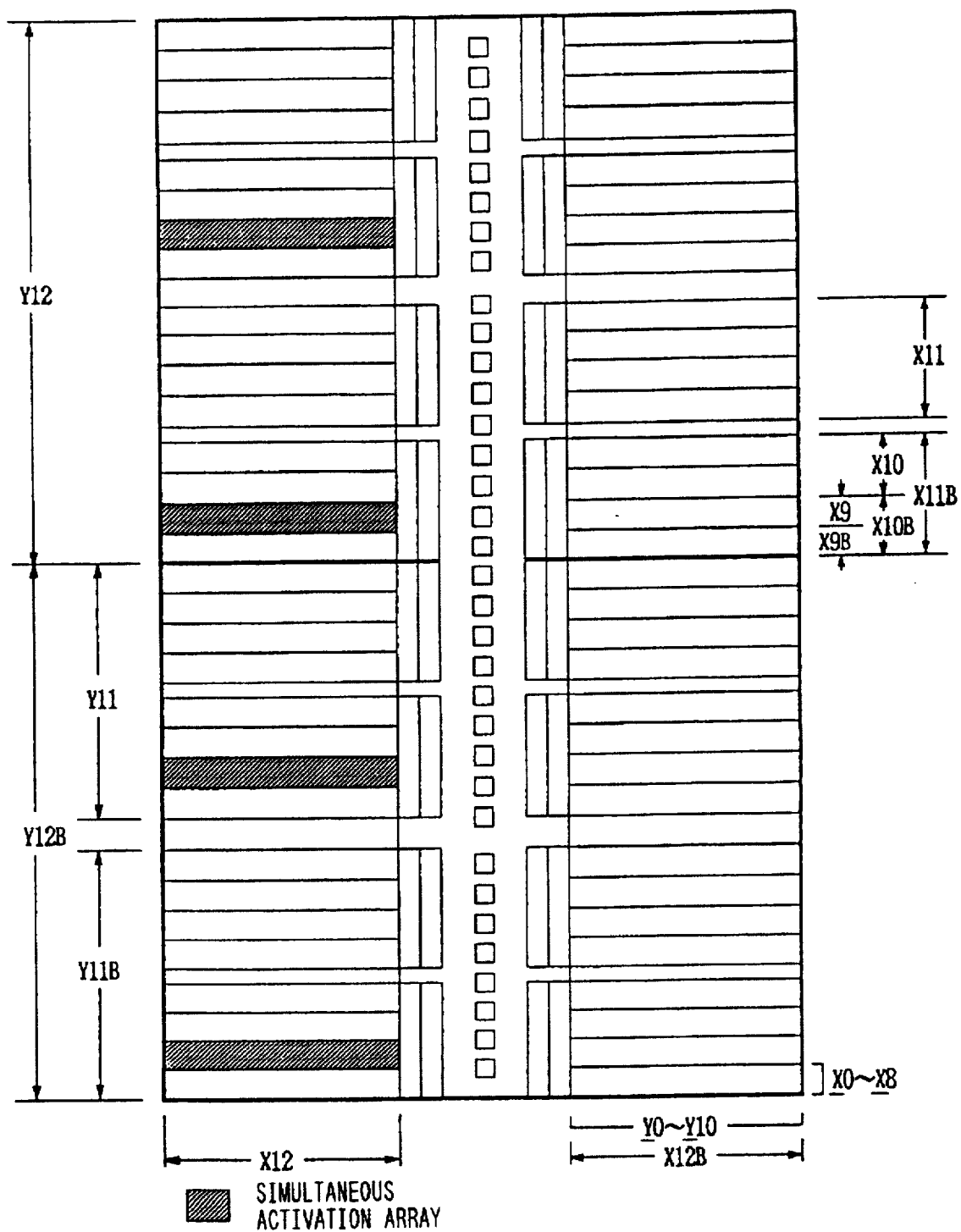
FIG. 6 is an address allocation diagram in the DRAM sub chip of FIG. 4.

FIG. 3 tabulates a standard specification of 64M DRAM sub chips which constitute the DRAM package of FIG. 1; FIG. 4 is a block diagram showing an example thereof; FIG. 5 is a substrate layout view of the 64M DRAM sub chip shown in FIG. 4; and FIG. 6 is an address allocation diagram in the same sub chip. With reference to these figures, the following description is now provided about a concrete configuration and specification of the 64M DRAM sub chips A and B which constitute the DRAM package of this embodiment as well as an address selecting method and an outline of operation. In the description of this chapter there will be made no distinction between the sub chips A and B because both are basically of the same configuration.

1.2.1. Standard Specification

The 64M DRAM sub chips in this embodiment can each take three kinds of bit configurations which are 64 megawords×1 bit (hereinafter referred to simply as, for example, "64 mega×1 bit"), 16 mega×4 bits and 8 mega×8 bits because bonding to predetermined pads is executed selectively, as shown in FIG. 3. When the sub chip has a bit configuration of 64 mega×1 bit, the address space thereof is designated alternatively by the 13-bit X address signals X0–X12 and Y address signals Y0–Y12 in the manner described above. On the other hand, when the sub chip has a bit configuration of 16 mega×4 bits, the address space thereof is designated alternatively by the 13-bit X address signals X0–X12 and 11-bit Y address signal's Y0–Y10. Further, when the sub chip has a bit configuration of 8 mega×8 bits, the address space thereof is designated alternatively in accordance with the 13-bit X address signals X0–X12 and 10-bit Y address signals Y0–Y9. Thus, in the 64M sub chips in this embodiment, a row address space is always designated by 13-bit X address signals, and a refresh cycle thereof is unified to 8 kilo ("kilo" is assumed equal to the tenth power of 2 herein) cycle with a period of 64 ms (millisecond=1/1000 second).

As the package form of the 64M DRAM sub chip there is adopted a so-called SOJ (Small Out-line J-bend) type package, and an external size thereof is set at 300 mil'850 mil (mil=1/1000 inch) though it is not specially limited. A maximum of 32 pins, or external terminals, are provided in the package. For the sub chip there is adopted an address multiplex method as mentioned previously, and a row address thereof is designated by 13-bit X address signals X0–X12 irrespective of bit configuration. Therefore, the number of pins used as address input terminals is fourteen, including the X address signal X13 serving as a chip selection signal, irrespective of the bit configuration of the sub chip. On the other hand, when the sub chip has a bit configuration of 64 mega×1 bit, write data and read data are inputted or outputted in the unit of one bit through the data input terminal Din or the data output terminal Dout, as noted previously. When the sub chip has a bit configuration of 16 mega×4 bits or 8 mega×8 bits, write data and read data are inputted or outputted in the unit of 4 or 8 bits through common data input-output terminals DIO0 to DIO3 or DIO0 to DIO7. At this time, an output enable signal OEB for setting an output timing of read data is fed to the sub chip, and the number of pins provided for the supply of start control signals or clocks is four. Consequently, the total number of pins used in each sub chip is 23 in the bit configuration of 64 mega×1 bit, 26 in the bit configuration of 16 mega×4 bits, 32 in the bit configuration of 8 mega×8 bits.

The 64M DRAM sub chips are each provided with a predetermined test mode and a parallel test function of comparing and collating 8-bit storage data read out simultaneously, with given expected value data in the said test mode. At this time, the results of the parallel test are outputted in common from all the output or input-output terminals. The sub chips are each provided with a high-speed column mode, or Fast Page mode, as well as Static Column mode and Nibble mode, for continuously inputting or outputting storage data with respect to plural memory cells connected to selected word lines. Nibble mode is made effective when the sub chip has a bit configuration of 64 mega×1 bit, and it inputs or outputs a maximum of 32 bits of storage data continuously. Fast Page mode and Static Column mode are made effective in any bit configuration and can input or output a maximum of 8 K bits, i.e., 8192 bits, continuously.

1.2.2. Block Configuration

The 64M DRAM sub chips in this embodiment have each a memory array 201 as a basic configuration wherein the address space comprises 8K, or 8192, row addresses and column addresses, as shown in FIG. 4. This memory array includes 8192 word lines disposed substantially in parallel with the vertical direction in the same figure and corresponding to the row addresses and 8192 sets of complementary bit lines disposed in parallel with the horizontal direction and corresponding to the column addresses. At the intersecting points of these word lines and complementary bit lines there are disposed 8192×8192, or 67108864, i.e., 64M, dynamic memory cells in a lattice shape. Thus, the sub chip has a memory capacity of 64 megabits. As will be described later, a memory array in each DRAM sub chip of this embodiment is actually divided into four memory blocks, which are each further divided into four mats each consisting of four sub arrays. The following description on the block configuration will be made on the assumption that the memory array is a single memory array.

The word lines which constitute the memory array 201 are connected to an X address decoder 203 through a word driver 202. Predetermined predecoded signals are fed to the X address decoder from an X predecoder 204, and also fed thereto is an internal control signal XDG from a RAS2 clock generator 210. To the X predecoder are fed internal address signals BX0–BX12 from an X address buffer 205, and also fed thereto is an internal control signal CS which is formed on the basis of the X address signal X13. Further, X address signals X0–X13 are fed to the X address buffer time-sharingwise through address input pads A0–A13, and also fed thereto are internal control signals TCD and CSA from a mode setter 223.

The X address buffer 205 takes therein the X address signals X0–X13 which are fed time-sharingwise through the address input pads A0–A13, and on the basis of these X address signals the X address buffer forms the internal address signals BX0–BX12 and the internal control signal CS. The internal control signal CS is fed to the X predecoder 204, RAS2 clock generator 210, write amplifier 218 and data output buffer 221 and is used as a so-called chip selection signal for operating these blocks selectively. In this embodiment, as will be described later, a logical condition for making the level of the internal control signal CS high is changed over selectively by selective execution of bonding to the internal control signals CSA and TCD, i.e., pads F1 to F3 and TC. As to these bonding options, see "1.5. Bonding Options of DRAM Sub Chips."

The X predecoder 204 decodes the internal address signals BX0–BX12 fed from the X address buffer 205, in combination of two or three bits at a time to form predetermined predecoded signals. These predecoded signals are fed to the X address decoder 203 and some of them are used for activating the memory blocks, mats and sub arrays selectively. The predecoder 204 is operated selectively in accordance with the internal control signal CS fed from the X address buffer, whereby the waste operating current is cut down when the sub chip is brought into an unselected state and thus the reduction in power consumption of the DRAM package is attained.

The X address decoder 203 combines the predecoded signals fed from the X predecoder 204 to form selection signals for selecting corresponding word lines of the memory array in an alternative manner. These selection signals are transferred to corresponding word lines of the memory array through the word driver 202, whereby the corresponding word lines are brought into a predetermined selection level. As well known, when the the word lines are brought into the selection level, the 8192 memory cells connected to the word lines are brought into the selected state all together, and the data held therein are outputted to the corresponding complementary bit lines. If these data are left as they are, they will be destroyed, but their signal amplitudes are amplified to a predetermined level by corresponding unit amplifier circuits of the sense amplifier 206, whereby the data are rewritten into the corresponding memory cells. In the DRAM sub chips, when the 8192 unit amplifier circuits of the sense amplifier 206 are operated all together, a relatively large operating current is required. Therefore, whether each sub chip is activated or not is judged by whether the sense amplifier is brought into an operating state or not, in other words, whether the word line selecting operation is performed or not. Needless to say, it is important in reducing the power consumption that the sub chip which is brought into an unselected state not be activated. However, at some particular input timing of a chip selection signal there arises the case where the two sub chips which constitute the DRAM package must be activated at a time. In this case, only the storage data inputting or outputting operation is executed selectively by the write amplifier 218 or the data output buffer 221 in accordance with the internal control signal CS.

Next, the complementary bit lines of the memory array are connected to the corresponding unit amplifier circuits of the sense amplifier 206 and further connected to a common IO line 217 through corresponding MOSFET switches. The sense amplifier 206 includes 8192 unit amplifier circuits provided in corresponding relation to the complementary bit lines of the memory array and the same number of switch MOSFET pairs. The unit amplifier circuits of the sense amplifier are operated selectively and all together by a predetermined internal control signal (not shown) fed from the RAS2 clock generator 210. In this operating state, the unit amplifier circuits amplify fine read signals which are outputted through the corresponding complementary bit lines of the memory array 201 from the 8192 memory cells connected to the selected word lines, to provide binary read signals of high or low level. On the other hand, to the switch MOSFET pairs of the sense amplifier are fed bit selection signals from the Y address decoder 207. These MOSFET switches are turned ON selectively when the corresponding bit line selection signals are rendered high in level, to selectively connect the corresponding complementary bit lines of the memory array with the common IO line 217.

To the Y address decoder 207 are fed predecoded signals from a Y predecoder 208 and also fed is an internal control signal YDG from a CAS clock generator 213. To the Y predecoder 208 are fed internal address signals BY0–BY12 from a Y address buffer 209, while to the Y address buffers 209 are fed Y address signals Y0–Y12 time-sharingwise through the address input pads A0–A12.

The Y address buffer 209 takes therein the Y address signals Y0–Y12 which are fed time-sharingwise through the address input pads A0–A12, then on the basis of these Y address signals it forms internal address signals BY0–BY12 and supplies them to the Y predecoder 208. The Y predecoder 208 decodes the internal address signals BY0–BY12 by combining them in the unit of two or three bits at a time to form predetermined predecoded signals and supplies these predecoded signals to the Y address decoder 207, which in turn combines these predecoded signals to make the level of the corresponding bit line selection signals high in an alternative manner.

The common IO line 217 for connecting designated complementary bit lines of the memory array 201 selectively is connected to an output terminal of the write amplifier 218 and also connected to an input terminal of a main amplifier 220. An input terminal of the write amplifier 218 is connected to an output terminal of a data input buffer 219, while an input terminal of this data input buffer is connected to the data input pad Din. To the write amplifier 218 is fed the internal control signal CS and also fed is an internal control signal WP from a WP clock generator 215. On the other hand, an output terminal of the main amplifier 220 is connected to an input terminal of the data output buffer 221, and an output terminal of the data output buffer 221 is connected to the data output pad Dout. To the data output buffer 221 is fed an internal control signal DOC from the CAS clock generator 213.

When the DRAM sub chips are each brought into a selected state in the write mode, the data input buffer 219 transfers write data fed through the data input pad Din, to the write amplifier 218. The write amplifier 218 is operated selectively when the DRAM sub chip is brought into a selected state in the write mode and the internal controls signals CS and WP are made high in level. In this operating state, the write amplifier forms a predetermined complementary write signal on the basis of the write data transferred from the data input buffer 219 and writes it into one selected memory cell in the memory array 201 through the common IO line 217. On the other hand, when the DRAM sub chip is brought into a selected state in the read mode, the main amplifier 220 further amplifies a read signal which is outputted through the common IO line 217 from one selected memory cell in the memory array 201, and transfers it as read data to the data output buffer 221. The data output buffer 221 is operated selectively when the DRAM sub chip is brought into a selected state in the read mode and the level of the internal control signal DOC is made high. In this operating state, the data output buffer 221 transmits the read data provided from the main amplifier 220 to the exterior of the sub chip through the data output pad Dout. Thus, in the DRAM sub chip of this embodiment, the write amplifier 218 and the data output buffer 221 are operated selectively in accordance with the internal control signal CS serving as a chip selection signal, whereby the storage data inputting or outputting operation is executed selectively.

The DRAM sub chip is further provided with, as components of the control circuit, RAS buffer 212, RAS1 clock generator 211, RAS2 clock generator 210, CAS buffer 214, CAS clock generator 213, WE buffer 216 and WE clock generator 215, as well as mode setter 223 and voltage dropping section 222. To the RAS buffer 212 is fed a row address strobe signal RASB through the input pad RASB, and an output signal from the RAS buffer 212 is fed to the RAS1 clock generator 211. An output signal from the RAS1 clock generator is fed to the RAS2 clock generator 210 and also fed to predetermined portions of the sub chip. Further fed to the RAS2 clock generator 210 is the internal control signal CS, and an output signal from the RAS2 clock generator 210 is fed as an internal control signal XDG to the X address decoder 203 and also fed to predetermined portions of the sub chip. On the basis of the row address strobe signal RASB inputted through the RAS buffer 212 the RAS1 clock generator 211 and the RAS2 clock generator 210 form various internal control signals necessary for the word line selecting operation and the control of the sense amplifiers 206. As mentioned previously, the operation of the RAS2 clock generator 210 is controlled by the internal control signal CS. As a result, the operations of the X address decoder 203, word driver 202 and sense amplifier 206 are executed selectively, whereby the sub chip is activated selectively.

On the other hand, to the CAS clock generator 213 is fed a column address strobe signal CASB through the input pad CASB, and an output signal from the CAS clock generator 213 is fed to the Y address decoder 207 and the data output buffer 221 as internal control signals YDG and DOC, respectively, and also fed to predetermined portions of the sub chip. On the basis of the column address strobe signal CASB inputted through the CAS buffer 214 the CAS clock generator 213 forms various internal control signals necessary for the complementary bit line selecting operation and for the control of the main amplifier 220 and data output buffer 221. Likewise, to the WE buffer 216 is fed a write enable signal WEB through the input pad WEB, and an output signal from the WE buffer 216 is fed to the WE clock generator 215. Further, an output signal from the WE clock generator 215 is fed as an internal control signal WP to the write amplifier 218 and also fed to predetermined portions of the sub chip. On the basis of the write enable signal WEB inputted through the WE buffer 216 the WE clock generator 215 forms an internal control signal WE, etc. necessary for the control of the write amplifier 218.

To the mode setter 223 are fed a predetermined mode control signals through the pads F1–F3 and TC, and output signals from the mode setter 223 are fed as internal control signals CSA and TCD to the X address buffer 205. On the basis of the mode control signals fed through the pads F1–F3 and TC the mode setter 223 forms various internal control signals for setting the bit configuration of the sub chip and chip selecting conditions. On the other hand, the voltage dropping section 222 forms a predetermined internal source voltage VCL on the basis of external source voltages VCC fed through the source voltage input pads VCC1 and VCC2, and supplies it as an operating power to various portions of the sub chip. The internal source voltage VCL is set at a positive voltage of a relatively small absolute value such as +3.3 V for example.

1.2.3. Basic Layout

In each of the 64M DRAM sub chips according to this embodiment, the memory array 201 is divided into four memory blocks 0–3, which are further divided into four mats 0–3 each consisting of four sub arrays 0–3. The sub arrays 0–3 constituting each memory block and mat are disposed to extend the word lines in the direction of X axis of the semiconductor substrate surface, i.e., in the shorter side direction, as shown in FIG. 5, and a sense amplifier (not shown) is disposed between two adjacent sub arrays 0 and 1 and also between sub arrays 2 and 3. In corresponding relation to each of these sense amplifiers there are provided two sets of common IO lines 217. Inside the sub arrays 0–3 there are disposed corresponding word driver 202 and X address decoder 203. The mats 0–3 which constitute each memory block form pairs each consisting of two mats, and a Y address decoder 207 is disposed between the mats of each pair. These Y address decoders are used in common by two mats on both sides, namely, eight sub arrays. In an intermediate portion of each memory block there is disposed a read-write circuit including a write amplifier 218 and a main amplifier 220. Centrally in the direction of Y axis, I.e., in the longer side direction, of the semiconductor substrate surface there are disposed a plurality of bonding pads, i.e. external terminals of the DRAM sub chip, in a straight line form. As will be described rarer, the paired sub chips A and B which constitute the DRAM package are mounted in opposed relation to each other. By this central, linear arrangement of the bonding pads, not only a planar symmetry of the bonding pads can be ensured but also the chip mounting method based on the conventional LOC (Lead On Chip) method can be applied. The basic layout of FIG. 5 does not restrict the layout size of each portion or an absolute number of bonding pads.

In this embodiment, though not specially limited, the sub arrays 0–3 substantially include 512 word lines and 2048 sets of complementary bit lines, each having a memory capacity of 1 megabits. That is, each mat has a memory capacity of 1M×4 bits, i.e., 4 megabits, and each memory block has a memory capacity of 4M×4, i.e., 16 megabits. Thus, the DRAM sub chips each have a memory capacity of 16M×4, i.e., 64 megabits. In this embodiment, as indicated by hatched lines in FIG. 5, when the DRAM sub chip is brought into a selected state, four sub arrays are activated simultaneously and two sets, a total of eight sets, of complementary bit lines adjacent to the four sub arrays are connected selectively to two sets, a total of eight sets, of common IO lines. That is, each read-write circuit includes two, a total of eight, write amplifiers 218 and main amplifiers 220 which are provided in correspondence to those common IO lines. These write amplifiers and main amplifiers are operated in predetermined combinations, whereby the bit configuration of the DRAM sub chip is changed over selectively.

1.2.4. Address Assignment

To the DRAM sub chip are fed 13-bit X address signals X0–X12 and Y address signals Y0–Y12, as mentioned above, and the address space of the sub chip is designated selectively. In this embodiment, though not specially limited, the 512 word lines which constitute the sub arrays 0–3 are designated in an alternative manner in accordance with 9-bit X address signals X0–X8, while the 2048 sets of complementary bit lines are designated in an alternative manner in accordance with 11-bit Y address signals Y0–Y10, as shown in FIG. 6. The four sub arrays 0–3 which constitute each mat are designated in an alternative manner in accordance with 2-bit X address signals X9 and X10, while the four mats 0–3 which constitute each memory block are designated in an alternative manner in accordance with 1-bit X address signal X11 and Y address signal Y11. Further, the four memory blocks 0–3 are designated in an alternative manner in accordance with 1-bit X address signal X12 and Y address signal Y12.

As to the 2048 sets of complementary bit lines which constitute each sub array, as mentioned above, two adjacent sets are brought into a selected state simultaneously, but are substantially designated in an alternative manner in accordance with Y address signals Y0–Y8 because the two corresponding main amplifiers are selected in accordance with Y address signal Y0. Actually, the selection of memory blocks 0–3 by the most significant bit X and Y address signals X12, Y12 is also realized by the selection of corresponding main amplifiers.

1.2. Variations of DRAM Package

Figures 7, 8:
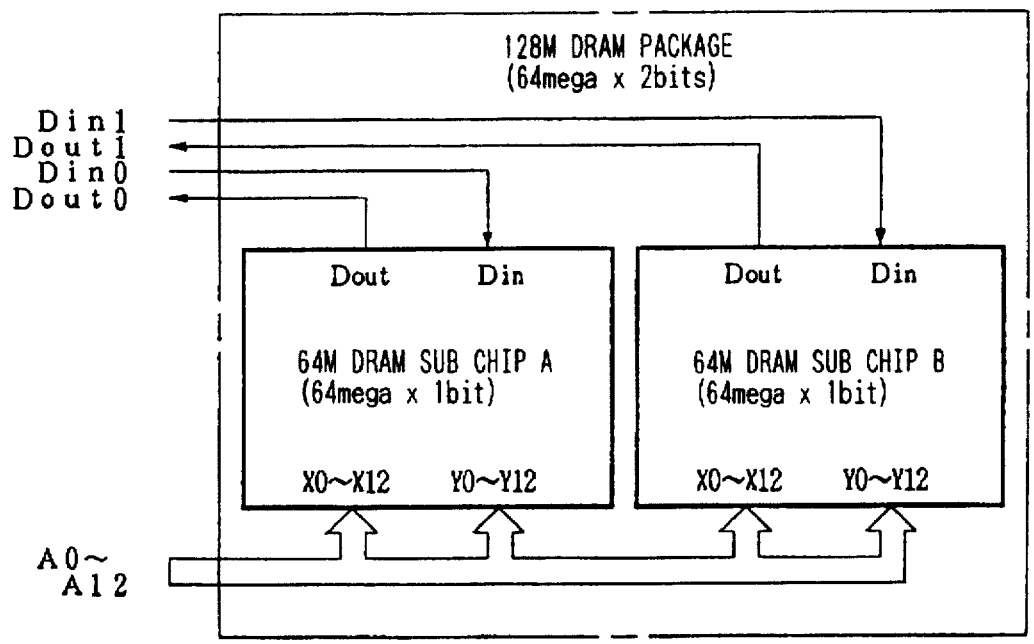
FIG. 7 is a product list showing variations of the 128M DRAM package.
FIG. 8 is a block diagram showing a second example of a 128M DRAM package according to the present invention.

In FIG. 7 there is illustrated a list of 128M DRAM package products comprising the 64M DRAM sub chips shown in FIGS. 3 to 6. FIGS. 8 to 12 are block diagrams of the DRAM packages shown in the product list of FIG. 7. With reference to these figures, the following description is now provided about the kind, configuration and outline of 128M DRAM packages each capable of being constituted by two 64M DRAM sub chips. In the block diagrams of FIGS. 8 to 12 there are shown only address signals and signal lines relating to input and output data.

1.3.1. Kind of 128M DRAM Packages Capable of Being Constituted

The 64M DRAM sub chips in this embodiment can each take three kinds of bit configurations of 64M×1 bit, 16M×4 bits and 8M×8 bits because prescribed bondings are executed selectively, as noted previously. By combining the two DRAM sub chips of the same bit configuration and accessing them simultaneously or selectively it is possible to configure a total of six kinds of 128M DRAM packages which are shown in FIG. 7. The 128M×1 bit DRAM package constituted by combining two 64M×1 bit DRAM sub chips and accessing these sub chips selectively in accordance with a chip selection signal, i.e., X address signal X13, corresponds to the embodiment shown in FIG. 1, will not be explained here.

1.3.2. Outline of Various DRAM Packages (1) 64M×2 bit DRAM package wherein two 64M×1 bit DRAM sub chips are accessed simultaneously:

Such a 128M DRAM package of 64M×2 bits as shown in FIG. 8 can be constituted by combining two 64M DRAM sub chips A and B each having a bit configuration of 64M×1 bit and then accessing these sub chips simultaneously. In this variation, 13-bit X address signals X0–X12 and Y address signals Y0–Y12 are fed to address input pads A0–A12 of the sub chips A and B in common and time-sharingwise, and data input and output pads Din, Dout are connected to corresponding data input terminals Din1, Din2 and data output terminals Dout1, Dout2 of the DRAM package. As a result, the sub chips A and B are brought into a selected state simultaneously and execute storage data inputting and outputting operations in the unit of 1 bit and in parallel. Thus, the DRAM package has a bit configuration of 64M×2 bits, wherein 2-bit storage data are inputted or outputted simultaneously. At this time, refresh operations for the sub chips are also executed in parallel, the refresh cycle of DRAM package becomes 8 K cycle/64 ms. It goes without saying that the power consumption of the DRAM package as a whole is about twice that of the 64M DRAM sub chips.

Figure 9:
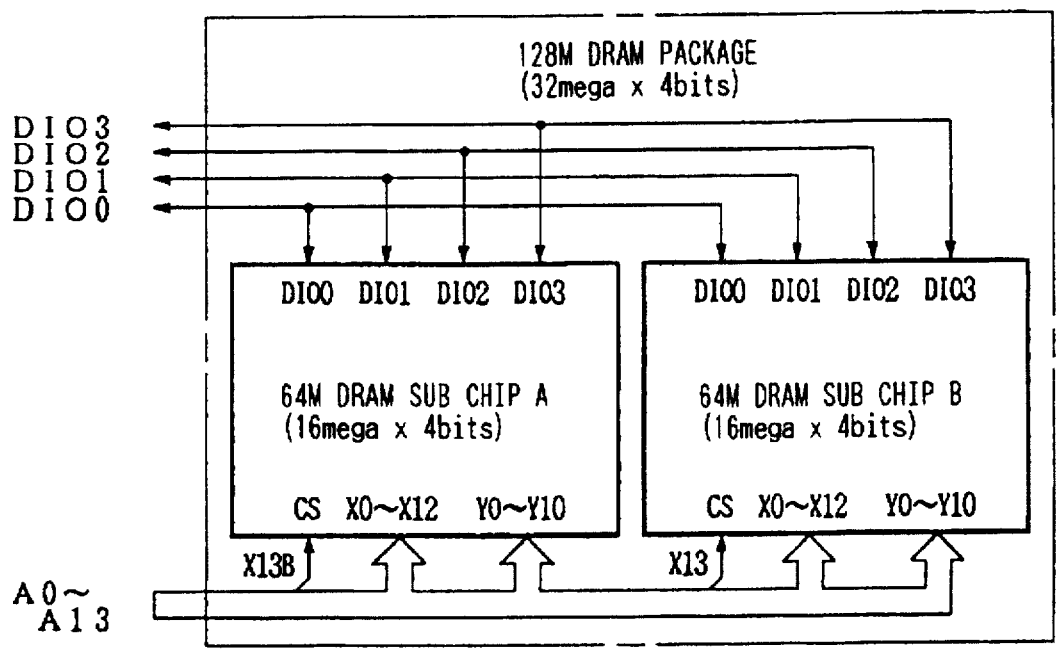
FIG. 9 is a block diagram showing a third example of a 128M DRAM package according to the present invention.

(2) 32M×4 bit DRAM package wherein two 16M×4 bit DRAM sub chips are accessed selectively:

By combining two 64M DRAM sub chips A and B each having a bit configuration of 16M×4 bits and then accessing these sub chips selectively there can be constituted such a 128M DRAM package of 32M×4 bits as shown in FIG. 9. In this variation, 13-bit X address signals X0–X12 and 11-bit Y address signals Y0–Y10 are fed to address input pads A0–A12 of the sub chips A and B in common and time-sharingwise, and further fed is an X address signal X13 which serves as a chip selection signal through an address input pad A13. Data input-output pads DIO0 to DIO3 of each sub chip are connected in common to corresponding data input-output terminals DIO0–DIO3 of the DRAM package. As a result, the such chip A is brought into a selected state selectively when the level of the X address signal X13 is made low, and it executes alone a storage data inputting or outputting operation. On the other hand, the sub chip B is brought into a selected state selectively when the level of the X address signal X13 is made high, and it executes alone a storage data inputting or outputting operation. Now, the DRAM package has a bit configuration of 32M×4 bits and inputs or outputs 4-bit storage data simultaneously. At this time, refresh operations for the sub chips A and B are executed selectively, so the refresh cycle of the DRAM package becomes 16 K cycle/64 ms. The power consumption of the DRAM package as a whole is almost equal to that of one sub chip because the 64M DRAM sub chips A and B are activated selectively, whereby the reduction of power consumption can be attained.

Figure 10:
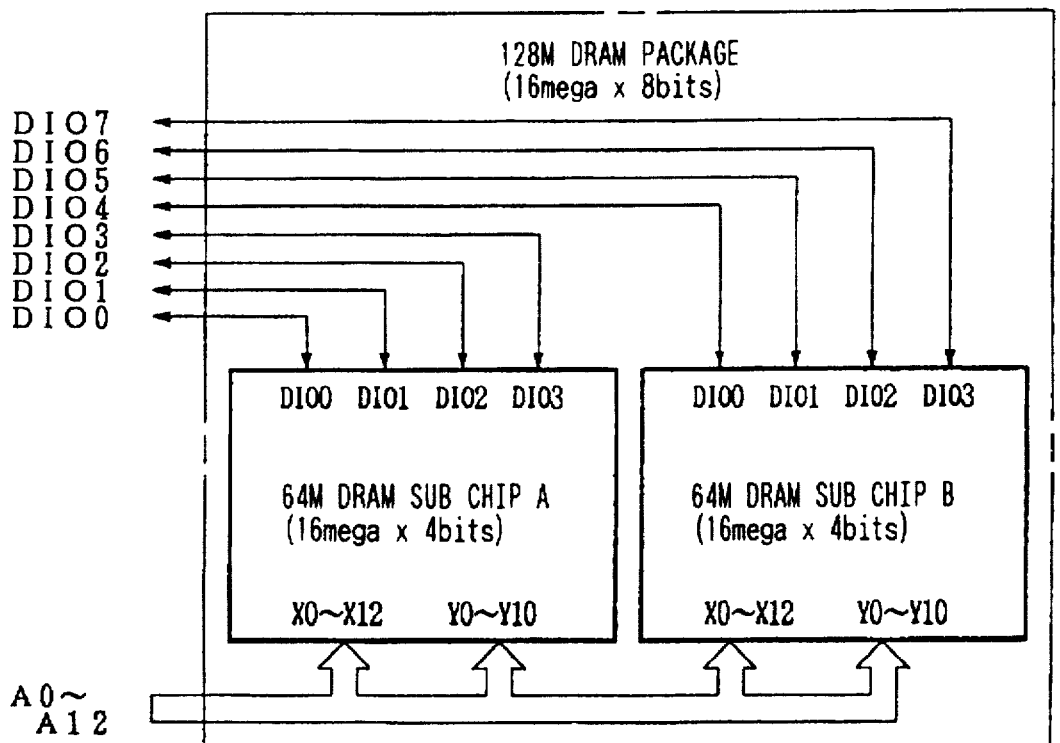
FIG. 10 is a block diagram showing a fourth example of a 128M DRAM package according to the present invention.

(3) 16M×8 bit DRAM package wherein two 16M×4 bit DRAM sub chips are accessed simultaneously:

By combining two 64M DRAM sub chips A and B each having a bit configuration of 16M×4 bits and then accessing these sub chips simultaneously there can be constituted such a 128M DRAM package of 16M×8 bits as shown in FIG. 10. In this variation, 13-bit X address signals X0–X12 and 11-bit Y address signals Y0–Y10 are fed to address input pads A0–A12 in common and time-sharingwise. Data input-output pads DIO0–DIO3 of each sub chip are connected to corresponding input-output terminals DIO0–DIO7 of the DRAM package. As a result, the sub chips A and B are brought into a selected state simultaneously and execute a 4-bit storage data inputting or outputting operation in a parallel manner. Now, the DRAM package has a bit configuration of 16M×8 bits and it inputs or outputs 8-bit storage data simultaneously. At this time, refresh operations for the sub chips A and B are also executed in parallel, so the refresh cycle as to the DRAM package becomes 8 K cycle/64 ms. The power consumption as to the entire DRAM package is about twice that of the sub chips.

Figure 11:
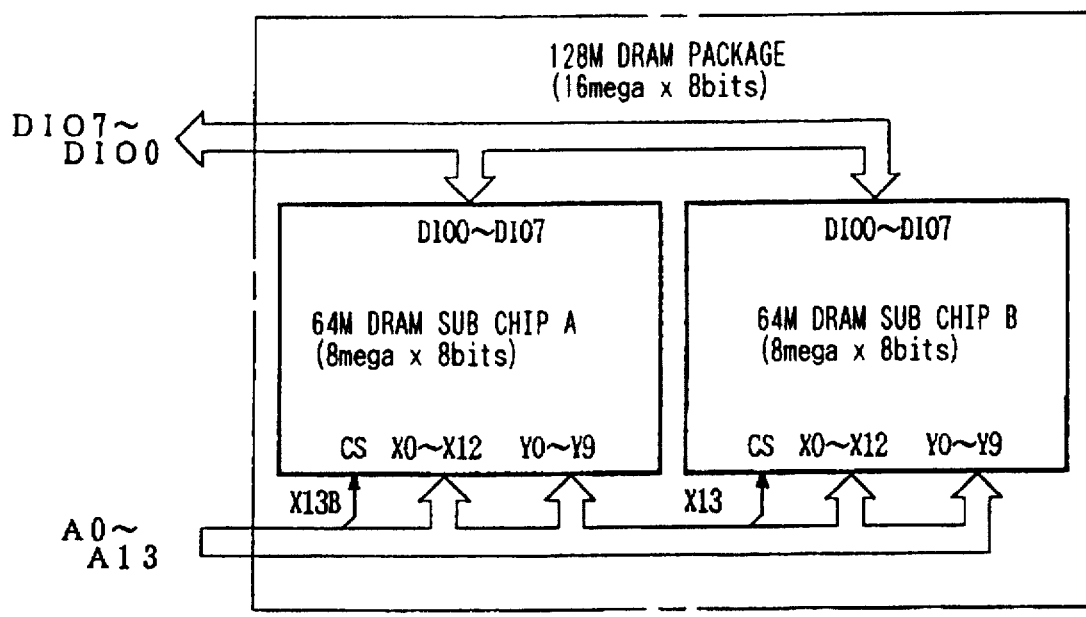
FIG. 11 is a block diagram showing a fifth example of a 128M DRAM package according to the present invention.

(4) 16M×8 bit DRAM package wherein two 8M×8 bit DRAM sub chips are accessed selectively:

By combining two 64M DRAM sub chips A and B each having a bit configuration of 8M×8 bits and then accessing these sub chips selectively there can be constituted such a 128M DRAM package of 16M×8 bits as shown in FIG. 11. In this variation, 13-bit X address signals X0–X12 and 10-bit Y address signals Y0–Y9 are fed to address input pads A0–A12 of the sub chips A and B in common and time-sharingwise. Further, an X address signal X13 which serves as a chip selection signal is fed through an address input pad A13. Data input-output pads DIO0–DIO7 of each sub chip are connected in common to corresponding data input-output terminals DIO0–DIO7 of the DRAM package. As a result, the sub chip A is brought into a selected state selectively when the level of the X address signal X13 is made low, and it executes alone an 8-bit storage data inputting or outputting operation, while the sub chip B is brought into a selected state selectively when the level of the X address signal is rendered high, and it executes along an 8-bit storage data inputting or outputting operation. Now, the DRAM package has a bit configuration of 16M×8 bits and inputs or outputs 8-bit storage data simultaneously. At this time, the refresh cycle of the DRAM package is 16K cycle/64 ms and the power consumption as to the entire package is almost equal to that of one sub chip. Thus, the reduction of power consumption can be attained.

Figure 12:
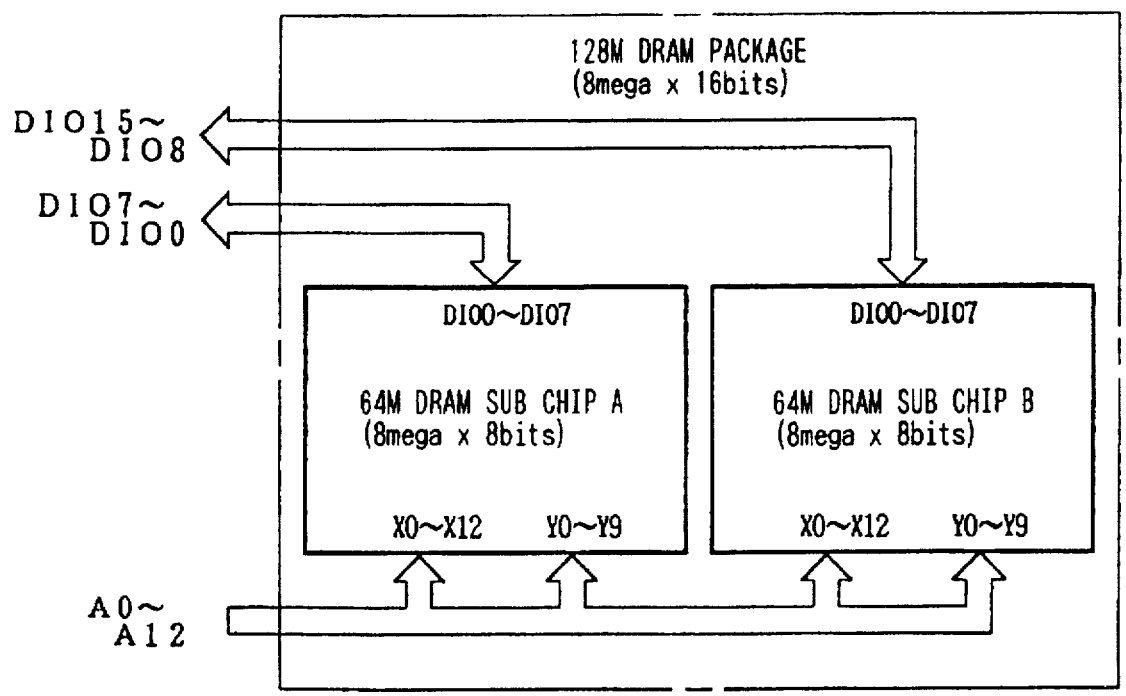
FIG. 12 is a block diagram showing a sixth example of a 128M DRAM package according to the present invention.

(5) 8M×16 bit DRAM package wherein two 8M×8 bit DRAM sub chips are accessed simultaneously:

By combining two 64M DRAM sub chips A and B each having a bit configuration of 8M×8 bits and then accessing these sub chips simultaneously there can be constituted such a 128M DRAM package of 8M×16 bits as shown in FIG. 12. In this variation, 13-bit X address signals X0–X12 and 10-bit Y address signals Y0–Y9 are fed to address input pads A0–A12 of the sub chips A and B in common and time-sharingwise. Input-output pads DIO0–DIO7 of the sub chips are connected to corresponding data input-output terminals DIO0–DIO7 and DIO0–DIO15 of the DRAM package. As a result, the sub chips A and B are brought into a selected state simultaneously and executes an 8-bit storage data inputting or outputting operation in a parallel manner. Now, the DRAM package has a bit configuration of 8M×16 bits and inputs or outputs 16-bit storage data simultaneously. At this time, the refresh cycle of the DRAM package is 8K cycle/64 ms and the power consumption of the package as a whole is about twice that of the sub chips.

1.4. Package Form of DRAM Package and Manufacturing Method for Same

Figure 13:
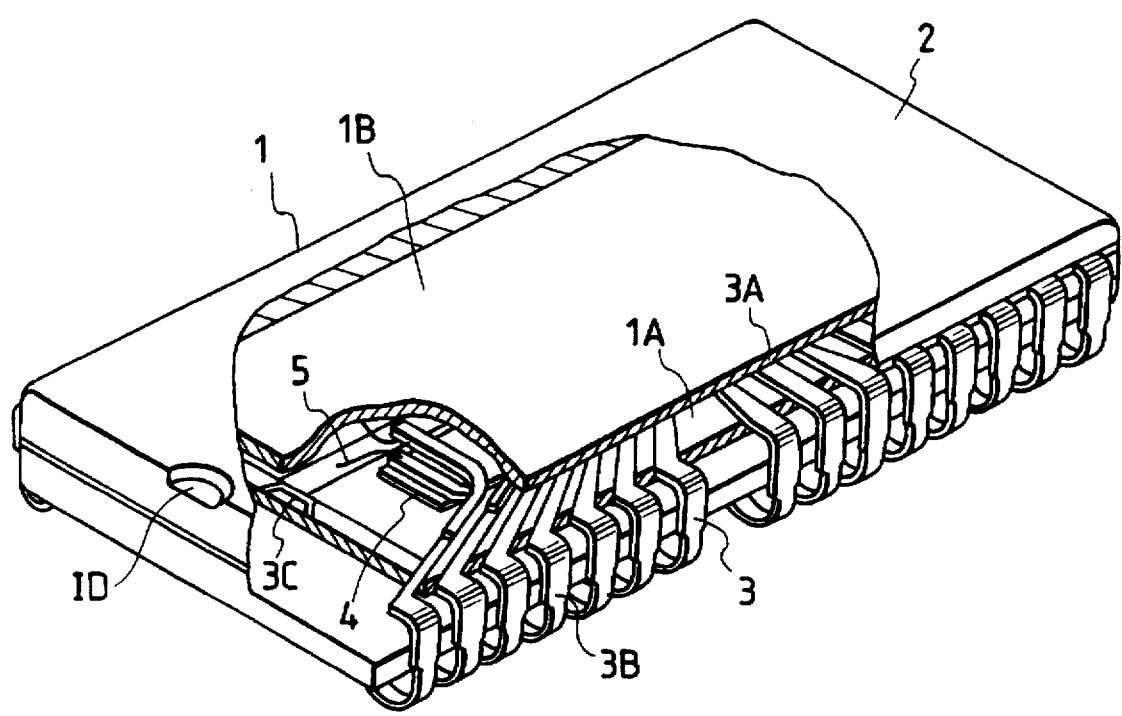
FIG. 13 is a sectional perspective view of the DRAM package of FIG. 1.
Figure 14:
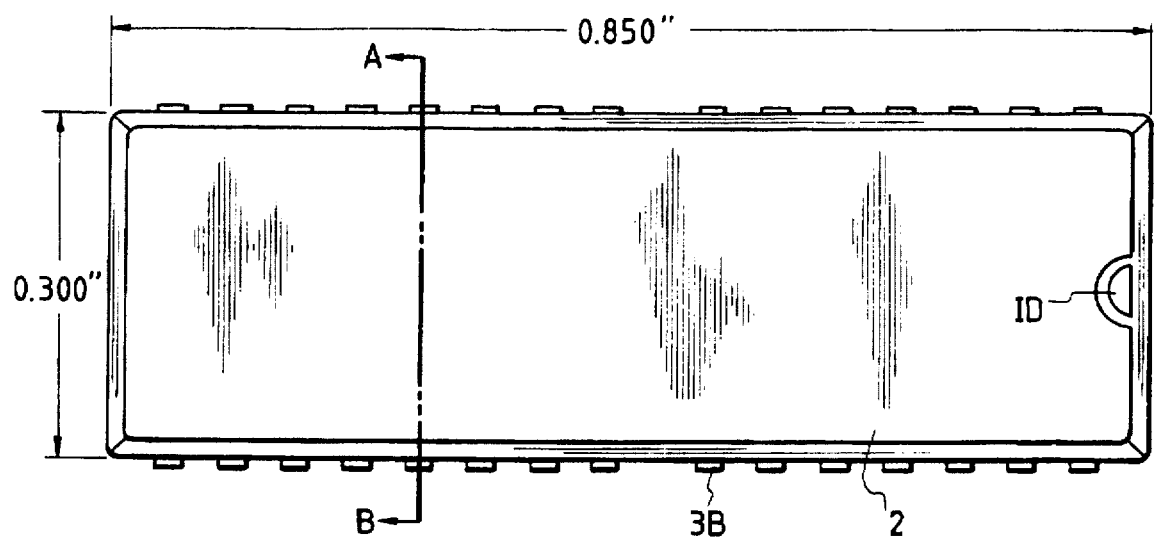
FIG. 14 is a plan view thereof.
Figure 15:
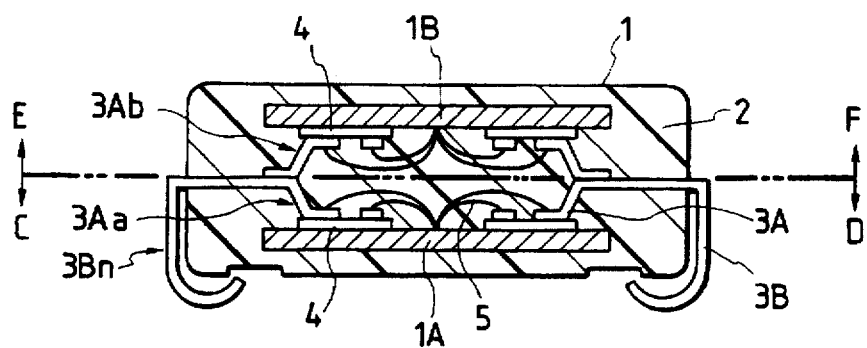
FIG. 15 is a structural sectional view taken on line 15—15 in FIG. 14.

FIG. 13 is a structural perspective view of a 128M DRAM package embodying the invention and FIG. 14 is a plan view thereof. FIG. 15 is a structural sectional view of the DRAM package shown in FIGS. 13 and 14, and FIGS. 16 to 18 are cut-away plan views thereof. Further, FIGS. 19 to 23 are processing diagrams relating to manufacturing processes for the DRAM package illustrated in FIGS. 13 and 14, and FIG. 24 is a plan view showing an example of a lead frame used therein. FIGS. 25 to 31 are structural sectional views and plan view of other package forms of DRAM packages embodying the invention. With reference to these figures, the following description is provided about the package form, manufacturing method and features of the DRAM packages, including modifications. These examples place no limitation on concrete shape and size of the package as well as in what order the bonding pads are to be arranged.

1.4.1. Outline of Lead Laminated Type Package

This 128M DRAM package basically comprises two 64M DRAM sub chips A (1A: first semiconductor chip) and B (1B: second semiconductor chip), as mentioned previously. As shown in FIG. 15, these sub chips are mounted oppositely to each other on both sides of a lead frame 3 which serves as wiring means. The lead frame 3 comprises inner leads 3A in the interior of the package and outer terminals or leads 3B in the exterior of the package. That is, the lead frame 3 as wiring means has a structure which is substantially integrally formed with the external terminals of the package. The DRAM package after sealing is a so-called SOJ type package, having outer dimensions of 300 mils in short side and 850 mils in long side, as shown in FIG. 14. FIG. 15 corresponds to a structural sectional view taken on line 15—15 of the plan view of FIG. 14, while FIGS. 16 and 17 correspond to cut-away plan views taken along lines 16—16 and 17—17 in the structural sectional view of FIG. 15. It goes without saying that in the following structural sectional views, including FIG. 15, the sectional views of the sub chips 1A and 1B are taken in the short side direction of the sub chips.

Figure 16:
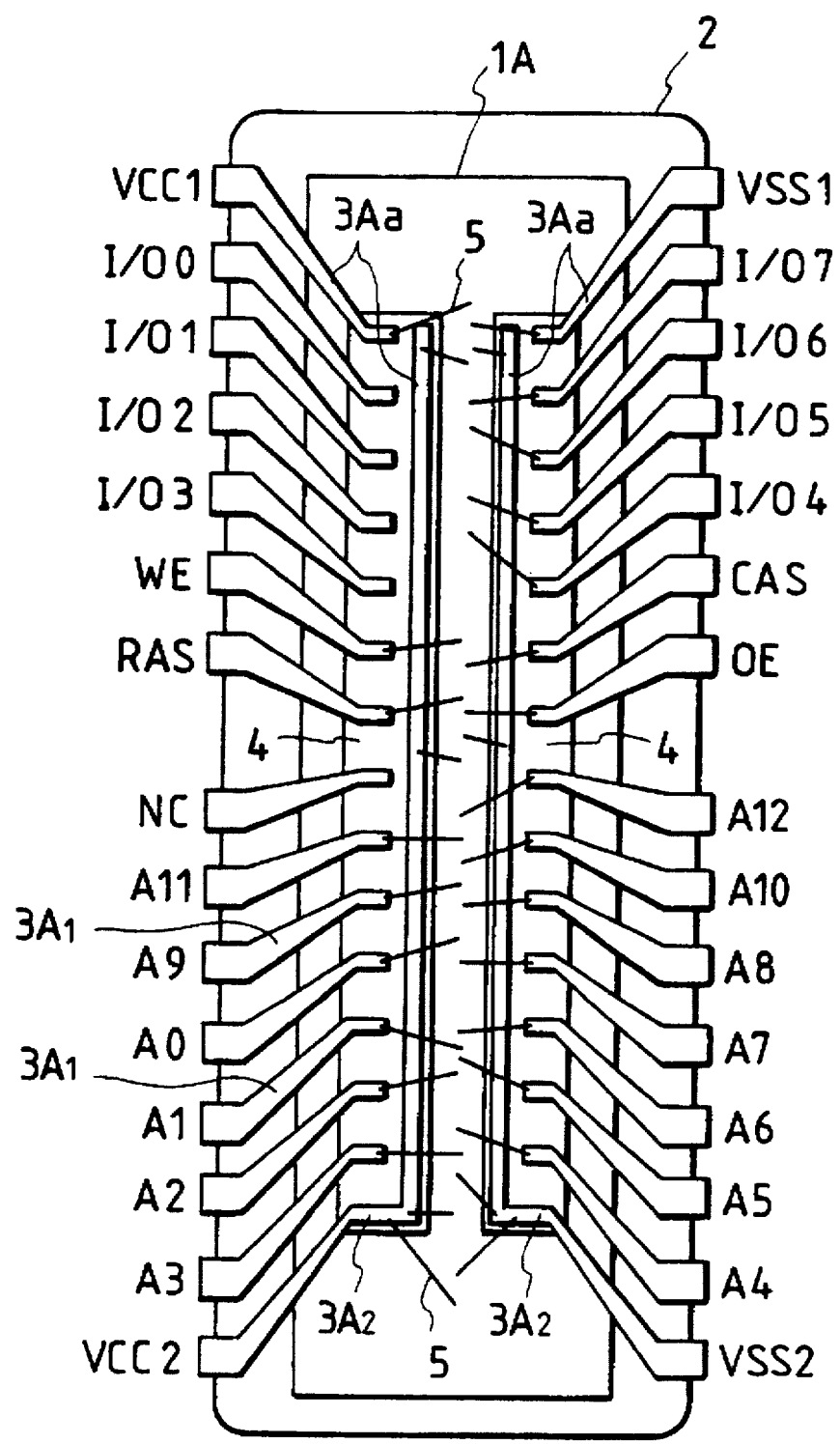
FIG. 16 is a plan view cut away along line ≠—≠in FIG. 15.
Figure 17:
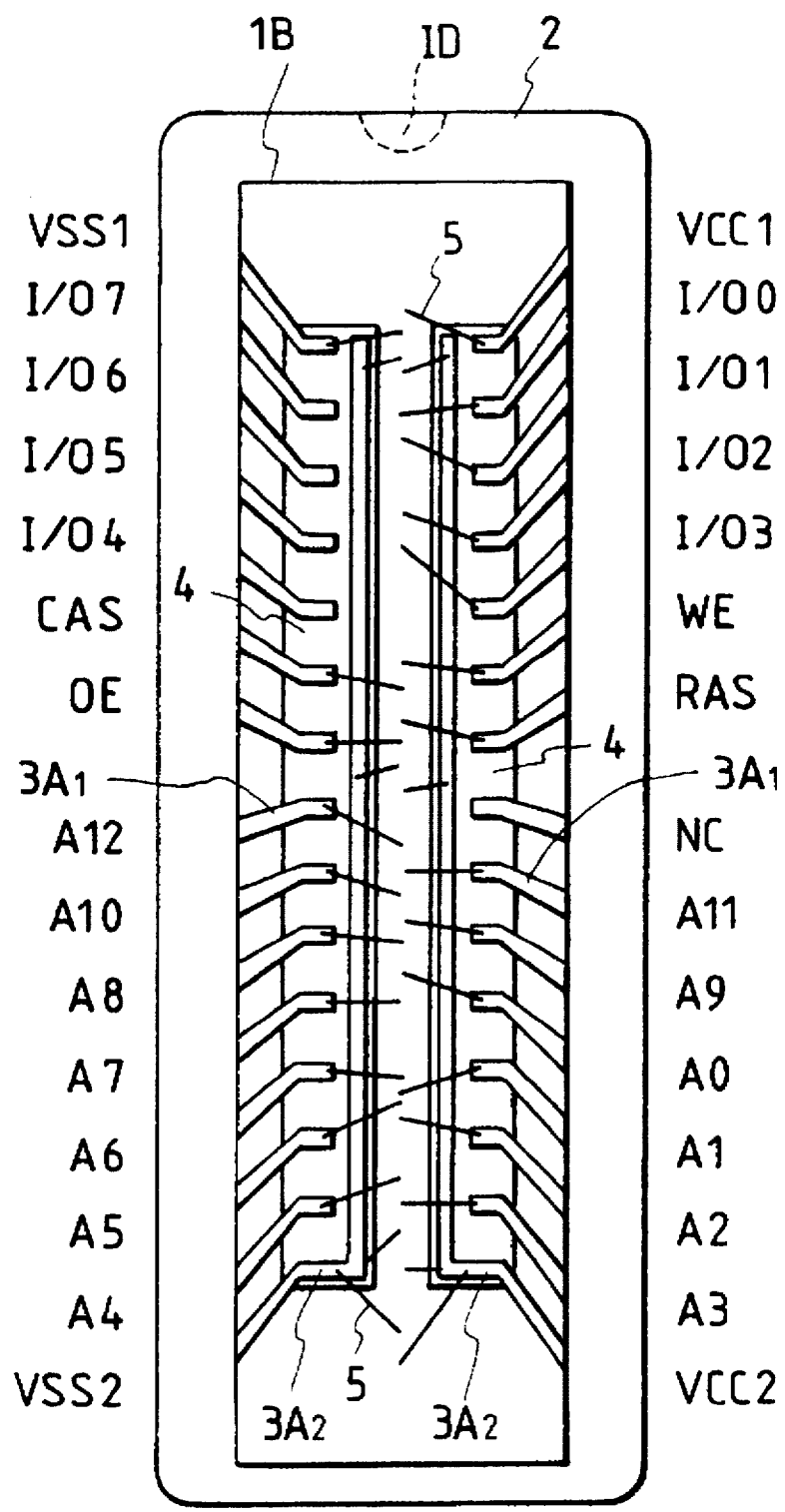
FIG. 17 is a plan view cut away along line ʃ—ʃin FIG. 15, showing a first example of the DRAM package of FIG. 14.

In FIG. 15, the sub chip 1A is connected to inner leads 3A$a$ of one lead frame (first lead frame) through an insulating film 4 of polyimide sandwiched in between adhesive layers of a thermoplastic polyimide. This lead frame is made integral with the external terminals or outer leads 3B of the DRAM package without being cut. Plural bonding pads provided centrally of Y axis of the sub chip 1A in a straight line form are connected to corresponding inner leads 3A$a$ through bonding wires 5. As shown in FIG. 16, the inner leads are separated into relatively short inner leads 3A1 which are provided correspondingly to ordinary external terminals and relatively long inner leads 3A2 for the supply of source voltage and earth potential provided between externals VCC1 and VCC2 and between external terminals VSS1 and VSS2. The inner leads 3A1 are used for bonding to inputting or outputting pads, while the inner leads 3A2 are used for the supply of source voltage and earth potential and for bonding to mode setting pads F1–F3 and TC. Thus, in this package, the source voltage and earth potential can be supplied in any desired positions through the inner leads 3A2, so it is possible to shorten the source voltage or earth potential feed lines to suppress power source noises and attain speed-up of the operations of the DRAM sub chips 1A and 1B. As the bonding wires 5 there are used aluminum, gold or copper wires or coated wires obtained by coating the surfaces of such metal wires with an insulating resin. For the bonding between inner leads and pads there is adopted a conventional method used for LOC type packages, and the bonding is effected by a bonding method comprising both pressure bonding under heating and ultrasonic vibration. In a LOC type package, the inner leads 3A can be extended freely without being restricted by the shape of the DRAM sub chips 1A and 1B, so the sub chip size can be increased accordingly; in other words, the package size can be reduced.

Figure 18:
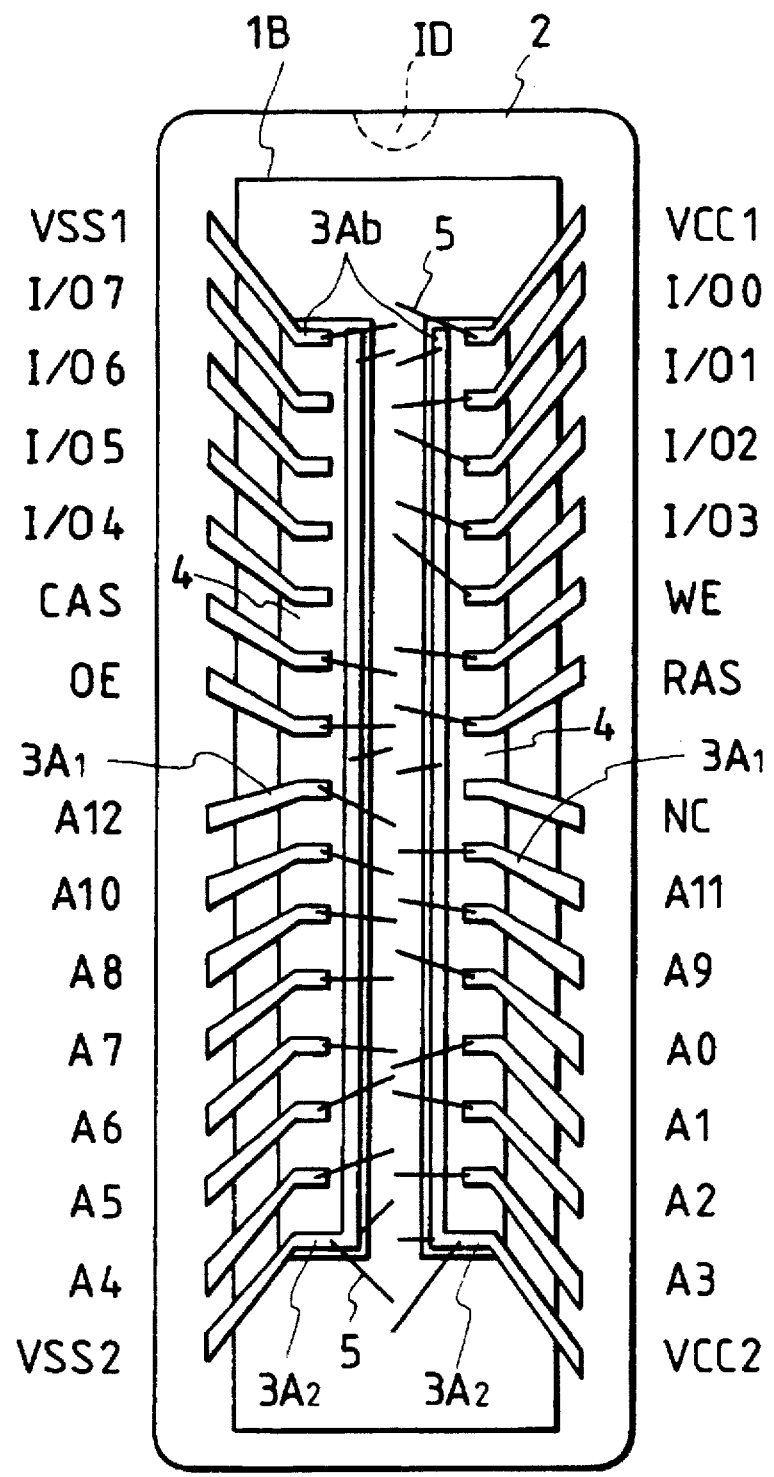
FIG. 18 is a plan view of a modification of FIG. 17, showing a second example of the DRAM package of FIG. 14.

On the other hand, the sub chip 1B is connected to inner leads 3A$b$ of the other lead frame (second lead frame) also through the insulating film 4. Though not specially limited, this lead frame is cut along the outer edges of the sub chips 1A and 1B and connected to corresponding inner leads 3A$a$ of the lead frame which corresponds to the sub chip 1A. Thus, according to the package form of this package, two opposed lead frames are cut and bonded, so this package is named a lead laminated type package. The inner leads 3A$b$ may be cut outside the sub chips 1A and 1B and inside a resin sealed type package 2, as shown in FIG. 18. As mentioned previously, bonding pads of the sub chips 1A and 1B are arranged centrally thereon and along the Y axis, or the long side, in a straight line form. For the bonding of the sub chips 1A and 1B, therefore, predetermined external terminals of the sub chips are connected to left- and right-hand inner leads 3A$a$, 3A$b$, respectively, in the sub chips 1A and 1B for example. Such different bondings in the sub chips 1A and 1B permit overlapping of leads of corresponding functions when the sub chips 1A and 1B are lapped (or stacked) together in opposed relation to each other.

The sub chips 1A and 1B thus bonded together through the lead frames are sealed with a molding resin 2. As the molding resin 2 there is used an epoxy resin incorporating therein a phenolic curing agent, a silicone rubber and a filler for attaining a reduced stress of the package. The silicone rubber functions to decrease the elastic modulus and the coefficient of thermal expansion of the epoxy resin. The filler, which is formed as spherical silicon oxide particles, also functions to decrease the thermal expansion coefficient. In a predetermined position of the package there is formed a cut-in portion serving as an index ID. The package is designed so that the cut portion of the lead frame corresponding to the sub chip 1B and the portion thereof bonded to the lead frame corresponding to the sub chip 1A are located in the interior of the resin-sealed package, i.e., the molding resin 2, whereby the said lead frame cut portion and bonded portion can be protected and hence it is possible to enhance the durability of the DRAM package.

1.4.2. How to Produce Lead Laminated Type Package

The 128M DRAM package of this embodiment is produced through the following processes.

(1) Bonding to Pellet

Figure 19:
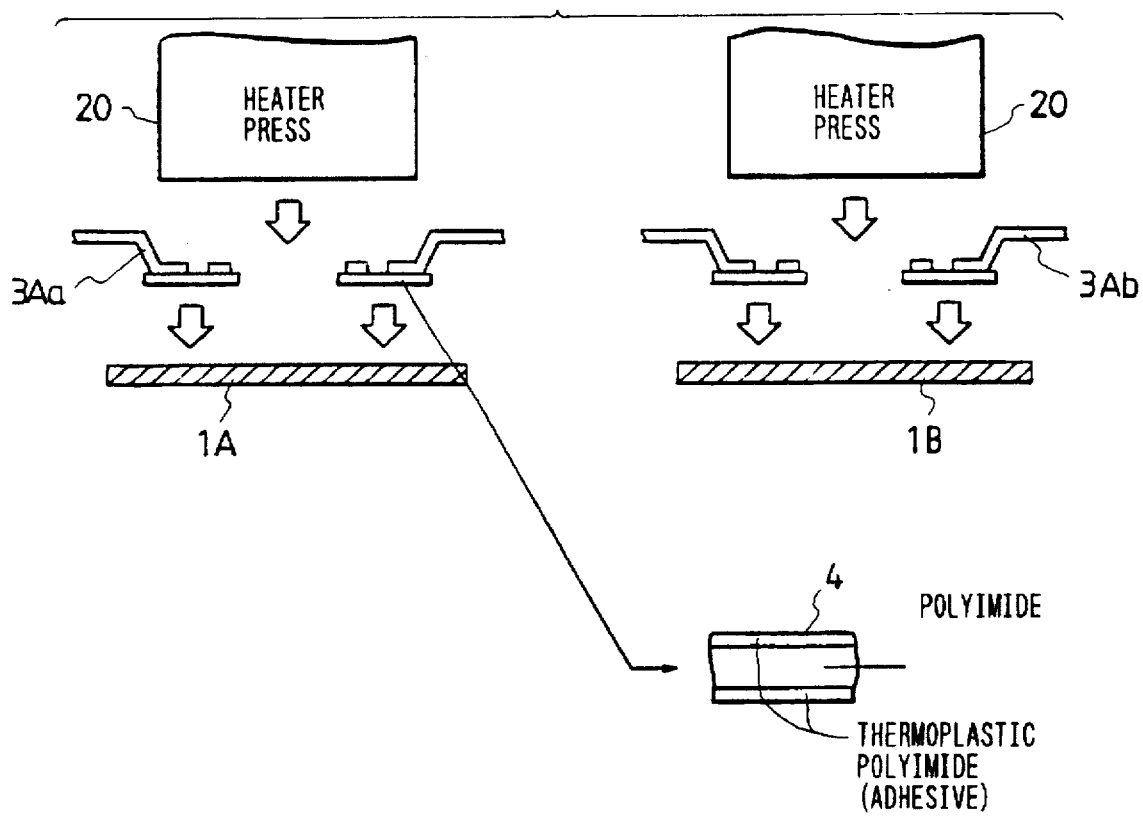
FIG. 19 is a processing diagram showing a first manufacturing process for the DRAM package illustrated in FIG. 13.

The sub chips 1A and 1B are bonded to the corresponding inner leads 3A$a$ and 3A$b$ through the insulating film 4. As shown in FIG. 19, the insulating film 4 is of a three-layer structure wherein polyimide is sandwiched in between adhesive layers of a thermoplastic polyimide. The insulating film 4 is heated and pressurized in advance by means of a heater press, then bonded to the inner leads 3A$a$ or 3A$b$ and thereafter bonded to the sub chip 1A or 1B by a heat press 20.

(2) Wire Bonding

Figure 20:
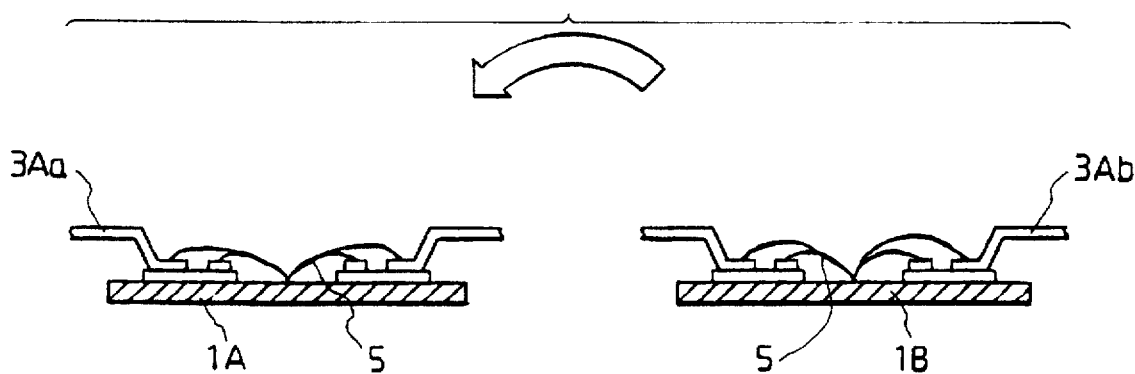
FIG. 20 is a processing diagram showing a second manufacturing process for the DRAM package illustrated in FIG. 13.
Figure 21:
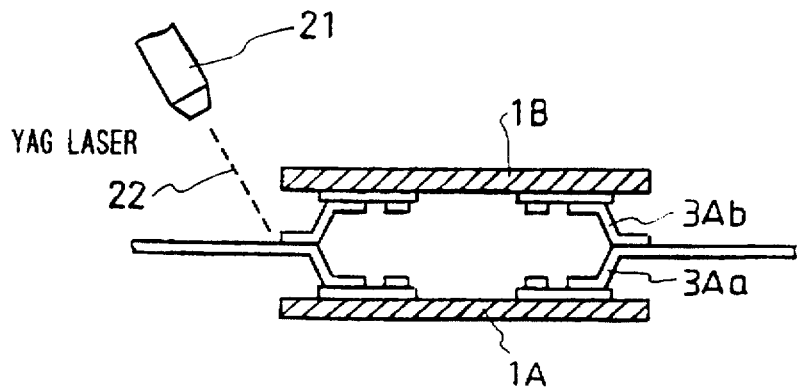
FIG. 21 is a processing diagram showing a third manufacturing process for the DRAM package illustrated in FIG. 13.

Next, as shown in FIG. 20, there is performed a bonding processing between the bonding pads arranged centrally of the Y axis or the long side of the sub chips 1A, 1B and the inner leads 3A$a$, 3A$b$. The inner leads 3A$a$ and 3A$b$ are each bent beforehand in a direction away from the corresponding sub chip. After completion of the bonding, the sub chip 1B bonded to the inner leads 3A$b$ is inverted onto the sub chip 1A bonded to the inner leads 3A$a$, whereby the two sub chips 1A and 1B are opposed to each other on both sides of the lead frames and the inner leads corresponding to each other come into contact with each other.

(3) Cutting and Bonding of Leads

For mutual contact of the corresponding leads, the inner leads 3A*b* superimposed on the inner leads 3A*a* are cut in the outer edge position of each sub chip by a YAG laser beam 22 emitted from a laser device 21 and at the same time they are welded to the inner leads 3A*a*. Now, the corresponding leads of the inner leads 3A*a* and 3A*b* are connected together electrically.

(4) Sealing

Figure 22:
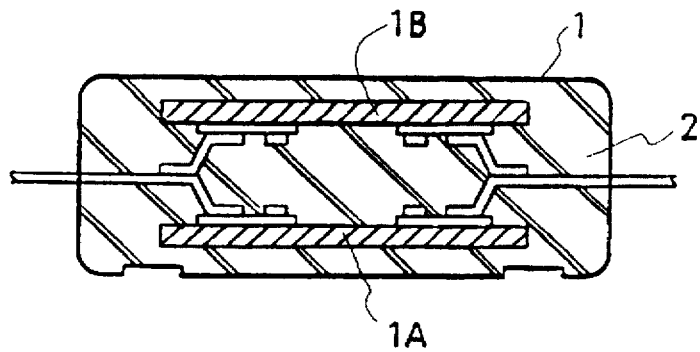
FIG. 22 is a processing diagram showing a fourth manufacturing process for the DRAM package illustrated in FIG. 13.

The sub chips 1A and 1B thus laminated together oppositely with the lead frames put therebetween are then sealed with the molding resin 2, as shown in FIG. 22. At this time, the cut portions of the inner leads 3A*b* and the bonded portions thereof to the inner leads 3A*a* are protected within the molding resin 2, whereby the entry of water, etc. through the bonded portions is prevented and hence it is possible to enhance the durability of the DRAM package.

(5) Lead Forming

Figure 23:
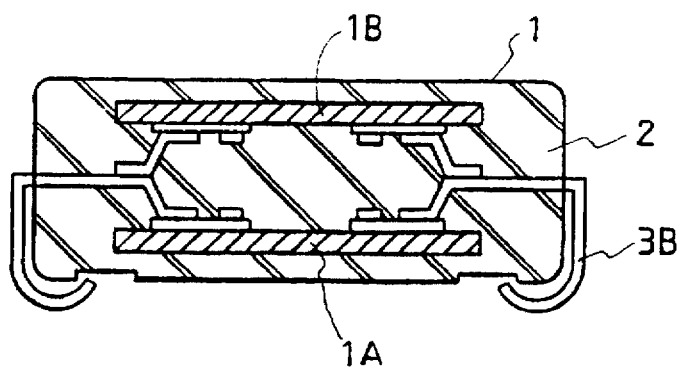
FIG. 23 is a processing diagram showing a fifth manufacturing process for the DRAM package illustrated in FIG. 13.
Figure 24:
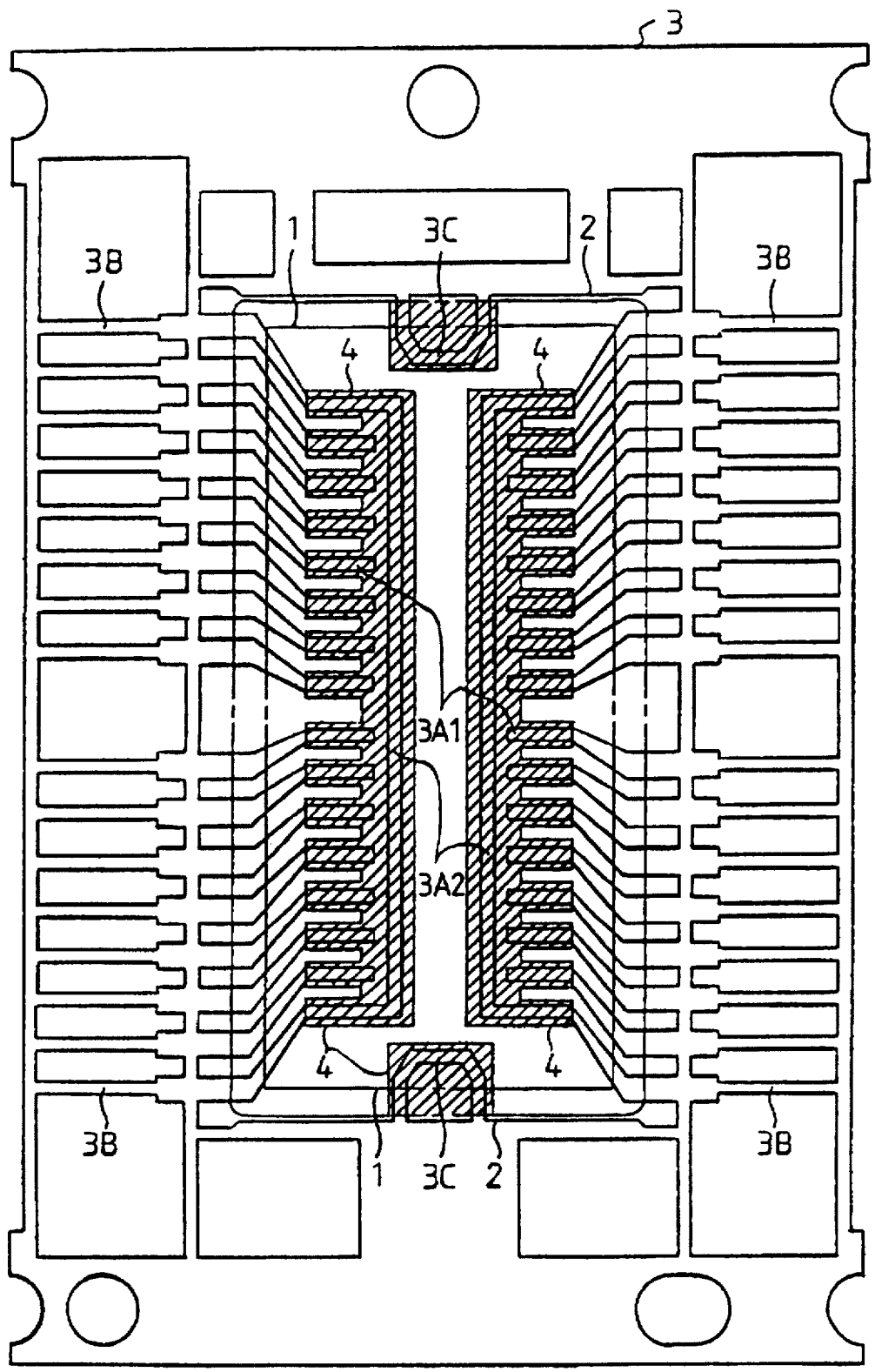
FIG. 24 is a plan view showing an example of a lead frame and an insulating film both used in the DRAM package of FIG. 13.

In the package thus sealed with the molding resin 2, as shown in FIG. 23, the outer leads 3B of the lead frame corresponding to the sub chip 1A are formed by a predetermined pressing machine to obtain a DRAM package 1 of the so-called SOJ structure.

1.4.3. Lead Frame and Insulating Film

The lead frames used in the lead laminated type package of this embodiment are designed so that the distance between adjacent inner and outer leads 3A, 3B is almost equal throughout the lead frames, as shown in FIG. 24. As a result, the parasitic capacitance between leads is unified, the amount of noise induced between leads is suppressed, and the signal transfer time associated with the DRAM package is shortened accordingly.

On the other hand, the insulating film 4 used for bonding between the sub chips 1A, 1B and the inner leads 3A is cut in the shape of a comb along the inner leads 3A1, as indicated by oblique lines in FIG. 24. The thermal expansion coefficient of the insulating film is relatively greatly different from that of the semiconductor substrate which forms each sub chip or the lead frame. Therefore, in the case where the substantial bonding area of the insulating film is large, the bonded portion of the insulating film may be peeled off by expansion and contraction caused by temperature changes over a long period. By cutting the insulating film 4 in the shape of a comb along the inner leads 3A1 to reduce its substantial bonding area, it is made possible to suppress the separation of the insulating film and enhance the durability and reliability of the DRAM package.

1.4.4. Other Package Forms

Figure 25:
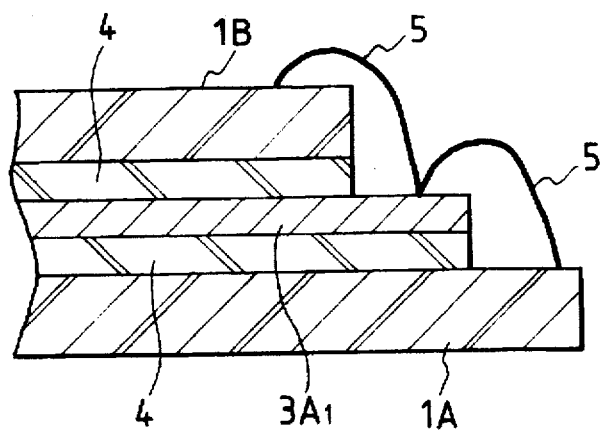
FIG. 25 is a structural sectional view of a DRAM package further embodying the invention.

There may be adopted such modified forms of 128M DRAM packages as shown in FIGS. 25 to 31. In FIG. 25, the back side of a sub chip 1B is bonded to the upper surface of a lead frame 3A1 coated with an insulating film 4 of a polyimide resin, while to the lower surface of the lead frame 3A1 is bonded the surface side of a sub chip 1A. At this time, the sub chip 1B and the inner leads 3A1, as well as the inner leads 3A1 and the sub chip 1A, are shifted from each other by a predetermined distance required for wire bonding. Thereafter, the inner leads 3A1 and the sub chip 1A are wire-bonded together according to the LOC technique, and the inner leads 3A1 and the sub chip 1B are wire-bonded by a conventional method.

Figure 26:
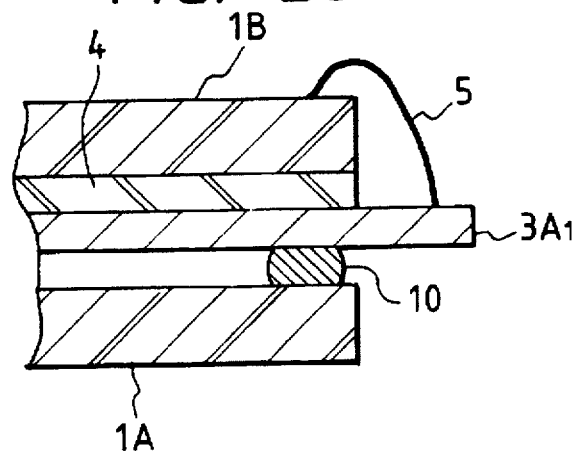
FIG. 26 is a structural sectional view of a DRAM package further embodying the invention.

On the other hand, as shown in FIG. 26, when the lower sub chip 1A and the inner leads 3A1 are bonded together using solder bumps 10, it is not necessary to substantially shift the sub chips 1A and 1B in the manner described above.

Figure 27:
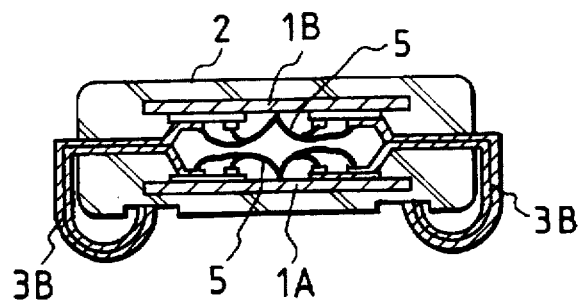
FIG. 27 is a structural sectional view of a DRAM package further embodying the invention.

In the foregoing lead laminated type package, the two lead frames corresponding to the sub chips 1A and 1B can be extended up to the outer leads 3B without being cut, as shown in FIG. 27. In this case, for retaining the durability of the DRAM package, it is necessary to prevent the ingress of water, etc. through the lead frame bonded portion.

Figure 28:
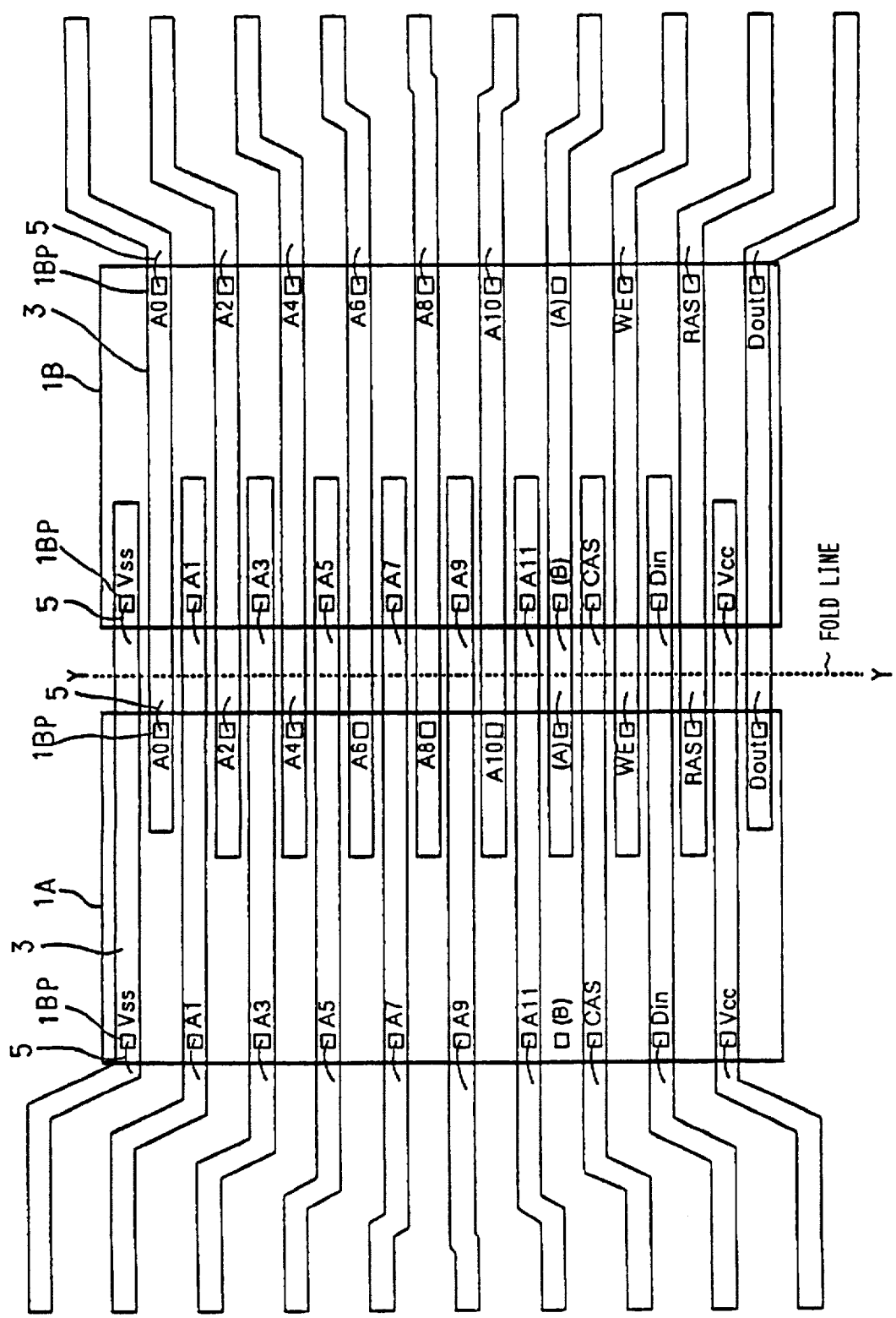
FIG. 28 is a plan view of a lead frame included in a DRAM package further embodying the invention.
Figure 29:
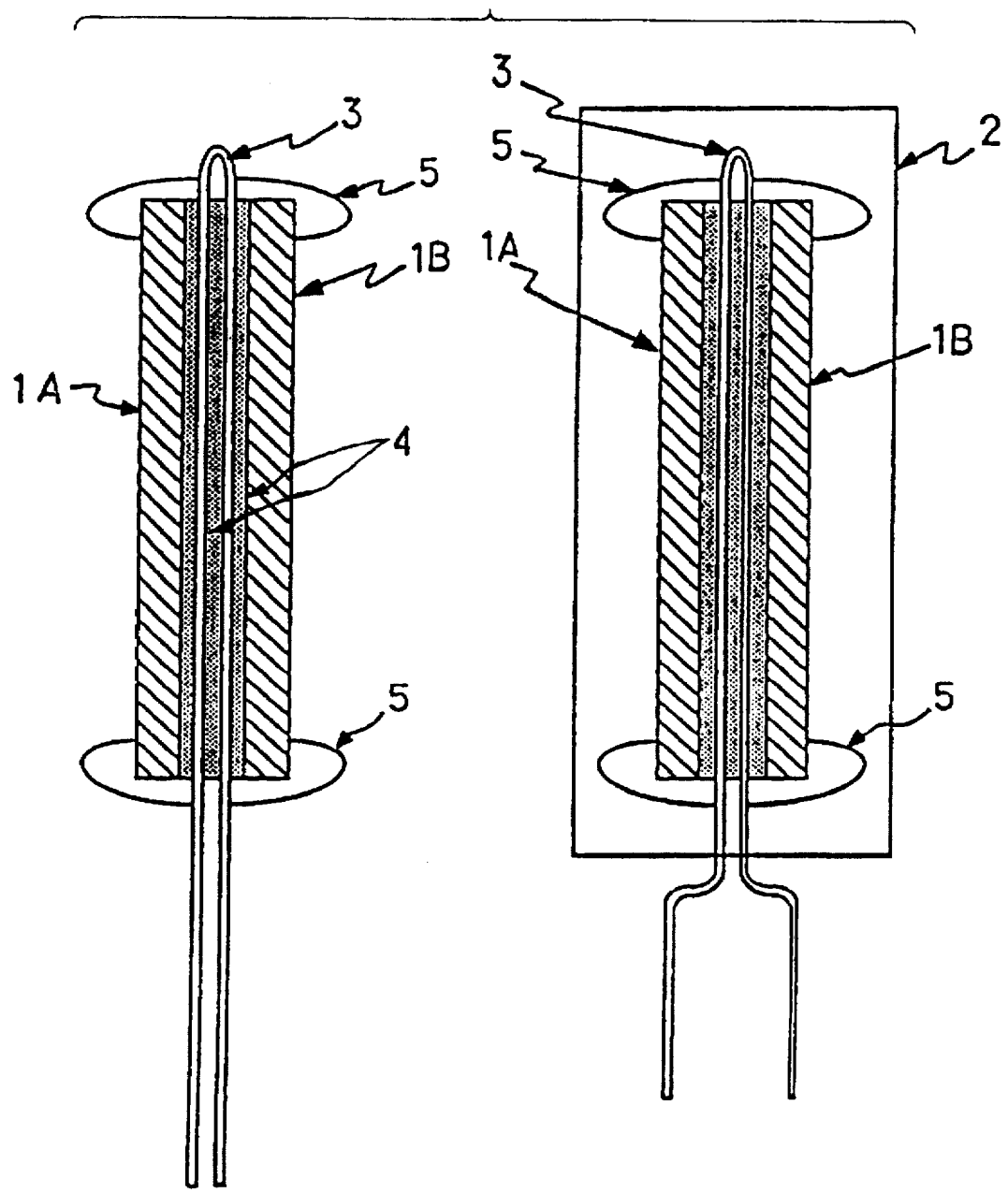
FIG. 29 is a structural sectional view of the DRAM package referred to in FIG. 28.

In the case where it is possible to realize a lead frame which permits two sub chips 1A and 1B to be arranged side by side on the same plane, as shown in FIG. 28, there can be formed such a DRAM package as shown in FIG. 29 by bending the lead frame along a fold line upon completion of bonding and wire bonding of those sub chips. In this case, the backs of the sub chips 1A and 1B are bonded and fixed using an insulating film 4 of a polyimide resin, followed by sealing with a molding resin 2.

Further, as shown in FIG. 30, the sub chips 1A and 1B can each be bonded to a lead frame as a circuit board through solder bumps 6, as shown in FIG. 30. As shown in FIG. 31, moreover, it is also possible to realize a DRAM package comprising four sub chips by stacking two pairs of sub chips 1A, 1B and 1C, 1D bonded according to the lead laminated packaging method, in the direction perpendicular to the sub chip surfaces and then connecting corresponding leads of the lead frames in common. Also in this case, for enhancing the durability of the DRAM package it is desirable that the cut portion of the lead frame corresponding to the sub chip 1C and the bonded portion thereof to the lead frame corresponding to the sub chip 1A be located in the interior of the molding resin 2.

1.5. Bonding Options of DRAM Sub Chips

FIG. 32 is a list relating to bonding options of 64M DRAM sub chips to which the invention is applied. FIGS. 33 to 38 are connection diagrams of pads of the 128M DRAM packages illustrated in FIG. 1 and FIGS. 8 to 12. With reference to these figures, the following description is provided about bonding options of the DRAM sub chips and the connection of pads therein. The pad connection diagrams of FIGS. 33 to 38 are for explaining the relation of connection between pads and leads, placing no limitation on concrete arrangements and sizes of pads and leads.

In each of the 64M DRAM sub chips according to this embodiment there are provided four bonding pads F1–F3 and TC for setting the bit configuration thereof and conditions for chip selection. As is apparent from FIG. 32, the pads F1 and F2 are used for setting the bit configuration of each DRAM sub chip; the pad TC sets whether the DRAM sub chips are to be accessed selectively or simultaneously; and the pad F3 is used for setting on which logical level of the X address signal X13 as a chip selection signal the DRAM sub chips are to be brought into a selected state in the case where the sub chips are accessed selectively. In the initial state of the sub chips the pads F1–F3 and TC are brought into a non-connected state NC (No Connect) not connected to any of the leads, and if necessary, they are wire-bonded selectively to an inner lead 3A2 for the supply of source voltage, or a source voltage supplying lead VCC.

Figure 33:
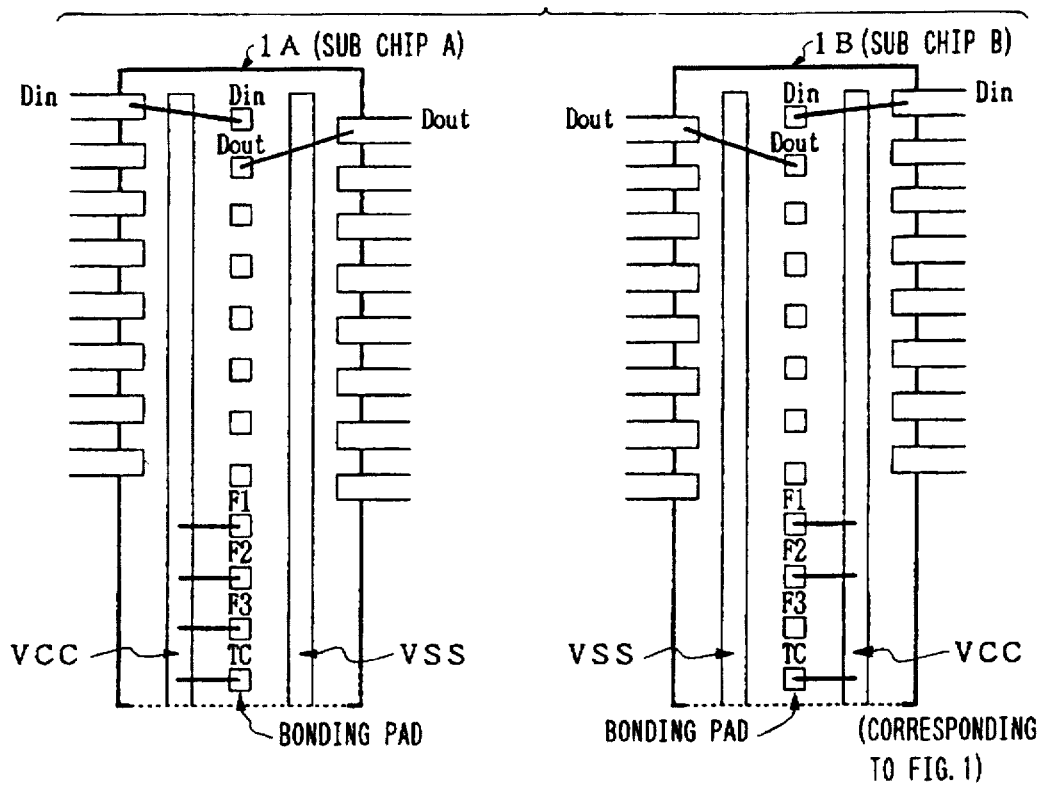
FIG. 33 is a connection diagram of pads in the DRAM package of FIG. 1.

When the pads F1 and F2 are both connected to the source voltage supplying lead VCC, the associated DRAM sub chip has a bit configuration of 64M×1 bit and inputs or outputs storage data in the unit of 1 bit through data input pad Din or data output pad Dout. At this time, as shown in FIG. 33, when the pad TC is connected to the source voltage supplying lead VCC, the sub chip is activated selectively in accordance with the chip selection signal, i.e., X address signal 13. Thus, the illustrated sub chips correspond to the sub chips A (1A) and B (1B) which constitute the DRAM package of FIG. 1. When the pad F3 is connected to the source voltage supplying lead VCC, the sub chip is brought into a selected state selectively on condition that the level of the X address signal X13 is a low level, while when the pad F3 is brought into the unconnected state NC, the sub chip is brought into the selected state selectively on condition that the level of the X address signal X13 is a high level H. The data input pads Din of the sub chips A and B are connected in common to leads corresponding to data input terminals Din of the DRAM package, while the data output pads Dout are connected in common to leads corresponding to data output terminals Dout of the DRAM package.

Figure 34:
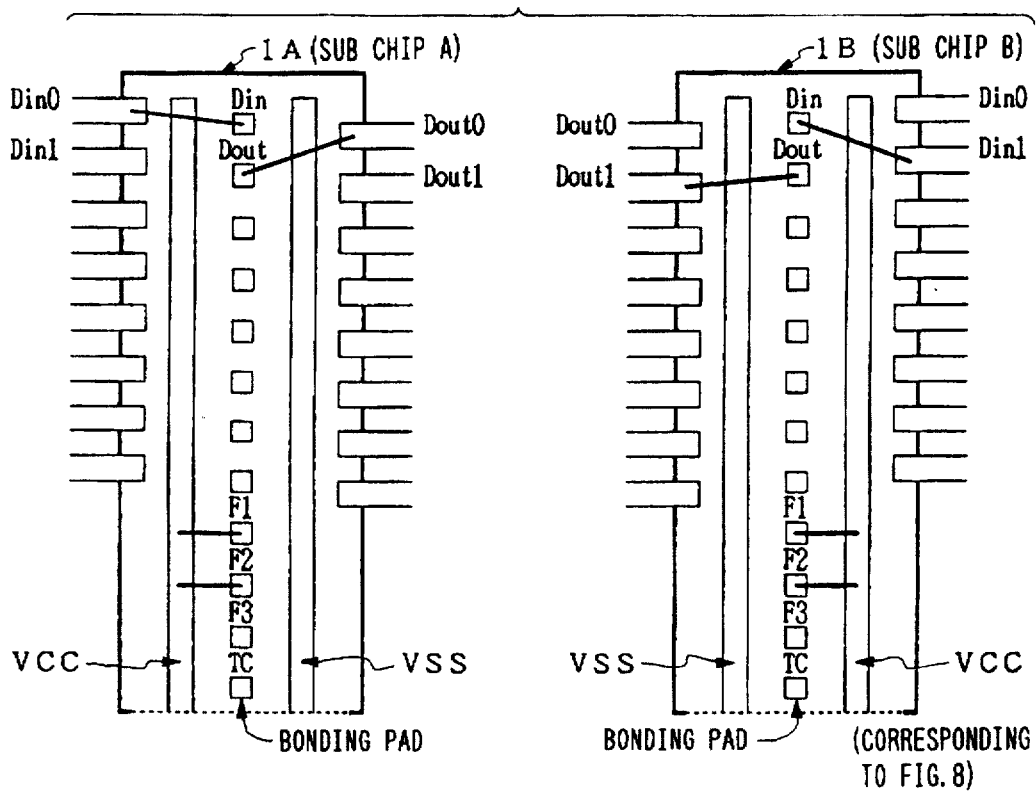
FIG. 34 is a connection diagram of pads in the DRAM package of FIG. 8.

On the other hand, as shown in FIG. 34, when the pads F1 and F2 are both connected to the source voltage supplying leads VCC and the pad TC is brought into the non-connected state NC, the associated sub chip has a bit configuration of 64M×1 bit and is held in the selected state irrespective of the logical level of the X address signal X13. Thus, the sub chips correspond to the sub chips A and B which constitute the DRAM package shown in FIG. 8. At this time, the data input and output pads Din, Dout of the sub chip A are connected respectively to leads corresponding to data input and output terminals Din0, Dout0 of the DRAM package, while the data input and output pads Din, Dout of the sub chip B are connected respectively to leads corresponding to data input and output terminals Din1, Dout1 of the DRAM package.

Figure 35:
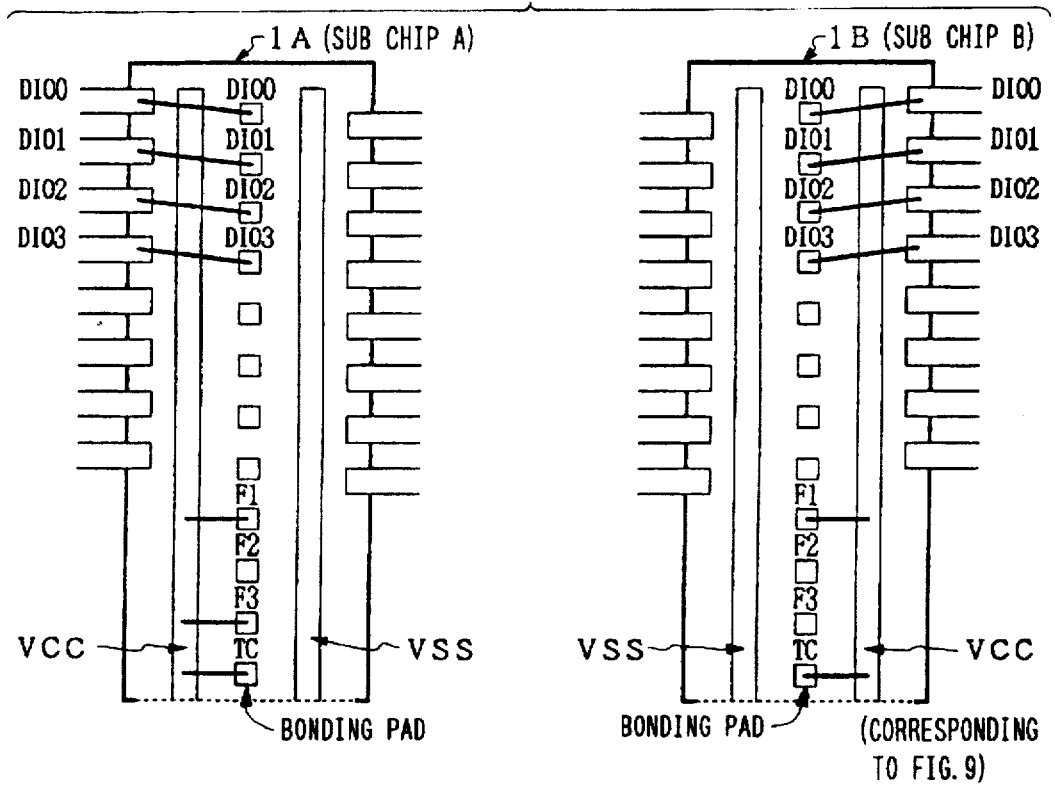
FIG. 35 is a connection diagram of pads in the DRAM package of FIG. 9.

When the pad F1 is connected to the source voltage supplying lead VCC and the pad F2 is brought into the non-connected state NC, the associated DRAM sub chip has a bit configuration of 16M×4 bits and inputs or outputs storage data in the unit of 4 bits through data input-output pads DIO0 to DIO3. At this time, as shown in FIG. 35, once the pad TC is connected to the source voltage supplying lead VCC, the sub chip is activated selectively in accordance with the X address signal X13. Thus, the sub chips correspond to the sub chips A and B which constitute the DRAM package shown in FIG. 9. Further, when the pad F3 is connected to the source voltage supplying lead VCC, the associated sub chip is brought into a selected state selectively on condition that the level of the X address signal X13 is a low level L, while when the pad F3 is brought into the non-connected state NC, the sub chip is brought into the selected state selectively on condition that the level of the X address signal X13 is a high level H. The input-output pads DIO0–DIO3 of the sub chips A and B are respectively connected in common to leads corresponding to the data input-output terminals DIO0–DIO3 of the DRAM package.

Figure 36:
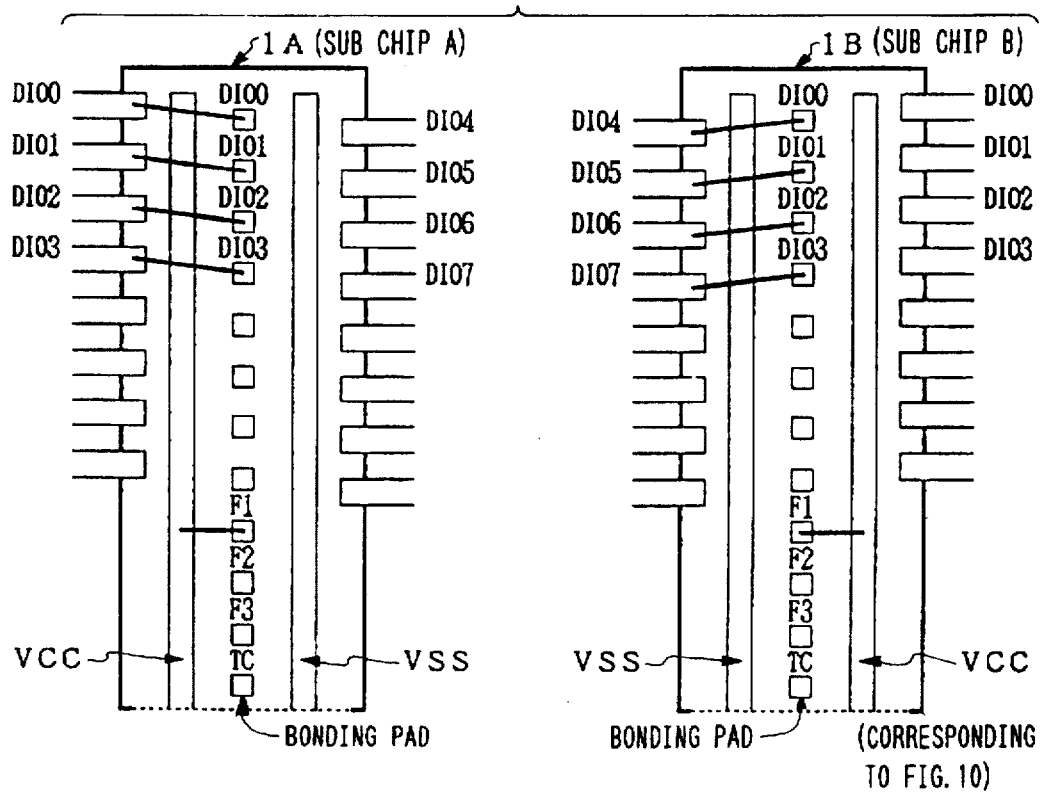
FIG. 36 is a connection diagram of pads in the DRAM package of FIG. 10.

On the other hand, as shown in FIG. 36, when the pad F1 is connected to the source voltage supplying lead VCC and the pads F2 and TC are brought into the non-connected state NC, the associated sub chip has a bit configuration of 16M×4 bits and is held in the selected state. Now, the sub chips correspond to the sub chips A and B which constitute the DRAM package shown in FIG. 10. At this time, the data input-output pads DIO0–DIO3 of the sub chip A are connected respectively to leads corresponding to the data input-output terminals DIO0–DIO3 of the DRAM package, while the data input-output pads DIO0–DIO3 of the sub chip B are connected respectively to leads corresponding to the data input-output terminals DIO4–DIO7 of the package.

Figure 37:
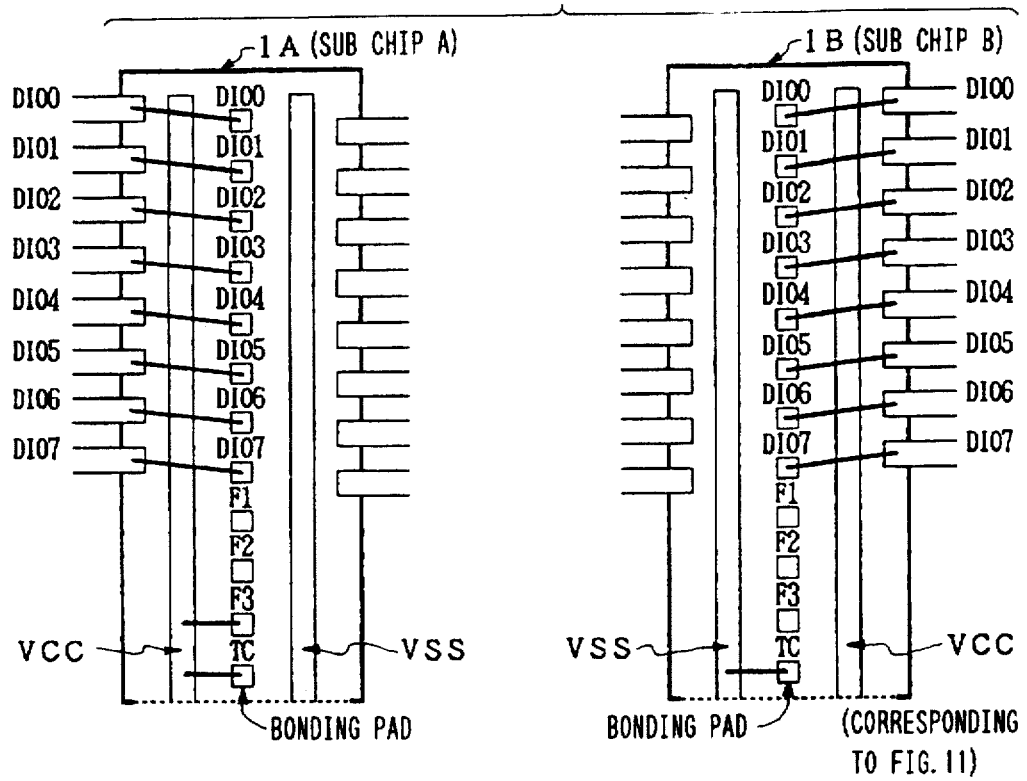
FIG. 37 is a connection diagram of pads in the DRAM package of FIG. 11.

Further, when the pads F1 and F2 are both brought into the non-connected state NC, the associated DRAM sub chip has a bit configuration of 8M×8 bits and inputs or outputs storage data in the unit of 8 bits through the input-output pads DIO0–DIO7. At this time, as shown in FIG. 37, when the pad TC is connected to the source voltage supplying lead VCC, the sub chip is activated selectively in accordance with the X address signal X13. Now, the sub chips of this DRAM package correspond to the sub chips A and B which constitute the. DRAM package illustrated in FIG. 11. Further, when the pad F3 is connected to the source voltage supplying lead VCC, the associated sub chip is brought into a selected state on condition that the level of the X address signal is a low level L, while when the pad F3 is brought into the non-connected state NC, the sub chip is brought into the selected state on condition that the level of the X address signal is a high level H. The data input-output pads DIO0–DIO7 of the sub chips A and B are respectively connected in common to leads corresponding to the input-output terminals DIO0–DIO7 of the DRAM package.

Figure 38:
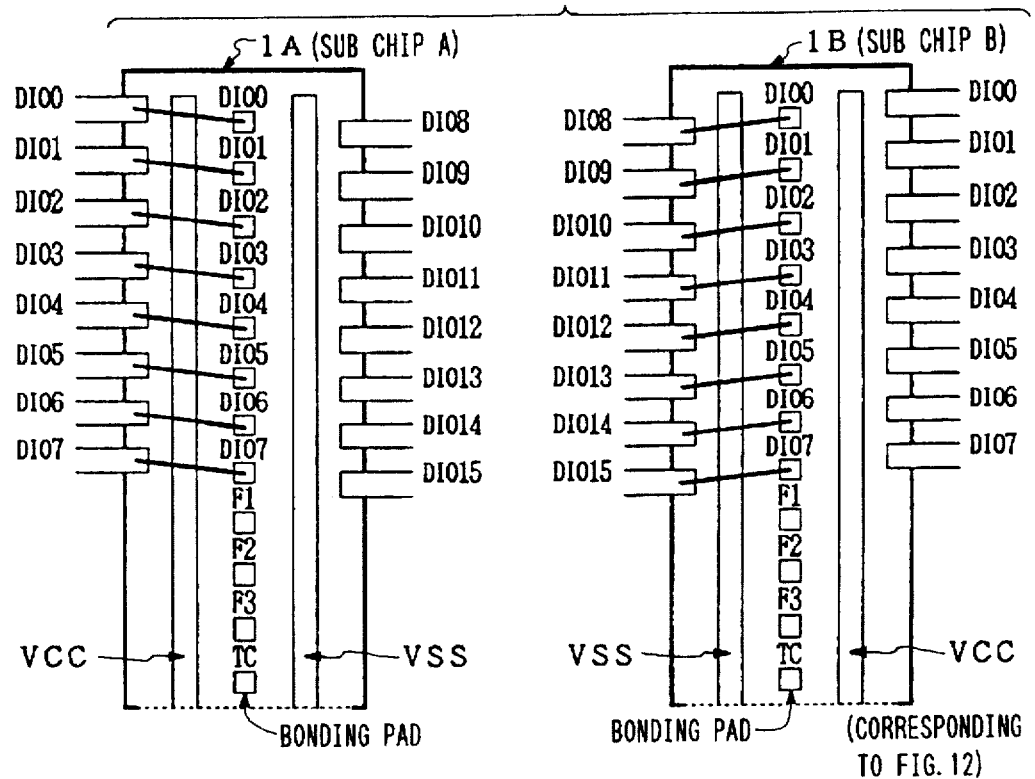
FIG. 38 is a connection diagram of pads in the DRAM package of FIG. 12.

As shown in FIG. 38, when the pads F1, F2 and TC are brought into the non-connected state NC, the associated sub chip has a bit configuration of 8M×8 bits and is held in the selected state. Now, the sub chips of this package correspond to the sub chips A and B which constitute the DRAM package illustrated in FIG. 12. At this time, the data input-output pads DIO0–DIO7 of the sub chip A are connected respectively to leads corresponding to the data input-output terminals DIO0–DIO7 of the DRAM package, while the data input-output pads DIO0–DIO7 of the sub chip B are connected respectively to leads corresponding to the data input-output terminals DIO8–DI15 of the package.

1.6. Concrete Methods for the Selection of Chip

Figure 39:
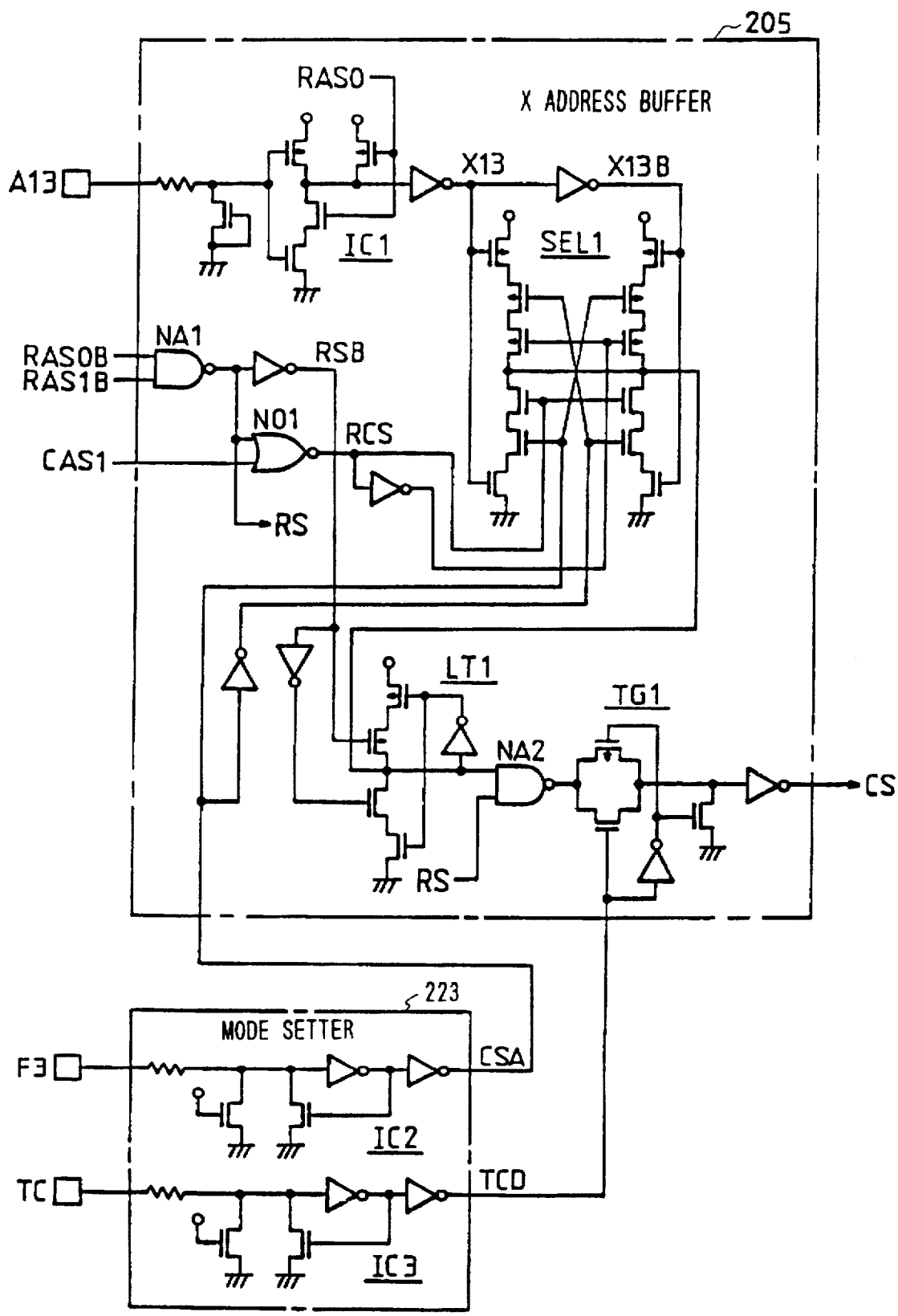
FIG. 39 is a partial circuit diagram of an X address buffer included in the DRAM sub chip of FIG. 4.

FIG. 39 is a circuit diagram of the X address buffer 205 included in the 64M DRAM sub chip embodying the invention, and FIGS. 40 to 44 are block diagrams and timing charts illustrating other chip selecting methods in DRAM package. With reference to these figures, the following description is provided about concrete chip selecting methods in the 64M DRAM package. In each of the circuit diagrams of the figures which follow, the MOSFET (a metal oxide semiconductor type field effect transistor; the term "MOSFET" is used herein as a generic term for insulated gate type field effect transistors) with an arrow attached to the channel (back gate) portion is a P-channel type and is distinguished from an N-channel MOSFET with an arrow not attached thereto.

1.6.1. Selective Activation Method and Configuration of X Address Buffer

The chip selection for the 64M DRAM sub chip of this embodiment is substantially determined selectively in accordance with the logical level of the internal control signal CS which is outputted from the X address buffer 205. The logical level of the internal control signal CS is set selectively in accordance with the logical level of the X address signal X13 and whether the bonding relating to the bonding pads TA and F3 is executed or not.

As shown in FIG. 39, the pad TC is connected to a corresponding input circuit IC3 of the mode setter 223, and the level of an output signal, or an internal control signal TCD, from the input circuit IC3 is made high or low selectively according to the state of bonding. More specifically, when the pad TC is brought into the non-connected state NC, the level of the internal control signal TCD is made low, while when the pad TC is connected to the source voltage supplying lead VCC, the level of the internal control signal TCD is made high. Likewise, the pad F3 is connected to a corresponding input circuit IC2 of the mode setter 223, and the level of an output signal, or an internal control signal CSA, from the input circuit IC2 is made low when the pad F3 is brought into the non-connected state NC, while when the pad F3 is connected to the source voltage supplying lead VCC, the level of the internal control signal CSA is rendered high. The internal control signals TCD and CSA are fed to the X address-buffer 205.

The X address buffer 205 includes an input circuit IC1 having an input terminal connected to an address input pad A13. The input circuit IC1 is brought into a transfer state selectively when the level of a row address strobe signal RASB and that of an internal control signals RAS0 are made high, and it takes in the chip selection signal, i.e., the X address signal X13, which is fed time-sharingwise through the address input pad X13. An output signal from the input circuit IC1 is fed as an internal signal X13 to one input terminal of a selector SEL1, while at the same time, after being inverted by an inverter, the thus-inverted output signal is fed as an inverted internal signal X13B to the other input terminal of the selector SEL1. To a first control terminal of the selector SEL1 is fed the internal control signal CSA from the mode setter 223, while to a second control terminal thereof is fed an output signal, or an internal signal RCS, from a NOR gate NO1.

To one input terminal of the NOR gate NO1 is fed an internal control signal CAS1 which is formed in accordance with a column address strobe signal CASB, while to the other input terminal thereof is fed an output signal from a NAND gate NA1. To a pair of input terminals of the NAND gate NA1 are fed inverted internal control signals RAS0B and RAS1B which are formed on the basis of the row address strobe signal RASB. As a result, the level of the output signal from the NAND gate NA1 is rendered high selectively when the level of either the inverted internal control signal RAS0B or RAS1B is made low, while the level of the output signal from the NOR gate NO1, i.e. the internal signal RCS, is rendered low selectively when the level of the output signal from the NAND gate NA1 or that of the internal control signal CAS1 is made high. In other words, during the period in which the DRAM sub chips are held in an unselected state and also during the period from the time when the DRAM sub chips are brought into a selected state until when the level of the inverted internal control signal RAS0B or RAS1B is made low or that of the internal control signal CAS1 is made high, the level of the internal control signal RCS is kept high, while it is rendered low while the DRAM sub chips are substantially held in a selected state.

When the level of the internal signal RCS is made high, the selector SEL1 is brought into a transfer state, while when the level of the internal signal RCS is rendered low, the selector SEL1 is brought into a non-transfer state. In the transfer state, when the level of the internal control signal CSA is low, the selector SEL1 further inverts the inverted internal signal X13D and transfers the thus-inverted signal to a latch circuit LT1 which follows, while when the level of the internal control signal CSA is high, the selector SEL1 inverts the internal control signal X13B and transfers the thus-inverted signal to the latch circuit. Thus, when the pad F3 is brought into the non-connected state NC, the selector SEL1 further inverts the inverted internal signal X13B, i.e., an inverted signal of the X address signal X13, and transfers the thus-inverted signal to the latch circuit LT1; in other words, the X address signal X13 is transferred to the latch circuit LT1 directly without being inverted. When the pad F3 is bonded to the source voltage supplying lead VCC, the selector SEL1 inverts the internal signal X13, i.e., the X address signal X13, and transfers it to the latch circuit LT1. The X address signal X13 transfer operation of the selector SEL1 is stopped upon lapse of a predetermined time after the DRAM sub chips are brought into a selected state and when the level of the internal signal RCS is made low.

The latch circuit LT1 is brought into a latch form selectively in accordance with an inverted signal of the output signal from the NAND gate NA1, i.e., an inverted internal signal RSB. More specifically, the latch circuit LT1 is brought into a latch form selectively when the level of the inverted internal signal RSB is made low, in other words, upon lapse of a predetermined time after the DRAM sub chips were brought into a selected state. In this state the latch circuit LT1 holds the internal signal X13 or inverted internal signal X13B transferred through the selector SEL1. An output signal from the latch circuit LT1 is fed to one input terminal of a NAND gate NA2. To the other input terminal of the NAND gate NA2 is fed the output signal from the NAND gate NA1, i.e., internal signal RS. An output signal from the NAND gate NA2 is outputted through a transfer gate TG1 which receives the internal control signal TCD at a control terminal thereof and further through one inverter, and serves as an internal control signal CS. An output terminal of the trasnfer gate TG1 is connected to an earth potential of the circuit through an N-channel MOSFET which receives at a gate thereof an inverted signal of the internal control signal TCD.

Thus, the internal signal X13 or inverted internal control signal X13B held by the latch circuit LT1 is transmitted to the transfer gate TG1 on condition that the level of the internal signal RS and that of the internal control signal TCD are made high, in other words, on condition that the level of the row address strobe signal RASB is made low and the pad TC is bonded to the source voltage supplying lead VCC. The internal signal X13 or inverted internal signal X13B thus transferred serves as the internal control signal CS. That is, the level of the internal control signal CS is kept low while the level of the row address strobe signal RASB is high, and upon lapse of a predetermined time after the level of the row address strobe signal RASB was made low, the level of the internal control signal CS is rendered high or low selectively in accordance with the X address signal X13 on condition that the pad TC is bonded to the source voltage supplying lead VCC. That is, when the pad F3 is in the unconnected state NC, the level of the internal control signal CS is rendered high on condition that the level of the inverted internal signal X13B is low, in other words, on condition that the level of the X address signal X13 is high, while when the pad F3 is bonded to the source voltage supplying lead VCC, the level of the internal control signal CS is rendered high selectively on condition that the level of the internal signal X13 is low, in other words, on condition that the level of the X address signal X13 is low. As a result, the internal control signal CS is formed in accordance with the conditions illustrated in FIG. 32 and can determine conditions for the selection of the paired sub chips which constitute the DRAM package.

In the DRAM sub chips of this embodiment, the internal control signal CS is formed selectively in accordance with the X address signal X13, as mentioned above, and this X address signal X13 is fed at a relatively quick timing in synchronism with the trailing edge of the row address strobe signal RASB. As indicated at ② in FIG. 4, the internal control signal CS can be utilized for causing the formation of the internal control signal XDG to be executed selectively by the RAS2 clock generator 210, causing the selection of word lines to be executed selectively by the X address decoder 203 and thereby activating each sub chip selectively. In the case where there is a further margin in the input timing of the X address signal X13, it is also possible to operate the X predecoder 204 selectively in accordance with the internal control signal CS, as indicated at ① in FIG. 4, and cut down another 10% or so the power consumption of the sub chip which is rendered inactive. On the other hand, in the case where there is no margin in the input timing of the X address signal X13 or when a chip selection signal is fed as part of the column address signal, i.e., Y address signal, the two sub chips which constitute the DRAM package must be activated simultaneously, and in this case either the storage data inputting operation of the write amplifier 218 or the outputting operation of the data output buffer 221 can merely be done selectively, as indicated at ③ in FIG. 4.

1.6.2. Other Chip Selecting Methods

In the 64M DRAM package of the above embodiment, the chip selection signal for selectively accessing a pair of DRAM sub chips is fed as the X address signal X12, and the number of address input terminals is substantially increased by one. A method for coping with this increase may be optimizing the number of external terminals of the DRAM package by setting the number of bits of the X and Y address signals so as to be equal to each other, including the chip selection signal. In this case, it is necessary that the DRAM package should be constituted by the kth power of sub chips having an address space comprising $i^{th}$ power of 2 of row addresses and the i-$k^{th}$ power of 2 of column addresses, or the i-$k^{th}$ power of 2 of row addresses and the ith power of 2 of column addresses. Thus, the sub chips are accessed selectively in accordance with the difference, k bit, between row and column address signals.

Figure 40:
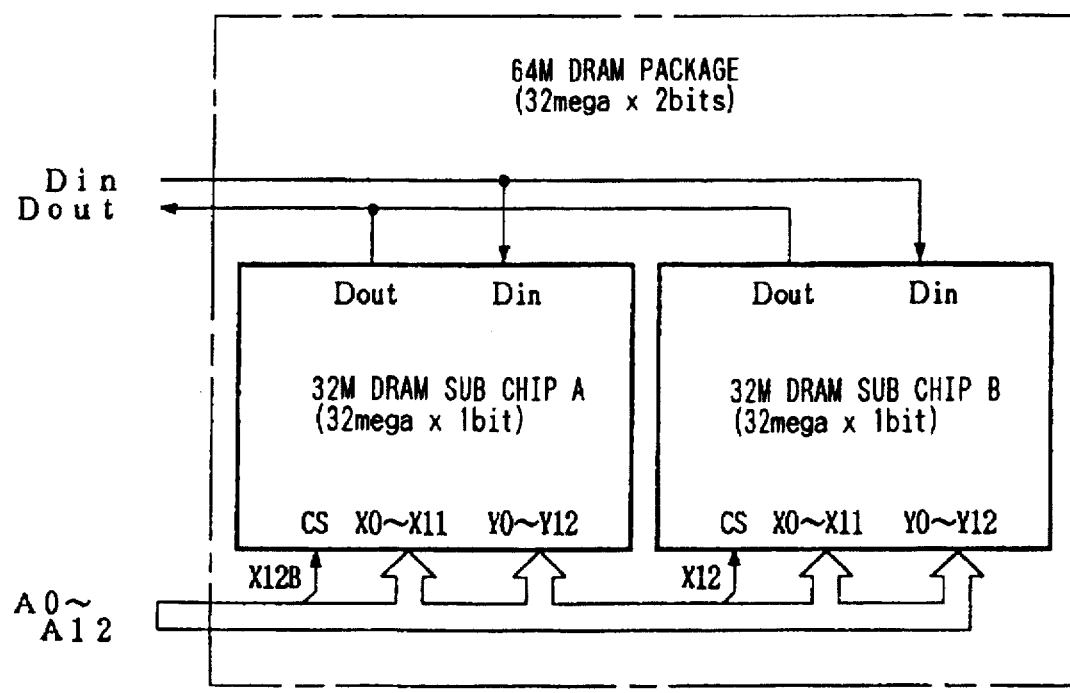
FIG. 40 is a block diagram showing a seventh example of a 64M DRAM package according to the invention.
Figure 41:
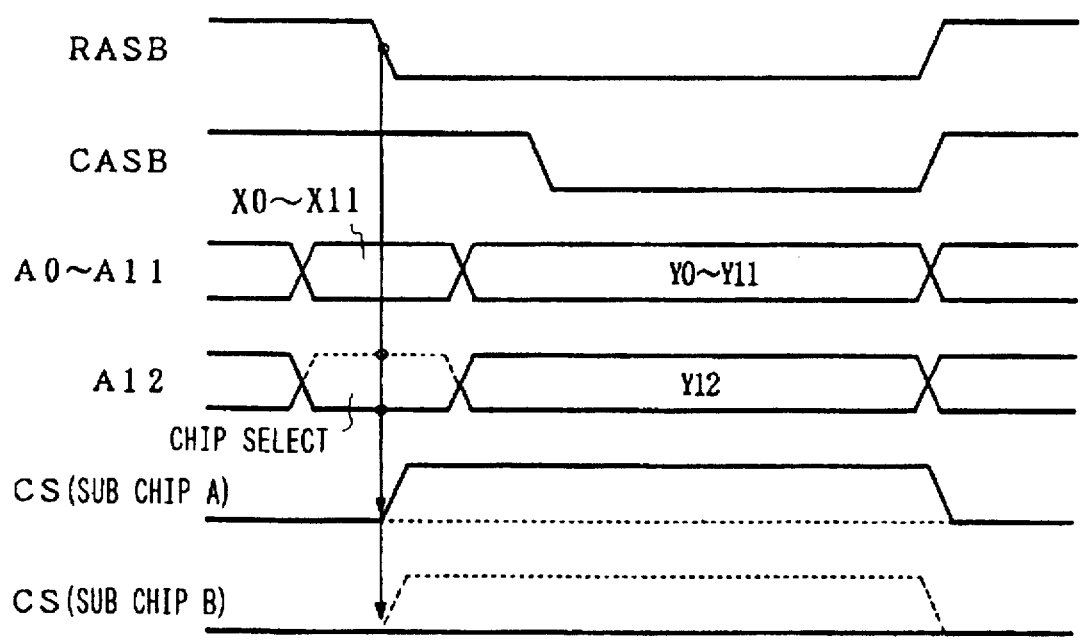
FIG. 41 is a timing chart in DRAM sub chips illustrated in FIG. 40.

In the embodiment illustrated in FIG. 40, the address space of the DRAM package comprises the first power of 2, namely, two 32M DRAM sub chips A and B which are selectively designated by X address signals X0–X11 of i-1 bits or 12 bits and Y address signals Y0–Y12 of i bits or 13 bits, and the chip selection signal is fed to the DRAM package as X address signal X12 of the most significant bit. At this time, as shown in FIG. 41, the X address signals X0–X11 and the X address signal X12 as the chip selection signal are fed in synchronism with the trailing edge of the row address strobe signal RASB, while the Y address signals Y0–Y12 are fed in synchronism with the trailing edge of the column address strobe signal CASB. Since the internal control signal CS can be formed at a relatively quick timing, it becomes possible to activate the sub chips A and B selectively in accordance with the internal control signal CS. Consequently, it is possible to attain the reduction of power consumption of the DRAM package while optimizing the number of external terminals of the package.

Figure 42:
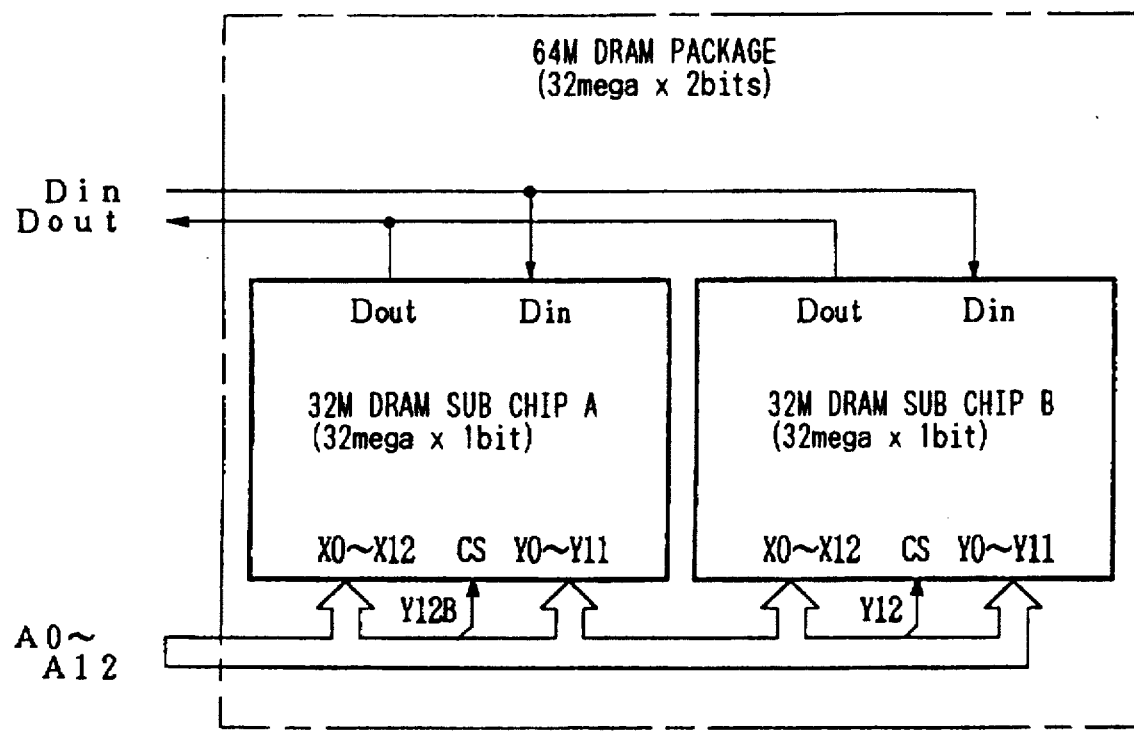
FIG. 42 is a block diagram showing an eighth example of a 64M DRAM package according to the invention.
Figure 43:
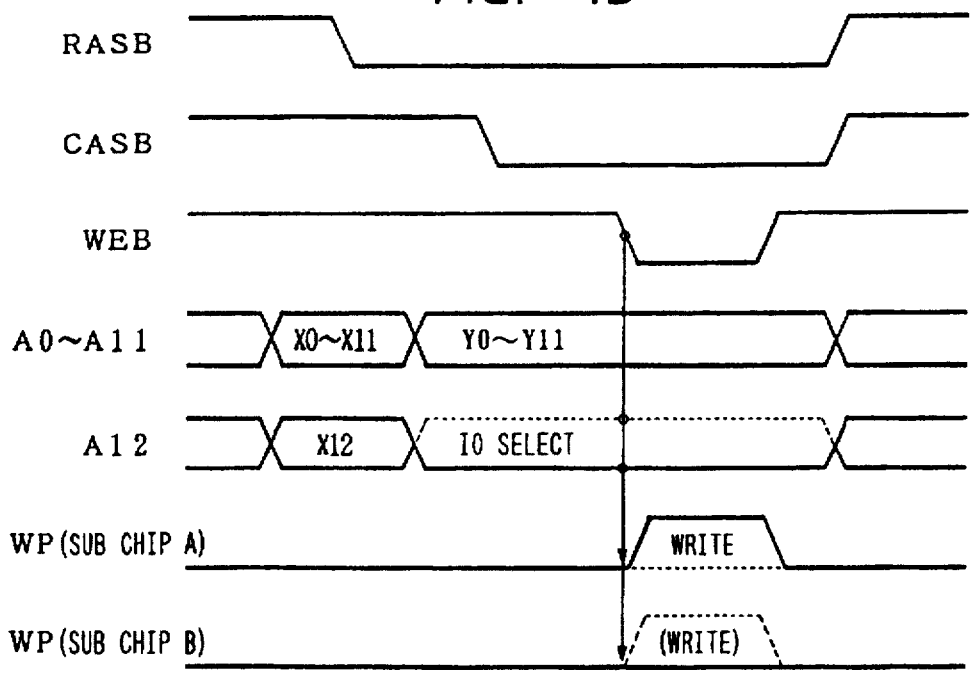
FIG. 43 is a timing chart in a write mode of DRAM sub chips illustrated in FIG. 42.
Figure 44:
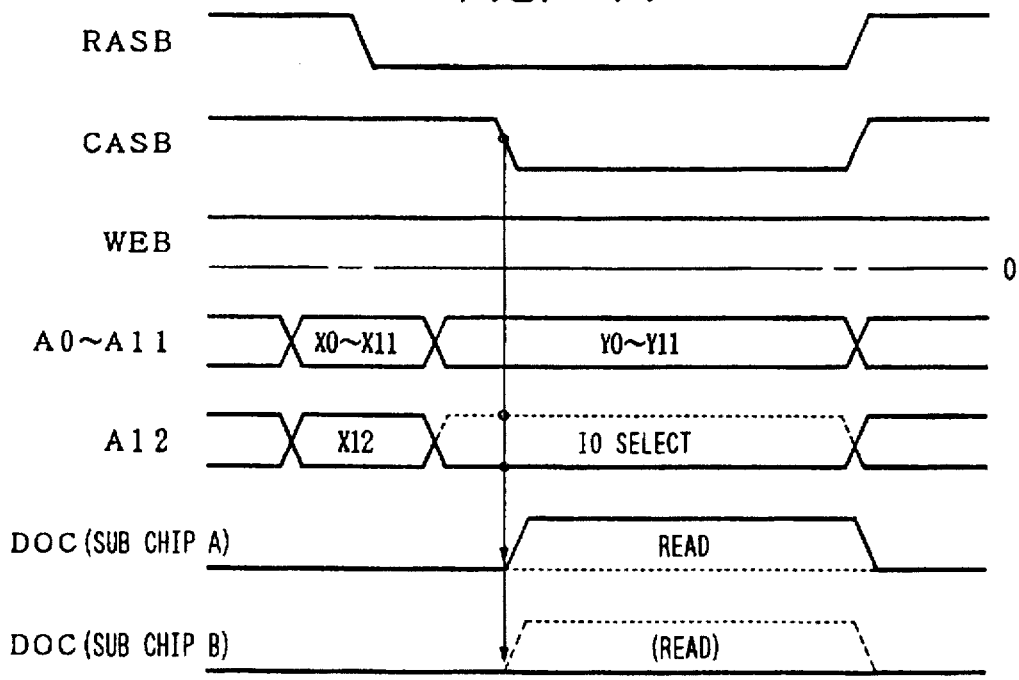
FIG. 44 is a timing chart in a read mode of the DRAM sub chips illustrated in FIG. 42.

On the other hand, in the embodiment illustrated in FIG. 42, the address space of the DRAM package comprises the first power of 2, or two, 32M DRAM sub chips designated selectively by X address signals X0–X12 of i bits or 13 bits and Y address signals Y0–Y11 of i-1 bits or 12 bits, and the chip selection signal is fed to the DRAM package as Y address signal Y12 of the most significant bit. At this time, as shown in FIGS. 43 and 44, the X address signals X0–X12 are fed in synchronism with the trailing edge of the row address strobe signal RASB, while the Y address signals Y0–Y11 and the Y address signal Y12 as the chip selection signal are fed in synchronism with the trailing edge of the column address strobe signal CASB. As a result, the internal control signal CS is formed selectively at a relatively slow timing and so it is impossible to activate the sub chips A and B selectively in accordance with the internal control signal CS. In this case, the storage data inputting and outputting operations can be executed selectively by forming the internal control signal WP fed to the write amplifier 218 or the internal control signal DOC fed to the data output buffer 221, selectively in accordance with the chip selection signals i.e., Y address signal Y12.

1.7. Evaluation

In the DRAM package described above there is adopted a so-called double chip package method wherein a basic configuration comprises a pair of DRAM sub chips disposed opposedly on both sides of a lead frame serving as wiring means. These sub chips are activated selectively in accordance with the X or Y address signal of the most significant bit which is fed as a chip selection signal, or execute the storage data inputting or outputting operation selectively. As a result, the following effects can be attained.

(1) There can be realized an effective chip mounting method capable of mounting plural sub chips of the same size without sacrificing the heat radiation characteristic of the package and the product yield.

(2) It is possible to attain a large capacity and low power consumption of the DRAM package while suppressing the increase of the package size.

(3) As compared with a package comprising a single DRAM chip and of about the same package size, it is possible to realize a DRAM package having a memory capacity plural times that of such single chip package, and thus the limit of memory capacity in DRAM chips, etc. can be expanded.

Figure 45:
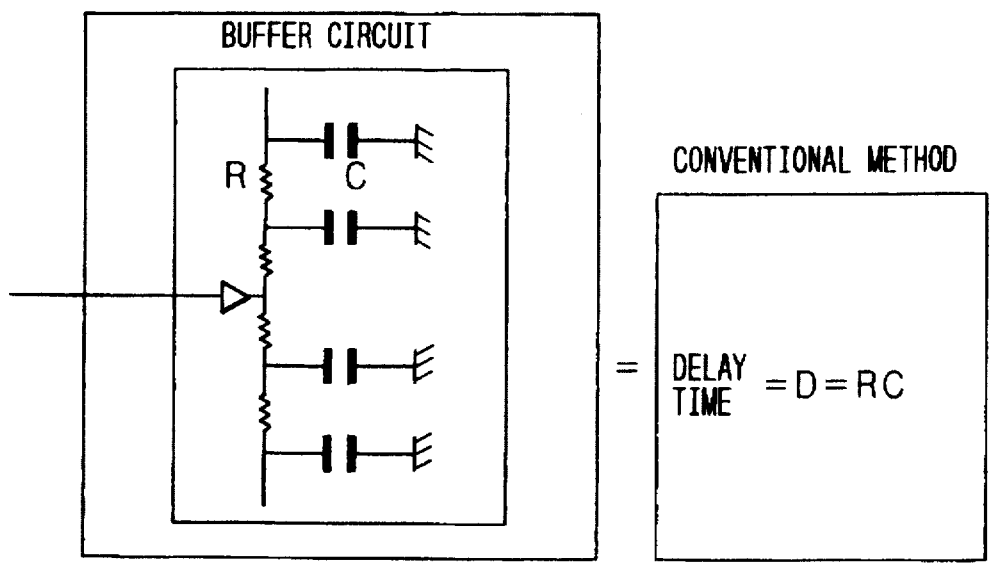
FIG. 45 is a partial signal system diagram in a conventional DRAM package.
Figure 46:
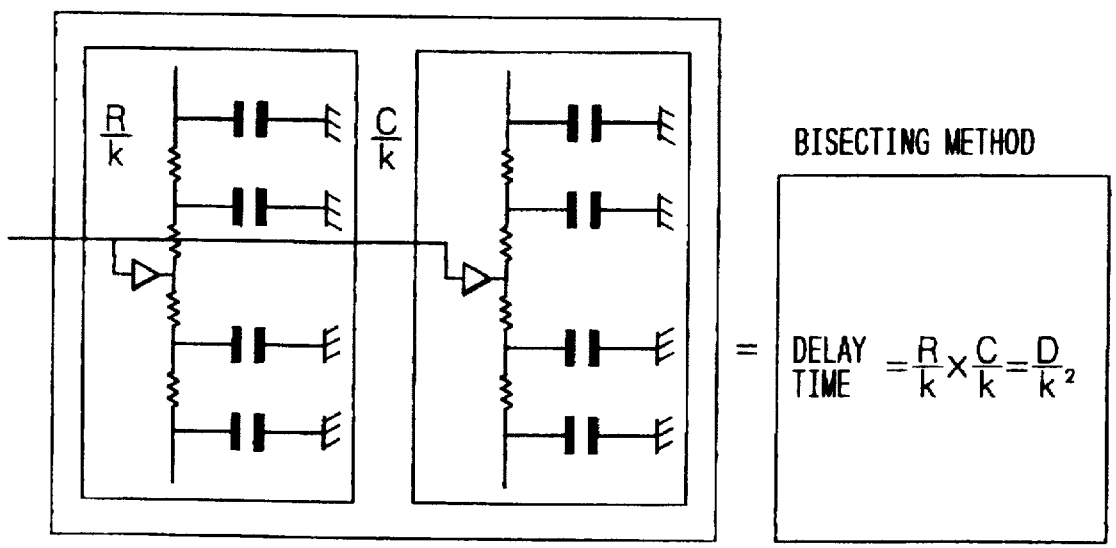
FIG. 46 is a partial signal system diagram in the DRAM package of FIG. 1.

(4) In the case where a package is constituted by a single semiconductor chip, a signal is transmitted with a relatively large delay time which is determined by resistor R and parasitic capacity C, as shown in FIG. 45, while in the case where a package is constituted by k number of sub chips and these sub chips are activated selectively, as shown in FIG. 46, the resistor R and parasitic capacity C can substantially be cut down to 1/k, so the delay time as the package can be substantially reduced to one per the second power of k and the operating speed thereof can be made high.

(5) Since the bonding pads of the paired sub chips are arranged centrally in a straight line form along the X or Y axis of the semiconductor substrate surface, a planar symmetry thereof can be realized easily and it is possible to utilize the bonding according to the conventional LOC technique.

(6) Since the paired sub chips are bonded to the corresponding lead frames and thereafter these sub chips and lead frames are laminated together, a double chip package system can be realized easily by using the conventional wire bonding technique.

(7) In the case of laminating the lead frames together, one lead frame is cut and bonded to the other lead frame and the cut and bonded portions are protected in the interior of a sealing resin, so it is possible to prevent the entry of water, etc. and thereby enhancing the durability of the package.

(8) Since plural pairs of sub chips each laminated through the lead frames are stacked in the direction perpendicular to the surface thereof and the corresponding leads of the lead frames are connected in common, it is possible to laminate plural pairs of sub chips easily and promote the attainment of a large package capacity.

(9) Since the address space of each memory package is constituted by $k^{th}$ power of 2 of memory sub chips designated selectively in accordance with row address signals of i-k bits and column address signals of i bits, or row address signals of i bits and column address signals of i-k bits, and these sub chips are activated selectively in accordance with the differences k bit, between the row and column address signals, it is possible to optimize the number of external terminals while promoting the reduction of power consumption of each memory package comprising plural sub chips.

(10) Since the insulating film for bonding a sub chip and a corresponding lead frame with each other is cut in the shape of a comb along the leads of the lead frame, it is possible to reduce the substantial bonding area and prevent the separation of the insulating film caused by changes of temperature. As a result, it is possible to enhance the packaging efficiency of a memory system or the like including a DRAM package as a basic configuration and thereby promote the reduction of cost thereof.

2. 64M DRAM Package using Partial Chips

Embodiments have been described above with respect to 128M DRAM packages wherein a large capacity as package and low power consumption are promoted by the combination of so-called full chips having address spaces all capable of functioning normally. The double chip package system according to the present invention can also be used as means for the relief partial chips by combining so-called partial chips each having an address space capable of partially functioning normally to constitute a DRAM package.

2.2. 64M DRAM Package Using Two 64M DRAM Partial Chips Accessed Selectively

Figure 47:
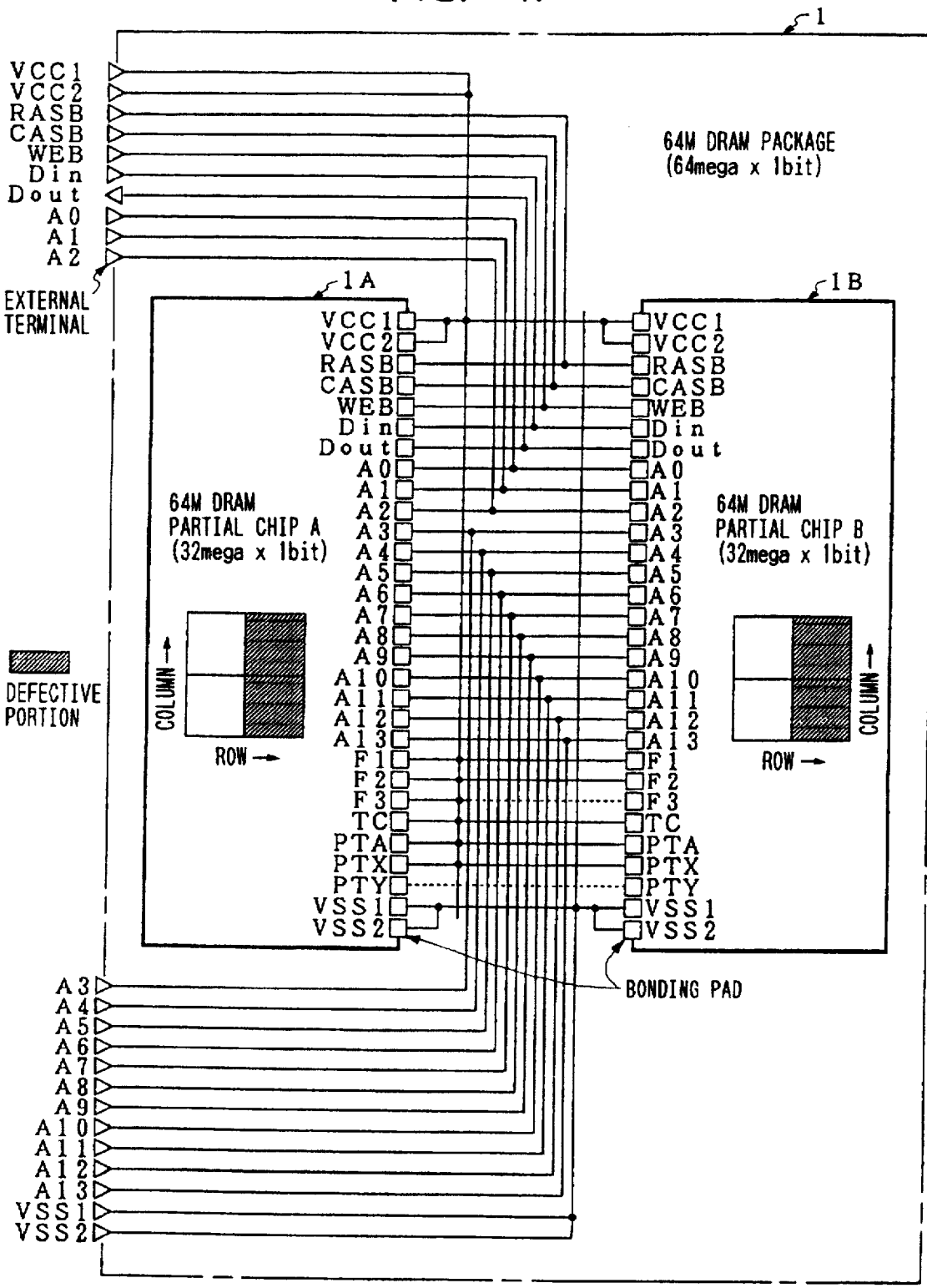
FIG. 47 is a block diagram showing a first example of a 64M DRAM package consisting of two DRAM partial chips according to the invention.
Figure 48:
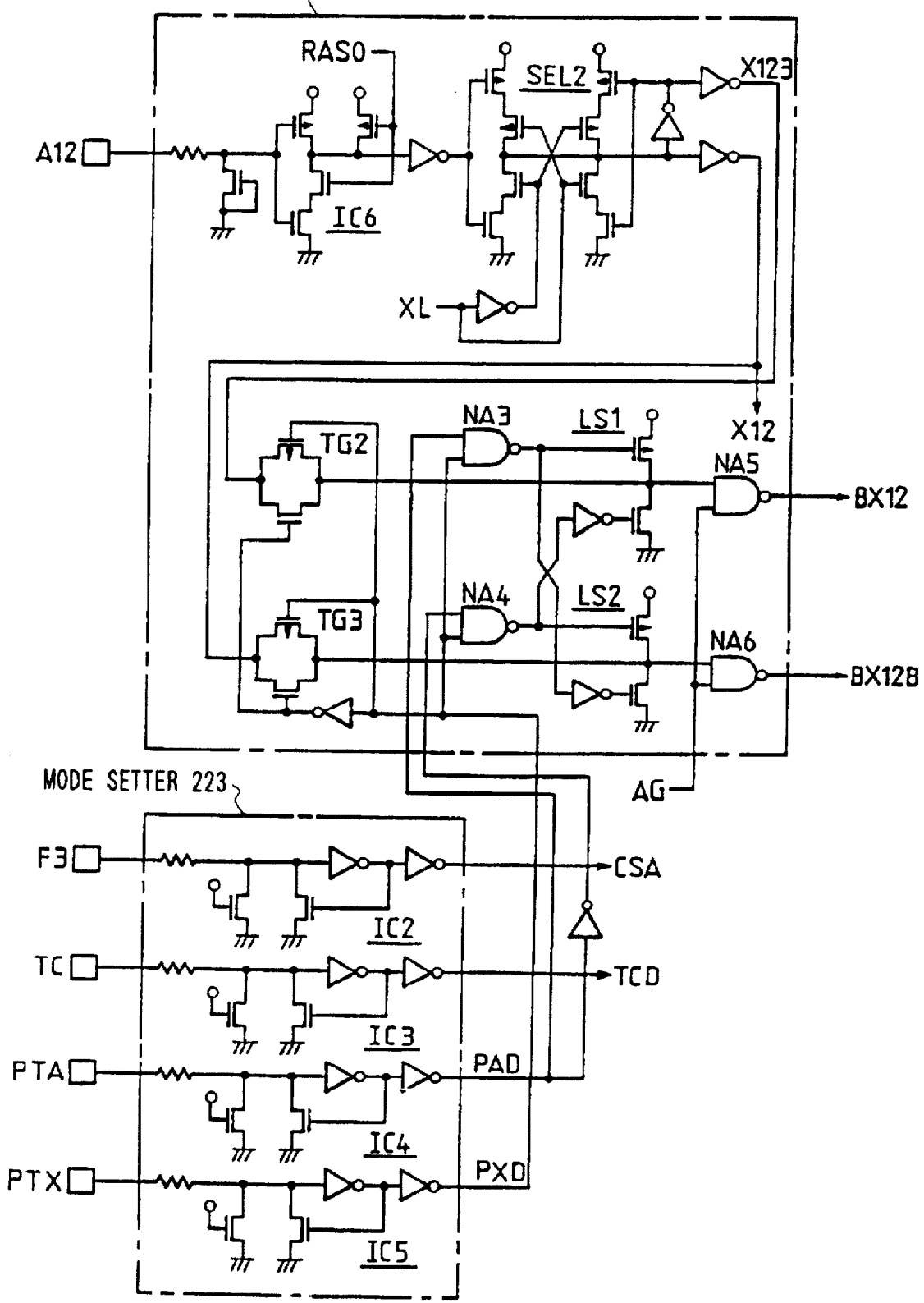
FIG. 48 is a partial circuit diagram of an X address buffer included in the DRAM package of FIG. 47.
Figure 49:
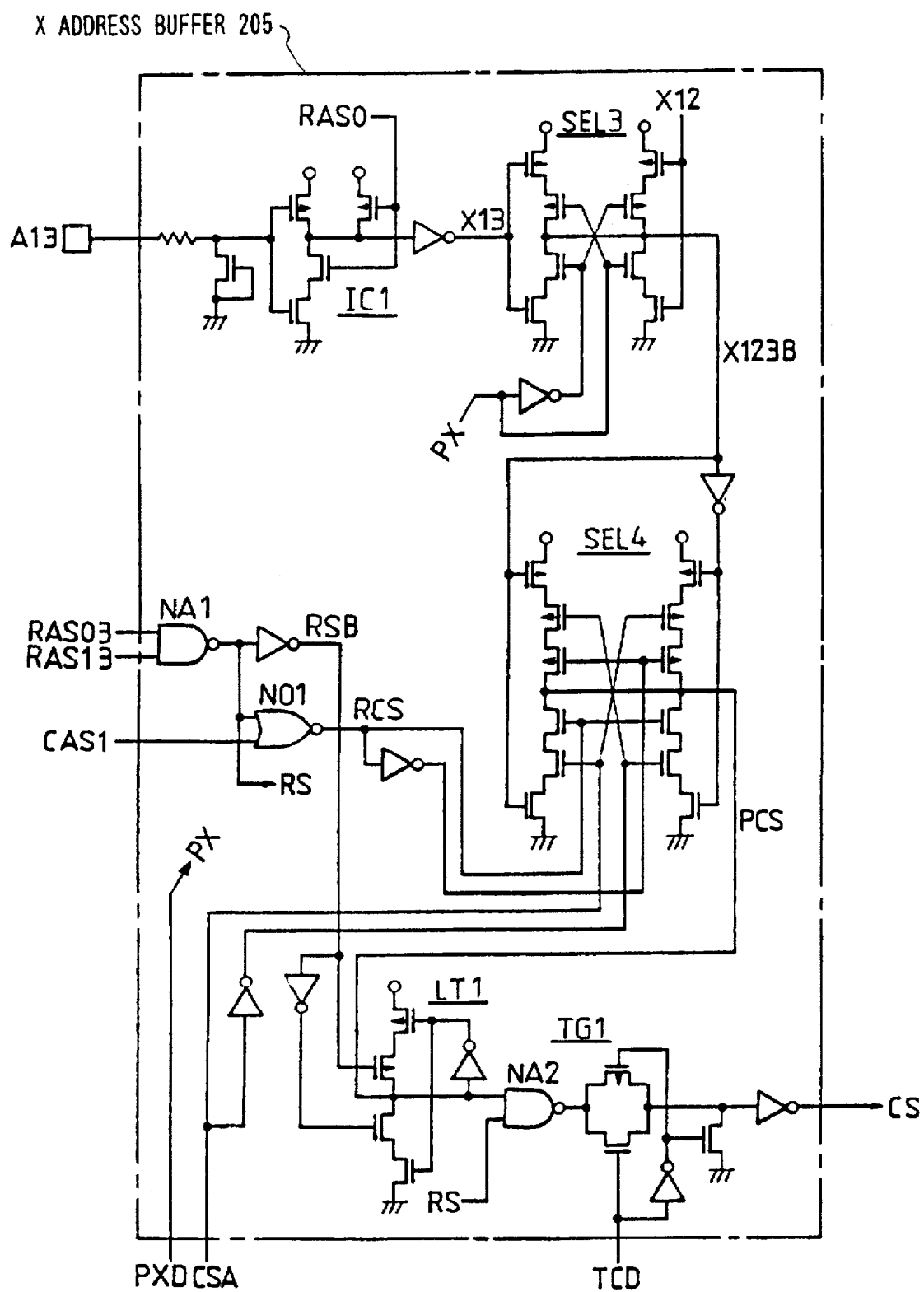
FIG. 49 is another partial circuit diagram of the X address buffer included in the DRAM package of FIG. 47.

FIG. 47 is a block diagram showing a first example of a 64M DRAM package according to the present invention. FIGS. 48 and 49 are partial circuit diagrams showing an X address buffer 205 and a mode setter 223 which are included in the DRAM package of FIG. 47. FIG. 53 is a list of connections, showing bonding options of 64M DRAM partial chips which constitute the DRAM package of FIG. 47. With reference to these figures, the following description is now provided about an outline of the DRAM package of this embodiment and a concrete chip selecting method. In these figures, the 64M DRAM partial chips which constitute the DRAM package basically follow the 64M DRAM sub chips which constitute the foregoing 128M DRAM package. Further, as in the case of the 128M DRAM package, a pair of partial chips constituting the DRAM package are mounted according to the double chip package method. In the block diagrams of these figures, moreover, the portions which are not normal are indicated by oblique lines.

2.1.1. Block Configuration

As shown in FIG. 47, the 64M DRAM package of this embodiment is constituted basically by two 64M DRAM partial chips A and B wherein one half of each row address space can function normally. The portion of each partial chip capable of functioning normally is not specially limited, but it is a portion designated by a low address side, or X address signal X12, in the row address space when the level of the signal is made low. Address input pads A0 to A13 of the partial chips A and B are connected in common to corresponding address input terminals A0 to A13 of the DRAM package, and data input pads Din and data output pads Dout thereof are connected in common to a data input terminal Din and a data output terminal Dout of the DRAM package.

In addition of the mode setting pads of the 64M DRAM sub chips in the previous embodiment, the partial chips A and B are each provided with three mode setting pads PTA, PTX and PTY. As shown in FIG. 53, the pads PTX and PTY are normally held in an unconnected state NC and are selectively bonded to a source voltage supplying lead VCC when the row or column address space of each partial chip partially functions normally. On the other hand, the pad PTA is bonded to the source voltage supplying lead VCC in a normal condition of the portion which is designated by a low address side, or X address signal X12 or Y address signal Y12, in the row or column address space when the level of the signal is made low, and the pad PTA is brought into the non-connected state NC in a normal condition of the portion which is designated by a high address side, or X address signal X12 or Y address signal Y12, when the level of the signal is rendered high. As in the foregoing 128M DRAM package, bonding pads TC and F3 are used for selectively activating the partial chips A and B or for setting chip selecting conditions selectively.

In FIG. 47, the pads PTA and PTX of each of the partial chips A and B are both bonded to the source voltage supplying lead VCC, while the pad PTY is brought into the non-connected state NC. In each partial chip, therefore, as will be described later, the level of an internal address signal BX12 is rendered low forcibly and the row address space on the low address side capable of functioning normally is designated steadily. On the other hand, in the partial chips A and B, the pads TC are both bonded to the source voltage supplying lead VCC, and the pad F3 on the partial chip A side is connected to the lead VCC, while the pad F3 on the partial chip B side is brought into the non-connected state NC, whereby the level of an internal control signal CS in the partial chip A is rendered high on condition that the level of the X address signal X12 is low, and the level of an internal control signal CS in the partial chip B is rendered high on condition that the level of the X address signal X12 is high.

Thus, the partial chips A and B function substantially in the same manner as the 64M DRAM sub chips A and B which constitute the foregoing 128M DRAM package shown in FIG. 1 except that their memory capacity is halved to 32 megabits. As a result, the DRAM package of FIG. 47 function as a so-called 64M DRAM package. In this case, as is apparent from FIG. 47, the DRAM package has an interface which is just the same as that of a 64M DRAM package constituted by a single 64M DRAM chip wherein all the address spaces can function normally. The refresh cycle is also 8K cycle/64 ms, and it is also possible to conduct a parallel test. This indicates that this DRAM package comprising two partial chips can be substituted for the 64M DRAM package comprising one full chip and that the double chip packaging method is effective in substantially improving the product yield of 64M DRAM chips.

2.1.2. Selectively Activating Method and Configuration of X Address Buffer

In FIG. 48, the pads F3, TC, PTA and PTX of each partial chip are connected to input terminals of corresponding input circuits IC2–IC5 in the mode setter 223, and their output signals, or internal control signals CSA, TCD, PAD and PXD, are rendered high or low in level selectively. More specifically, the internal control signals CSA, TCD, PAD and PXD are made low in level when the corresponding pads F3, TC, PTA and PTX are brought into the non-connected state NC, and they are made high in level when the corresponding pads are bonded to the source voltage supplying lead VCC. The internal control signals CSA, TCD, PAD and PXD are fed to the X address buffer 205. On the other hand, the address input pad A12 is connected to an input terminal of an input circuit IC6 of the X address buffer 205, as shown in FIG. 48. The input circuit IC6 is brought into a transfer state selectively when the level of an internal control signal RAS0 is made high, and it transmits the X address signal X12 which is fed time-sharingwise through the address input pad A12, to one input terminal of a selector SEL2. The other input terminal of the selector SEL2 is connected to an output terminal thereof through an inverter to form a latch circuit. Further, an internal control signal XL is fed to a control terminal of the selector SEL2. As a result, the selector SEL2 is brought into a transfer state on condition that the level of the internal control signal XL is made low, and it is brought into a latch form when the level of the internal control signal XL is rendered high. An inverted output signal from this latch circuit is inverted by an inverter into an internal signal X12, while a non-inverted output signal from the latch circuit is inverted by an inverter into an inverted internal signal X12B.

The inverted internal signal X12B outputted from the selector SEL2 is fed to one input terminal of a NAND gate NA5 through a transfer gate TG2, while the internal signal X12 is fed to the other input terminal of a selector SEL3 which will be described later and is also fed to one input terminal of a NAND gate NA6 through a transfer gate TG3. To control terminals of the trasnfer gates TG2 and TG3 is fed the internal control signal PXD. Further, an internal control signal AG is fed in common to the other input terminals of the NAND gates NA5 and NA6. As a result, the internal signal X12 and the inverted internal signal X12B are transmitted to one input terminals of the corresponding NAND gates NA5 and NA6 on condition that the level of the internal control signal PXD is made low, and further it becomes the inverted internal control signal BX12B or internal address signal BX12 on condition that the level of the internal control signal AG is rendered high.

Between one input terminals of the NAND gates NA5, NA6 and the source voltage and earth potential of the circuit there are provided level setting circuits LS1 and LS2 each comprising a pair of P and N channel MOSFETs which receive in a predetermined combination an output signal or an inverted signal thereof from a NAND gate NA3 or NA4. To one input terminal of the NAND gate NA3 is fed the internal control signal PAD, while an inverted signal thereof is fed to one input terminal of the NAND gate NA4. To the other input terminals of the NAND gates NA3 and NA4 is fed the internal control signal PXD in common. As a result, when the level of the internal control signal PXD is rendered low, one input terminals of the NAND gates NA5 and NA6 assume a level conforming to the level of the inverted internal signal X12 or the internal signal X12 which is fed through the transfer gate TG2 or TG3, while when the level of the internal control signal PXD is rendered high, the said one input terminals are rendered high or low in level selectively and forcibly in accordance with the internal control signal PAD.

That is, when the level of the internal control signal PAD is made low, the level of the output signal from the NAND gate NA4 becomes low and the N channel MOSFET of the level setting circuit LS1 and the P channel MOSFET of the level setting circuit LS2 are turned ON simultaneously. Consequently, the level of one input terminal of the NAND gate NA5 is made low, while the level of one input terminal of the NAND gate NA6 is made high. As a result, the level of the inverted internal address signal BX12B is made low, while the level of the internal address signal BX12 is kept high. On the other hand, when the level of the internal control signal PAD is rendered high, the level of the output signal from the NAND gate NA3 becomes low, and the P channel MOSFET of the level setting circuit LS1 and the N channel MOSFET of the level setting circuit LS2 are turned ON simultaneously. Therefore, the level of one input terminal of the NAND gate NA5 is rendered high, while the level of one input terminal of the NAND gate NA6 is rendered low. As a result, the level of the internal address signal BX12 is made low forcibly, while the level of the inverted internal address signal BX12B is kept high. That is, in each partial chip, as shown in FIG. 53, the level of the internal address signal BX12 is rendered high forcibly on condition that the pad PTX is bonded to the source voltage supplying lead VCC and the pad PTA is brought into the non-connected state NC, while it is rendered low forcibly on condition that the pads PTX and PTA are both bonded to the source voltage supplying lead VCC. When the pad PTX is brought into the non-connected state NC, the level of the internal address signal BX12 is rendered high or low in accordance with the X address signal X12.

Next, the address input pad A13 is connected to an input circuit IC1 of the X address buffer 205, as shown in FIG. 49. The input circuit IC1 is brought into a transfer state selectively on condition that the level of the internal control signal RAS0 is rendered high, and it transfers an X address signal X13 which is fed time-sharingwise through the address input pad A13, to one input terminal of the selector SEL3 as an internal signal X13. To the other input terminal of the selector SEL3 is fed the internal signal X12, and to a control terminal of the selector SEL3 is fed an internal signal PX, i.e., the internal control signal PXD. Consequently, when the level of the internal control signal PXD is made low, the selector SEL3 transfers the internal signal X13 as an inverted internal signal X123B to a selector SEL4, while when the level of the internal control signal PXD is rendered high, the selector SEL3 transfers the internal signal X12 as an inverted internal signal X123B to the selector SEL4.

The inverted internal signal X123B is fed to one input terminal of the selector SEL4 and at the same time, after inversion by an inverter, it is fed to the other input terminal of the selector SEL4. To a first control terminal of the selector SET4 is fed the internal control signal CSA from the mode setter 223, while to a second control terminal thereof is fed an output signal or an internal signal RCS from a NOR gate NO1. Thus, the selector SEL4 substantially fulfills the same function as the selector SEL1 shown in FIG. 39 and transfers the inverted internal signal X123B or an inverted signal thereof to a latch circuit LT1 selectively as an internal signal PCS in accordance with the internal control signals CSA and RCS. The NAND gates NA1, NA2, NOR gate NO1, latch circuit LT1 and transfer gate TG1 shown in FIG. 49 correspond directly to the NAND gates NA1, NA2, NOR gate NO1, latch circuit LT1 and transfer gate TG1, respectively, illustrated in FIG. 39 and fulfill the same functions.

In the same manner as in FIG. 39, when the level of the internal control signal PXD is rendered low, the level of the internal control signal CS is made high or low selectively in accordance with the X address signal X13, while when the level of the internal control signal PXD is rendered high, the level of the internal control signal CS is made high or low selectively in accordance with the X address signal X12. That is, when the internal control signals TCD and CSA are rendered high in level, the level of the internal control signal CS is brought into the same logical level as that of the X address signal X12 and is rendered high selectively on condition that the level of the X address signal 12 is high. On the other hand, when the level of the internal control signal TCD and that of the internal control signal CSA are made high and low, respectively, the level of the internal control signal CS is brought into an inverted logical level of the X address signal X12 and is rendered high selectively on condition that the level of the X address signal X12 is low. Thus, as shown in FIG. 53, when the pad TC is bonded to the source voltage supplying lead VCC and the pad PTX is in the non-connected state NC, each partial chip is brought into a selected state selectively in accordance with the X address signal X13, while when the pads TC and PTX are both bonded to the source voltage supplying lead VCC, each partial chip is brought into the selected state according to the state of bonding of the pad PTA and upon receipt of the X address signal X12 which is either high or low in level.

Figure 50:
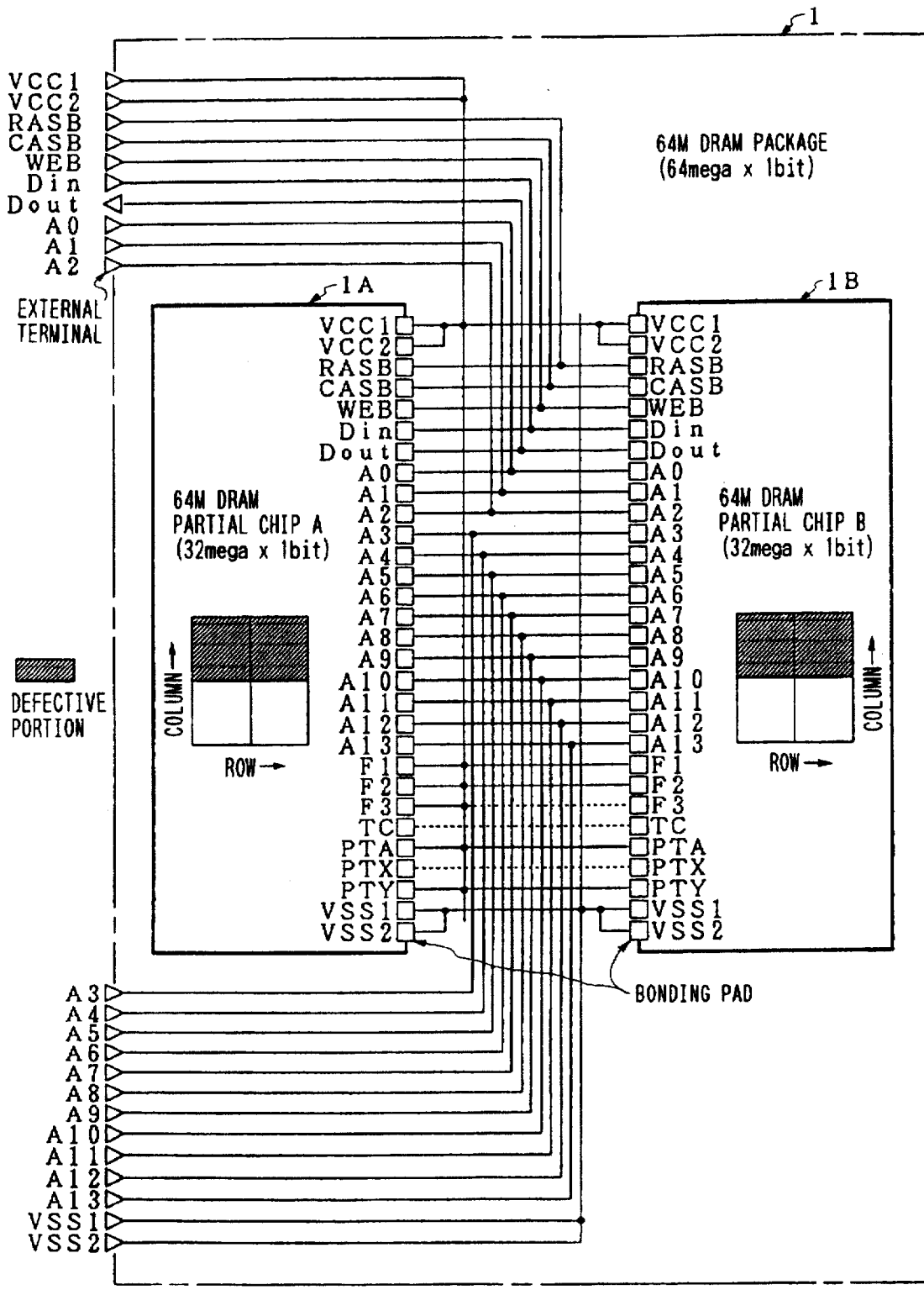
FIG. 50 is a block diagram showing a second example of a 64M DRAM package consisting of two DRAM partial chips according to the invention.
Figure 51:
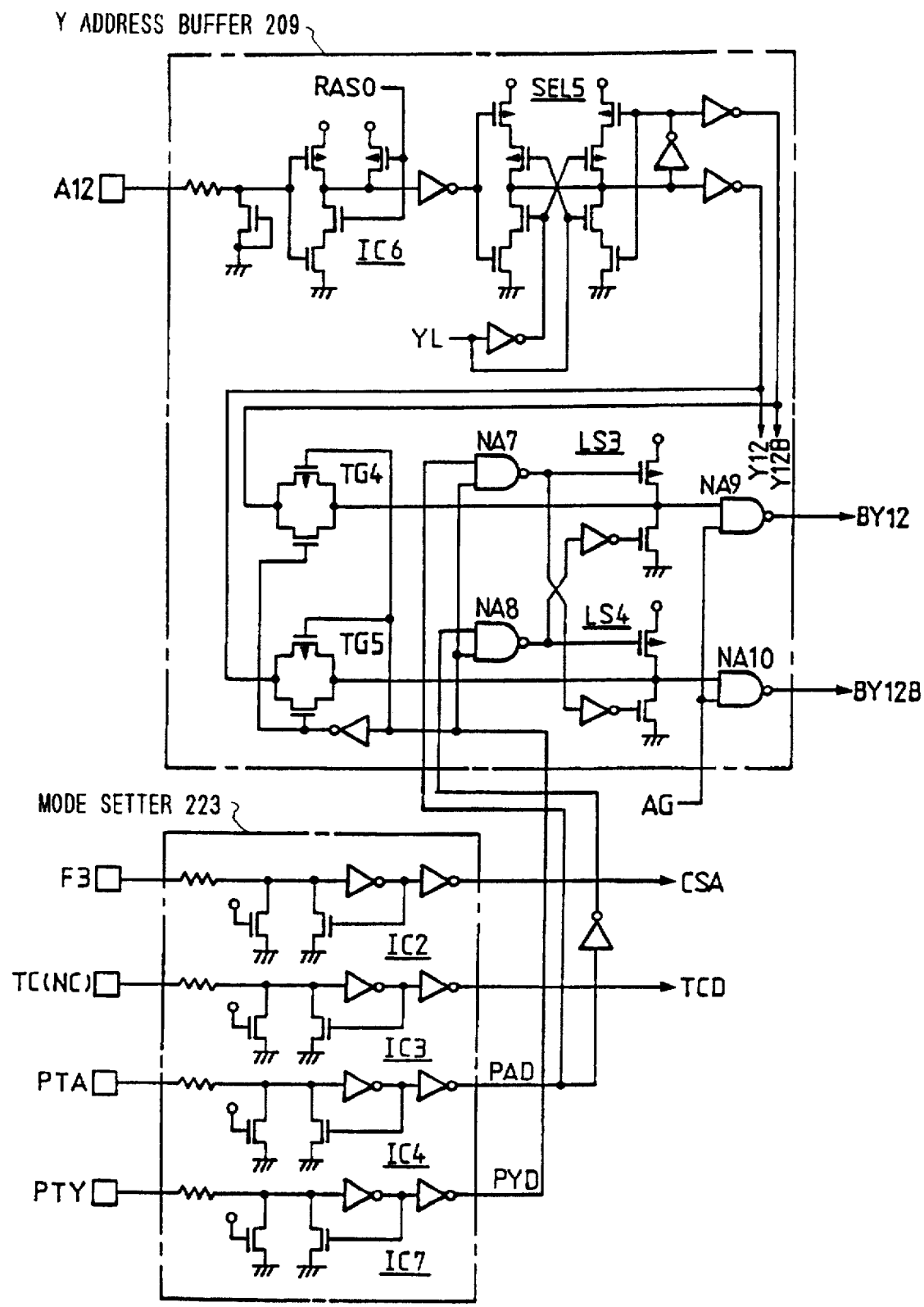
FIG. 51 is a partial circuit diagram of a Y address buffer included in the DRAM package of FIG. 50.
Figure 52:
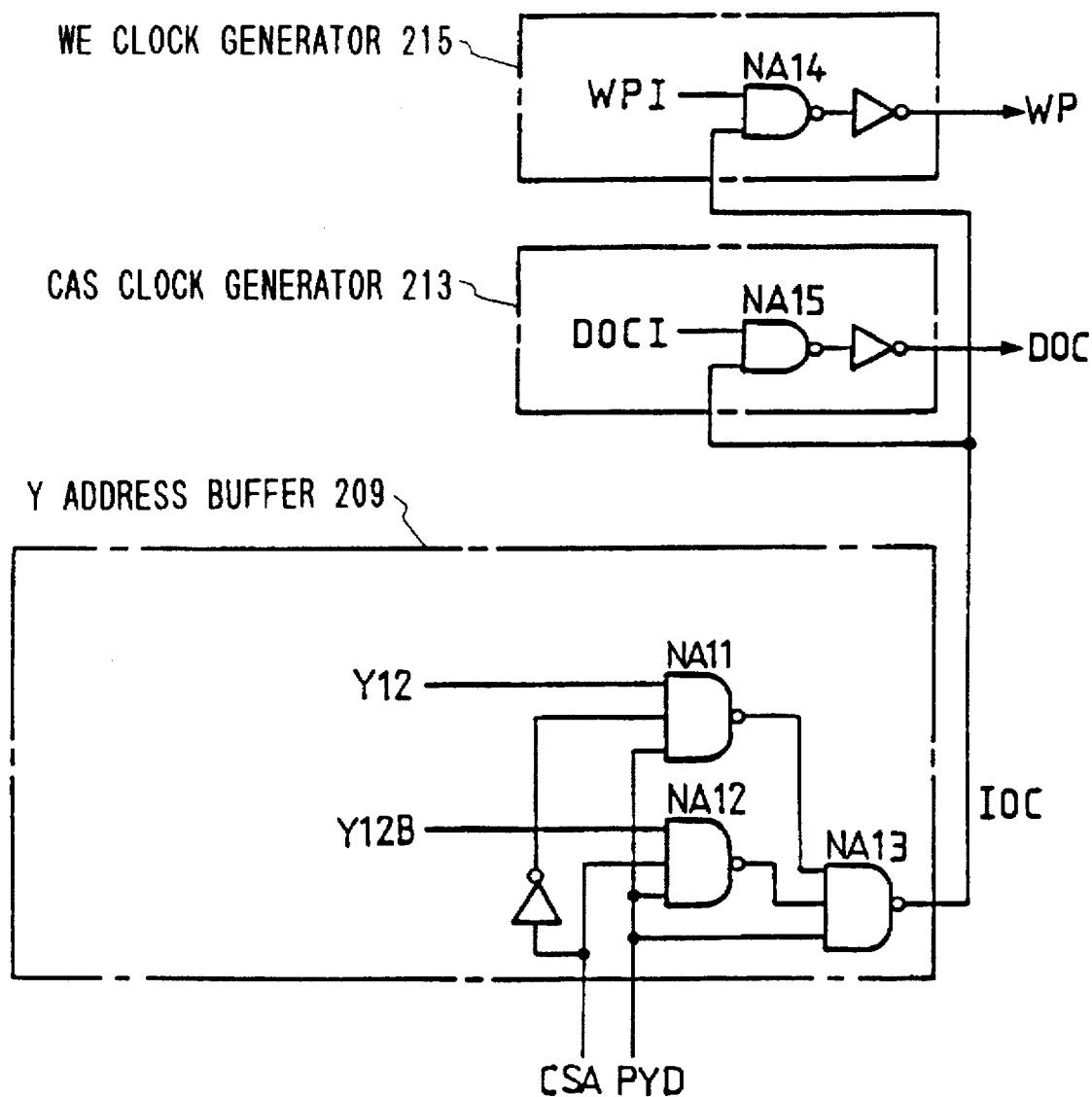
FIG. 52 is another partial circuit diagram of the Y address buffer included in the DRAM package of FIG. 50.

2.2. 64M DRAM Package Using Two 64M DRAM Partial Chips Accessed Simultaneously FIG. 50 is a block diagram showing a second example of a 64M DRAM package according to the present invention. FIGS. 51 and 52 are partial circuit diagrams showing a Y address buffer 209 and a mode setter 223 which are included in the DRAM package of FIG. 50. FIG. 53 is a list of connections, showing bonding options of 64M DRAM partial chips which constitute the DRAM package of FIG. 50. With reference to these figures, the following description is now provided about an outline of the DRAM package of this embodiment and a concrete method for selective IO execution.

2.2.1. Block Configuration

As shown in FIG. 50, the 64M DRAM package of this embodiment is constituted basically by two 64M DRAM partial chips A and B wherein one half of each column address space can function normally. The portion of each partial chip capable of functioning normally is not specially limited, but it is a portion designated by a low address side, or Y address signal Y12, in the column address space when the level of the signal is made low. Address input pads A0 to A13 of the partial chips A and B are connected in common to corresponding address input terminals A0 to A13 of the DRAM package, and data input pads Din and data output pads Dout thereof are connected in common to a data input terminal Din and a data output terminal Dout of the DRAM package.

In FIG. 50, pads PTA and PTY of each of the partial chips A and B are both bonded to a source voltage supplying lead VCC, while a pad PTX is brought into a non-connected state NC. In each partial chip, therefore, as will be described later, the level of an internal address signal BY12 is rendered low forcibly and the column address space on a low address side capable of functioning normally is designated steadily. On the other hand, in the partial chips A and B, pads TC are brought into the non-connected state NC, and a pad F3 on the partial chip A side is bonded to the source voltage supplying lead VCC, while a pad F3 on the partial chip B side is brought into the non-connected state NC. As a result, in the partial chip A, as will be described later, the level of an internal control signal WP for selectively executing a storage data outputting operation of a write amplifier 218 or the level of an internal control signal DOC for selectively executing a storage data outputting operation of a data output buffer 221 is rendered high on condition that the level of the Y address signal Y12 is low, while in the partial chip B, it is rendered high on condition that the level of the Y address signal Y12 is high.

Thus, the partial chips A and B function substantially in the same manner as the 64M DRAM sub chips A and B which constitute the foregoing 128M DRAM package shown in FIG. 1 except that their memory capacity is halved to 32 megabits. As a result, the DRAM package of FIG. 50 function as a so-called 64M DRAM package. In this case, as is apparent from FIG. 50, the DRAM package has an interface which is just the same as that of a 64M DRAM package constituted by a single 64M DRAM chip wherein all the address spaces can function normally. The refresh cycle is also 8K cycle/64 ms. This indicates that this DRAM package can be substituted for the 64M DRAM package comprising one full chip and that the substantial product yield of the 64M DRAM chips can be improved. In this embodiment, a parallel test for the storage data in each sub chip is executed in the unit of four bits, so the time required for parallel test in the entire DRAM package is twice that required in the 64M DRAM package comprising one full chip.

2.2.2. Method for Selective IO Execution and Configuration of V Address Buffer In FIG. 51, the pads F3, TC, PTA and PTY of each partial chip are connected to input terminals of corresponding input circuits IC2–IC4 and IC7 in the mode setter 223, and their output signals, or internal control signals CSA, TCD, PAD and PYD, are rendered high or low in level selectively. More specifically, the internal control signals CSA, TCD, PAD and PYD are made low in level when the corresponding pads are F3, TC, PTA and PTY are brought into the non-connected state NC, and they are made high in level when the corresponding pads are bonded to the source voltage supplying lead VCC. The internal control signals CSA, TCD, PAD and PYD are fed to the Y address buffer 209.

On the other hand, the address input pad A12 is connected to an input terminal of an input circuit IC6 of the Y address buffer 209. The input circuit IC6 is brought into a transfer state selectively when the level of an internal control signal RAS0 is rendered high, and it transmits the Y address signal Y12 which is fed time-sharingwise through the address input pad A12, to one input terminal of a selector SEL5. The other input terminal of the SEL5 is connected to an output terminal thereof through an inverter to form a latch circuit. Further, an internal control signal YL is fed to a control terminal of the selector SEL5. As a results the selector SEL5 is brought into a transfer state on condition that the level of the internal control signal YL is rendered low, and it is brought into a latch Form when the level of the internal control signal YL is rendered high. An inverted output signal from the this latch circuit is inverted by an inverter into an internal signal Y12, while a non-inverted signal from the latch circuit is inverted by an inverter into an inverted internal signal Y12B.

The inverted internal signal Y12B outputted from the selector SRL5 is fed to a first input terminal of a NAND gate NA12 which will be described later and is also fed to one input terminal of a NAND gate NA9 through a transfer gate TG4. Likewise, the internal signal Y12 is fed to a first input terminal of a NAND gate NA11 which will be described later and is also fed to one input terminal of a NAND gate NA10 through a transfer gate TG5. To control terminals of the transfer gates TG4 and TG5 is fed the internal control signal PYD. Further, an internal control signal AG is fed in common to the other input terminals of the NAND gates NA9 and HA10. As a result, the internal signal Y12 and the inverted internal signal Y12B are transmitted to one input terminals of the corresponding NAND gates NA9 and NA10 on condition that the level of the internal control signal PYD is rendered lows and further it becomes an inverted internal address signal BY12B or internal address signal BY12 on condition that the level of the internal control signal AG is rendered high.

Between one input terminals of the NAND gates NA9, NA10 and the source voltage and earth potential of the circuit there are provided level setting circuits LS3 and LS4 each comprising a pair of P and N channel MOSFETs which receive in a predetermined combination an output signal or an inverted signal thereof from a NAND gate NA7 or NA8. To one input terminal of the NAND gate NA7 is fed the internal control signal PAD, while an inverted signal thereof is fed to one input terminal of the NAND gate NA8. To the other input terminals of the NAND gates NA7 and NA8 is fed the internal control signal PYD in common. As a result, when the level of the internal control signal PYD is rendered low, one input terminals of the NAND gates NA9 and NA10 assume a level conforming to the level of the inverted internal signal Y12B or the internal signal Y12, while when the level of the internal control signal PYD is made high, the said one input terminals are rendered high or low in level selectively and forcibly in accordance with the internal control signal PAD.

That is, when the level of the internal control signal PAD is made low, the level of the NAND gate NA8 becomes low and the N channel MOSFET of the level setting circuit LS3 and the P channel MOSFET of the level setting circuit LS4 are turned ON simultaneously. Consequently, the level of one input terminal of the NAND gate NA9 is rendered low, while the level of one input terminal of the NAND gate NA10 is made high. As a result, the level of the inverted internal address signal BY12B is rendered low forcibly, while the level of the internal address signal BY12 is kept high. On the other hand, when the level of the internal control signal PAD is made high, the level of the output signal from the NAND gate NA7 becomes low, and the P channel MOSFET of the level setting circuit LS3 and the N channel MOSFET of the level setting circuit LS4 are turned ON simultaneously. Therefore, the level of one input terminal of the NAND gate NA9 is rendered high, while the level of one input terminal of the NAND gate NA10 is rendered low. As a result, the level of the internal address signal BY12 is made low forcibly, while the level of the invert internal address signal BY12B is kept high. That is, in each partial chip, as shown in FIG. 53, the level of the internal address signal BY12 is rendered high forcibly on condition that the pad PTY is bonded to the source voltage supplying lead VCC and the pad PTA is brought into the non-connected state NC, while it is rendered low forcibly on condition that the pads PTY and PTA are both bonded to the source voltage supplying lead VCC. When the pad PTY is brought into the non-connected state NC, the level of the internal address signal BY12 is rendered high or low in accordance with the Y address signal Y12.

As shown in FIG. 52, the Y address buffer 209 further includes three 3-input NAND gates NA11–NA13. To the first input terminals of the NAND gates NA11 and NA12 are fed the internal signal Y12 and the inverted internal signal Y12B, respectively, as mentioned previously, while to the third input terminals thereof is fed the internal control signal PYD in common. Further, the internal control signal CSA is fed to the second input terminal of the NAND gate NA12 and an inverted signal thereof is fed to the second input terminal of the NAND gate NA11. On the other hand, an output signal from the NAND gate NA11 is fed to the first input terminal of the NAND gate NA13, and an output signal from the NAND gate NA12 is fed to the second input terminal of the NAND gate NA13. To the third input terminal of the NAND gate NA13 is fed the internal control signal PYD. An output signal from the NAND gate NA13 is fed as an internal control signal IOC in common to one input terminal of a NAND gate NA14 in a WE clock generator 215 and that of a NAND gate 15 in a CAS clock generator 213. To the other input terminal of the NAND gate 14 is fed an internal control signal WPI which is formed by a front-stage circuit (not shown) in the WE clock generator 215, while to the other input terminal of the NAND gate 15 is fed an internal control signal DOCI which is formed by a front-stage circuit (not shown) in the CAS clock generator 213. An output signal from the NAND gate NA14 is inverted by an inverter and then fed as the internal control signal WP to the write amplifier 218. Likewise, an output signal from the NAND gate NA15 is inverted by an inverter and then fed as the internal control signal DOC to the data output buffer 221. The level of the internal control signal WPI is rendered high temporarily at a predetermined timing when the partial chips A and B are brought into a selected state in the write mode, while the level of the internal control signal DOC is rendered high at a predetermined timing when the partial chips are rendered into the selected state in the read mode.

Therefore, when the level of the internal control signal PYD is made high, the level of the internal control signal IOC is rendered high selectively on condition that the level of the internal control signal CSA and that of the internal signal Y12 are rendered low and high, respectively, or it is rendered high selectively on condition that the level of the internal control signal CSA and that of the inverted internal signal Y12B are both made high. In the case where the level of the internal control signal PYD is made low, the level of the internal control signal IOC is made high steadily independently of the internal control signal CSA, internal signal Y12 and inverted internal signal Y12B. Further, on condition that the level of the internal control signal IOC is made high, the level of the internal control signal WP is rendered high in accordance with an internal control signal WPI and the level of the internal control signal DOC is made high in accordance with the internal control signal DOCI. That is, as shown in FIG. 53, when the pad PTY is brought into the non-connected state NC, the partial chips A and B execute the storage data inputting or outputting operation at a predetermined timing, but in the case where the pad PRY is bonded to the source voltage supplying lead VCC, the partial chips A and B execute the inputting or outputting operation selectively upon receipt of the Y address signal Y12 of high level when the pad F3 is brought into the non-connected state NC, while when the pad F3 is bonded to the source voltage supplying lead VCC, the partial chips execute the inputting or outputting operation selectively upon receipt of the Y address signal Y12 of low level.

2.3. Variations of 64M DRAM Package Using Partial Chips

In FIG. 54 there is illustrated a list of 64M DRAM package products capable of being constituted on the basis of two 64M DRAM partial chips. FIGS. 55 to 59 are block diagrams of the DRAM packages described in the product list of FIG. 54. With reference to these figures, the following description is now provided about the kind, configuration and outline of 64M DRAM packages each capable of being constituted by two 64M DRAM partial chips. In the block diagrams of FIGS. 55 to 59 there are shown only normal portions of the partial chips as well as address signals and signal lines relating to input and output data.

2.3.1. Kind of 64M DRAM Packages Capable of Being Constituted

The 64M DRAM chips in this embodiment can take three kinds of bit configurations of 64M×1 bit, 16M×4 bits and 8M×8 bits because the bonding to pads F1 and F2 is executed selectively, as mentioned previously. Further, since the bonding to pads PTA and PTX or PTY is executed selectively, the row or column address space on the low or high address side can function selectively and partially in the unit of one half. Moreover, since the bonding to pad TC is executed selectively, the partial chips are accessed selectively or simultaneously, and since the bonding to pad F3 is executed selectively, conditions for selective activation or for selective IO execution are designated selectively. By combining two partial chips of the same bit configuration and accessing these partial chips selectively or simultaneously there can be constituted such seven kinds of 64M DRAM packages as shown in FIG. 54. As to the two kinds of DRAM packages having a bit configuration of 64M×1 bit, an explanation thereof will be omitted because they correspond to the embodiments illustrated in FIGS. 47 and 50. Although in all of these embodiments the row or column address space on the low address side is normal, there may be made a combination with the type wherein the row or column address space on the high address side is normal, or with the type wherein the row or column address space is normal on both low and high address sides.

Figure 55:
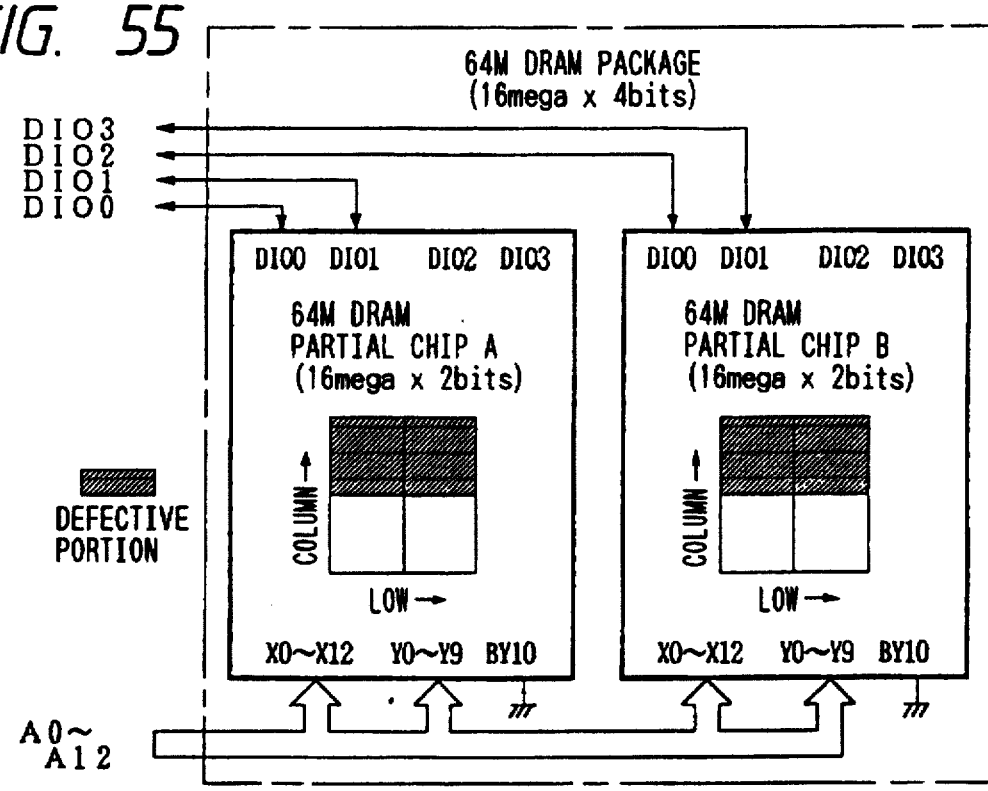
FIG. 55 is a block diagram showing a third example of a 64M DRAM package consisting of two DRAM partial chips according to the invention.

2.3.2. Outline of Various DRAM Packages (1) DRAM Package of 16M×45 bits wherein two partial chips of 16M×4 bits each having a column address space half of which is normal are accessed simultaneously:

Such a 64M DRAM package of 16M×4 bits as illustrated in FIG. 55 can be constituted by combining two 64M DRAM partial chips A and B of 16M×4 bits in each of which one half of the column address space can function normally and then by accessing these partial chips simultaneously. In this variation, 13-bit X address signals X0–X12 and 11-bit Y address signals Y0–Y10 are fed to address input pads A0–A12 of the partial chips A and B in common and time-sharingwise, and data input-output pads DIO0 and DIO1 of the partial chips are connected to corresponding data input-output terminals DIO0–DIO3 of the DRAM package. An internal address signal BY10 in each partial chip is fixed to the earth potential of the circuit, and the Y address signal Y10 is substantially ignored. As a result, the partial chips A and B are kept selected simultaneously and execute storage data inputting and outputting operations in parallel. Consequently, the DRAM package has a bit configuration of 16M×4 bits and inputs or outputs 4-bit storage data simultaneously. At this time, a refresh operation for the partial chips A and B is executed in a parallel manner and the refresh cycle as the DRAM package is 8K cycle/64 ms.

Figure 56:
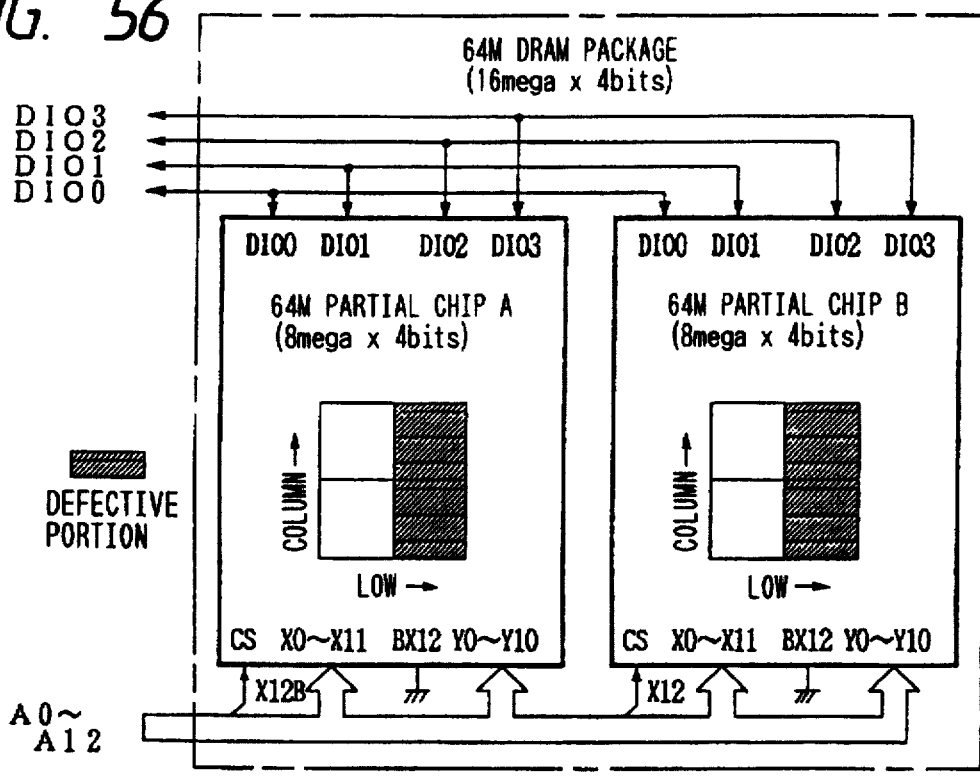
FIG. 56 is a block diagram showing a fourth example of a 64M DRAM package consisting of two DRAM partial chips according to the invention.

(2) DRAM Package of 16M×4 bits wherein two DRAM partial chips of 16M×4 bits each having a row address space half of which is normal are accessed selectively:

Such a 64M DRAM package of 16M×4 bits as shown in FIG. 56 can be constituted by combining two 64M DRAM partial chips A and B of 16M×4 bits in each of which one half of the row address space can function normally and then by accessing these partial chips selectively. In this variation, 13-bit X address signals X0–X12 and 11-bit Y address signals Y0–Y10 are fed to address input pads A0–A12 of the partial chips A and B in common and time-sharingwise. Data input-output pads DIO0–DIO3 of the partial chips are connected in common to corresponding data input-output terminals DIO0–DIO3 of the DRAM package. The level of an internal control signal CS in the partial chip A is rendered high selectively on condition that the level of the X address signal is made low, while the level of an internal control signal CS in the partial chip B is rendered high on condition that the level of the X address signal X12 is made high. The level of an internal address signal BX12 in each partial chip is fixed to the earth potential of the circuit, i.e., low level. Thus, the partial chip A is brought into a selected state electively when the level of the X address signal X12 is rendered low, and executes alone a storage data inputting or outputting operation in the unit of 4 bits. The partial chip B is brought into a selected state selectively when the level of the X address signal X12 is rendered high, and executes alone a storage data inputting or outputting operation in the unit of 4 bits. As a result, the DRAM package has a bit configuration of 16M×4 bits and it inputs or outputs 4-bit storage data simultaneously. At this time, a refresh operation for the partial chips A and B is executed selectively, but since one half of the row address space of each partial chip is normal, the refresh cycle as the DRAM package is 8K cycle/64 ms.

Figure 57:
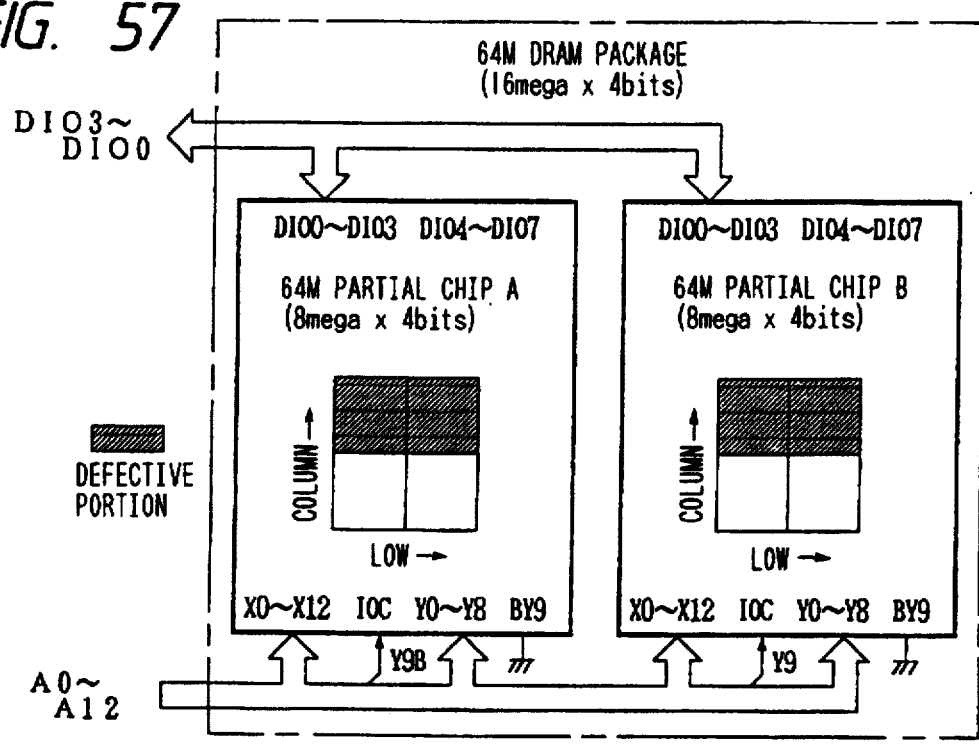
FIG. 57 is a block diagram showing a fifth example of a 64M DRAM package consisting of two DRAM partial chips according to the invention.

(3) DRAM Package of 16M×4 bits wherein two DRAM partial chips of 8M×8 bits each having a column address space half of which is normal are accessed simultaneously:

Such a 64M DRAM package of 16M×4 bits as shown in FIG. 57 can be constituted by combining two 64M DRAM partial chips A and B in each of which one half of the column address space can function normally and then by accessing these partial chips simultaneously. In this variation, 13-bit X address signals X0–X12 and 10-bit Y address signals Y0–Y9 are fed to address input pads A0–A12 of the partial chips A and B in common and time-sharingwise, and data input-output pads DIO0–DIO3 of the partial chips are connected to corresponding data input-output terminals DIO0–DIO3 of the DRAM package. The level of an internal controls signal IOC in the partial chip A is rendered high selectively on condition that the level of the Y address signal Y9 is made low, while the level of an internal control signal IOC in the partial chip B is rendered high selectively on condition that the level of the Y address signal Y9 is made high. The level of an internal address signal BY9 in each partial chip is fixed to the earth potential of the circuit, i.e., low level. As a result, the partial chips A and B are kept selected simultaneously and execute 4-bit storage data inputting or outputting operation selectively in accordance with the Y address signal Y9. Consequently, the DRAM package has a bit configuration of 16M×4 bits and it inputs or outputs 4-bit storage data simultaneously. At this time, a refresh operation for the partial chips A and B is executed in a parallel manner, so the refresh cycle as the DRAM package is 8K cycle/64 ms.

Figure 58:
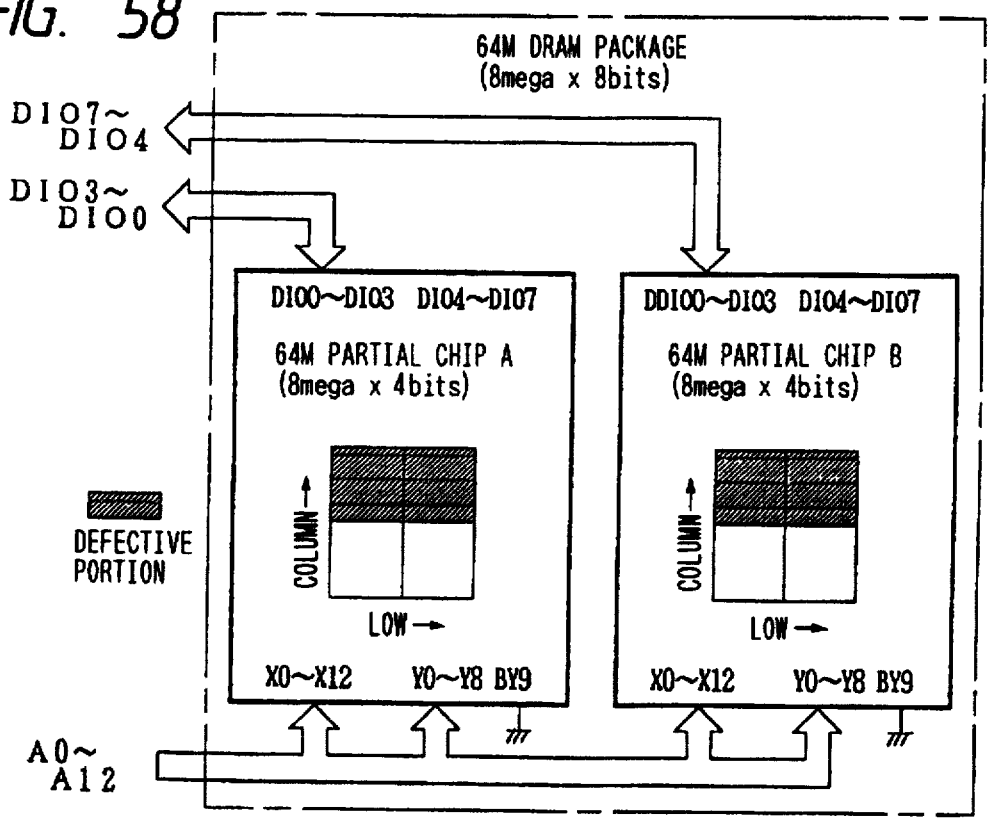
FIG. 58 is a block diagram showing a sixth example of a 64M DRAM package consisting of two DRAM partial chips according to the invention.

(4) DRAM Package of 8M×8 bits wherein two DRAM partial chips of 8M×8 bits each having a column address space half of which is normal are accessed simultaneously:

Such a 64M DRAM package of 8M×8 bits as shown in FIG. 58 can be constituted by combining two 64M DRAM partial chips A and B of 8M×8 bits in each of which half of the column address space can function normally and then accessing these partial chips simultaneously. In this variation, 13-bit X address signals X0–X12 and 10-bit Y address signals Y0–Y9 are fed to address input pads A0–A12 of the partial chips A and B in common and time-sharingwise, and data input-output pads DIO0–DIO3 thereof are connected to corresponding data input-output terminals DIO0–DIO3 and DIO4–DIO7 of the DRAM package. The level of an internal address signal BY9 in each partial chip is fixed to the earth potential of the circuit, i.e., low level, and the Y address signal Y9 is substantially ignored. As a result, the partial chips A and B are brought into a selected state simultaneously and execute a 4-bit storage data inputting or outputting operation in a parallel manner. Consequently, the DRAM package has a bit configuration of 8M×8 bits and it inputs or outputs 8-bit storage data simultaneously. At this time, a refresh operation for the partial chips A and B is executed in a parallel manner, so the refresh cycle as the DRAM package is 8K cycle/64 ms.

Figure 59:
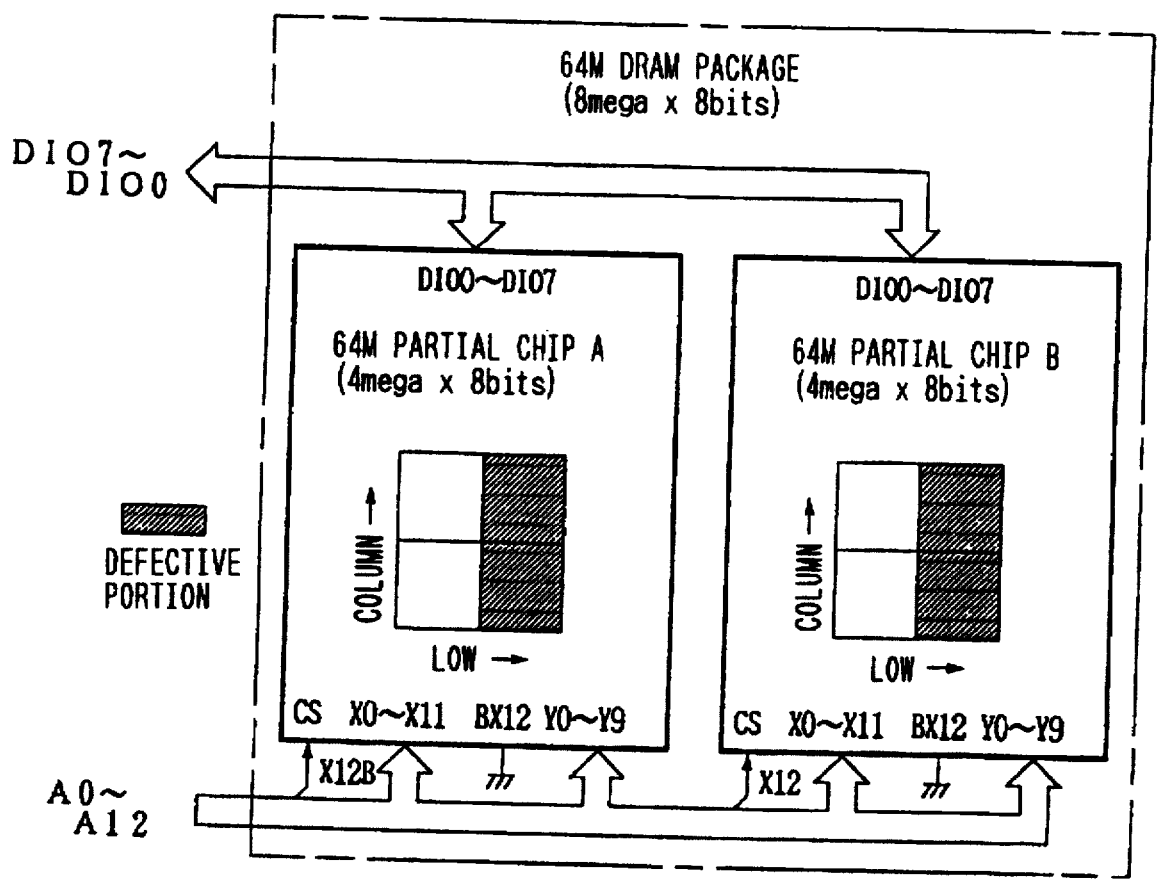
FIG. 59 is a block diagram showing a seventh example of a 64M DRAM package consisting of two DRAM partial chips according to the invention.

(5) DRAM Package of 8M×8 bits wherein two DRAM partial chips of 8M×8 bits each having a row address space half of which is normal are accessed selectively:

Such a 64M DRAM package of 8M×8 bits as shown in FIG. 59 can be constituted by combining two 64M DRAM partial chips A and B of 8M×8 bits in each of which half of the row address space can function normally and then by accessing these partial chips selectively. In this variation, 13-bit X address signals X0–X12 and 10-bit Y address signals Y0–Y9 are fed to address input pads A0–A12 of the partial chips A and B in common and time-sharingwise, and data input-output pads DIO0–DIO7 thereof are fed to corresponding data input-output terminals DIO0–DIO7 of the DRAM package in common. The level of an internal control signal CS in the partial chip A is rendered high on condition that the level of the X address signal X12 is made low, while the level of an internal control signal CS in the partial chip B is rendered high on condition that the level of the X address signal X12 is made high. The level of an internal address signal BX12 in each partial chip is fixed to the earth potential of the circuit, i.e., low level. As a result, the partial chip A is brought into a selected state selectively when the level of the X address signal X12 is made low and it executes alone a storage data inputting or outputting operation in the unit of 8 bits, while the partial chip B is brought into a selected state selectively when the level of the X address signal X12 is rendered high and it executes alone a storage data inputting or outputting operation in the unit of 8 bits. Consequently, the DRAM package has a bit configuration of 8M×8 bits and it inputs or outputs 8-bit storage data simultaneously. At this time, a refresh operation for the partial chips A and B is executed selectively, but since one half of the row address space in each partial chip is normal, the refresh cycle as the DRAM package is 8K cycle/64 ms.

2.4. Evaluation

Thus, the 64M DRAM package of this embodiment is constituted by mounting two 64M DRAM partial chips in each of which one half of the row or column address space can function normally, onto a single package according to the double chip packaging method. In the two partial chips which constitute the DRAM package, since predetermined bondings are executed selectively, the portion incapable of functioning normally are nullified selectively, while conditions for the selection of the portions capable of functioning normally are set selectively. As a result, there can be attained the following effects.

(1) By combining DRAM chips partially incapable of functioning normally there can be constituted a DRAM package having the same interface as that of a DRAM package constituted by one full chip in which all the address spaces can function normally, and also having interchangeability with such single chip DRAM package.

(2) As illustrated in FIG. 60, since DRAM chips partially incapable of functioning normally can be utilized and relieved as partial chips, it is possible to improve the product yield of DRAM chips. For example, in connection with FIG. 60, fourty five 64M DRAM packages can be obtained from one wafer according to the conventional method not utilizing DRAM chips partially incapable of functioning normally, but in the case where two partial chips are combined together according to the double chip packaging method, there can be obtained a total of seventy five 64M DRAM packages. As a result, it is possible to improve the product yield of DRAM chips and attain the reduction of cost of the DRAM package.

(3) Since predetermined bondings are executed selectively, it is possible to selectively nullify the portions of partial chips incapable of functioning normally and selectively set conditions for the selection of the portions capable of functioning normally, and hence it is possible to optionally combine and utilize partial chips having same portions incapable of functioning normally.

3. Application Examples of the Double Chip Packaging Method

In each of the embodiments described above, a single DRAM package is constituted by combining plural sub chips or partial chips having the same function and formed under the same conditions, but the plural semiconductor chips which constitute the package are not always required to have the same function, nor is it necessary for them to be fabricated under the same conditions. Application examples of the double chip packaging method wherein a plurality of different semiconductor chips are combined together will be outlined below.

3.1. Chip Division by Function in DRAM Package

Figure 61:
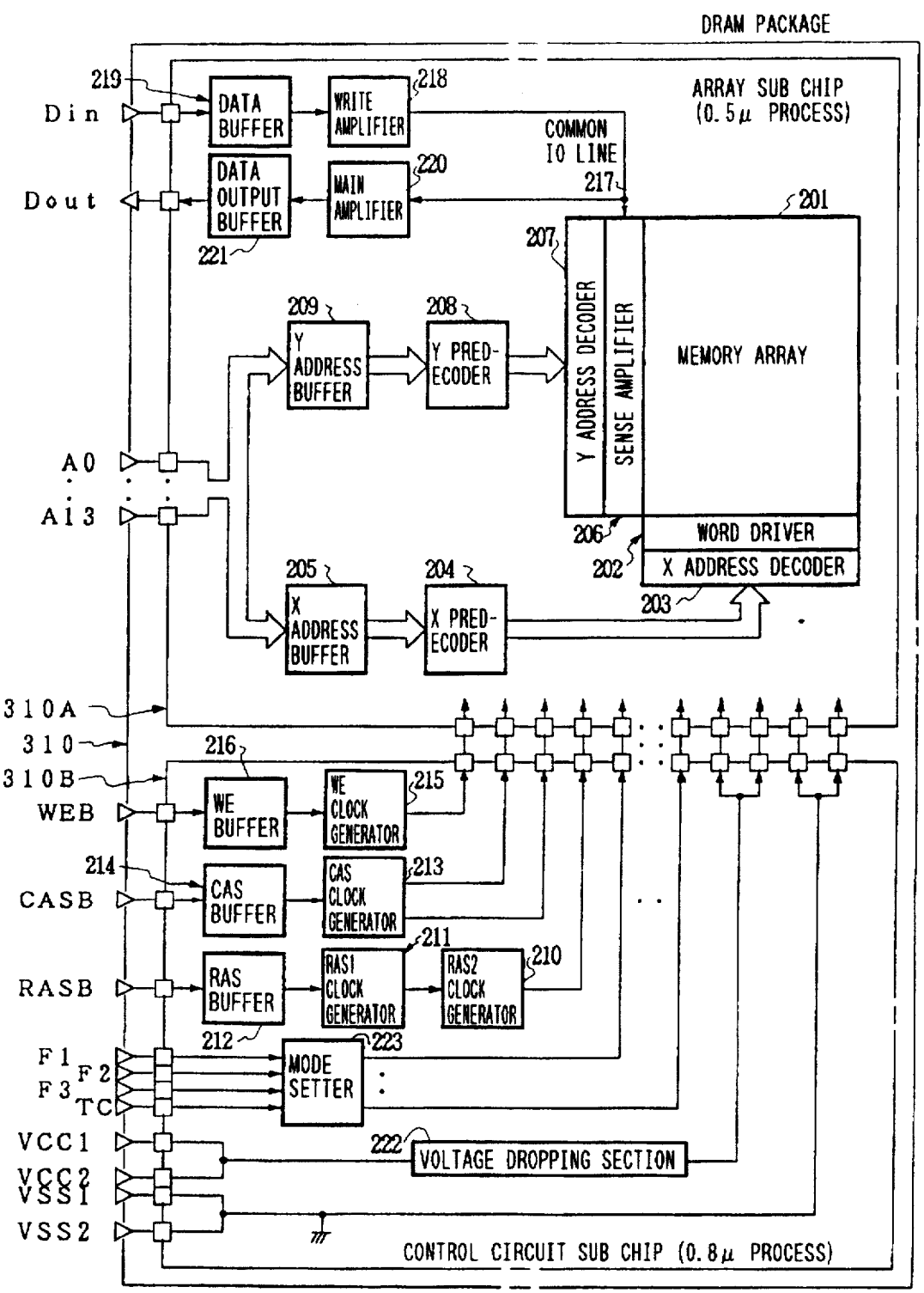
FIG. 61 is a block diagram showing an example of a DRAM package consisting of two function-divided sub chips.

FIG. 61 is a block diagram showing a first example of a DRAM package consisting of two different semiconductor chips. In FIG. 61, the DRAM package, indicated at 310, comprises two sub chips 310A (first sub chip) and 310B (second sub chip) as a basic configuration. Though not specially limited, the sub chip 310A is constituted by a block of a relatively high integration density, including memory array 201, word driver 202, X address decoder 203, X predecoder 204, X address buffer, sense amplifier 206, Y address decoder 207, Y predecoder 208, write amplifier 218, data input buffer 219, main amplifier 220, and data output buffer 221. Therefore, the sub chip 310A is named an array sub chip and is formed by a so-called 0.5 μm manufacturing process. On the other hand, the sub chip 310B is constituted by a block of a relatively low integration density, including so-called indirect peripheral circuits such as RAS2 clock generator 210, RAS1 clock generator 211, RAS buffer 212, CAS clock generator 213, CAS buffer 214, WE clock generator 215, WE buffer 216, voltage dropping section 222, and mode setter 223. Therefore, the sub chip 310B is named a control circuit sub chip and is formed by a so-called 0.8 μm manufacturing process.

The sub chips 310A and 310B are made integral with each other to constitute a single DRAM package according to the double chip packaging method. In this case, these sub chips are connected to external terminals of the DRAM package by wire bonding through plural pads, and are connected to each other by wire bonding through other plural pads.

Thus, by functionally dividing the plural constituent blocks of the DRAM package into plural sub chips according to their integration densities and manufacturing processes and by making these sub chips integral with each other according to the double chip packaging method, it is possible to simplify the manufacturing process while making an optimal functional division of the DRAM package. The sub chips 310A and 310B are different in the integration density and manufacturing process so are different in the product yield. If these blocks are accommodated in a single semiconductor chip as in the prior art, the product yield of the block included in the sub chip 310B and capable of being expected to be relatively high is lowered by a relatively low product yield of the block included in the sub chip 310A. As in this embodiment, by accommodating blocks different in product yield in two semiconductor chips and making these semiconductor chips integral with each other according to the double chip packaging method it is made possible to improve the product yield as the entire DRAM package.

3.2. Chip Division by Bit in DRAM Package

Figure 62:
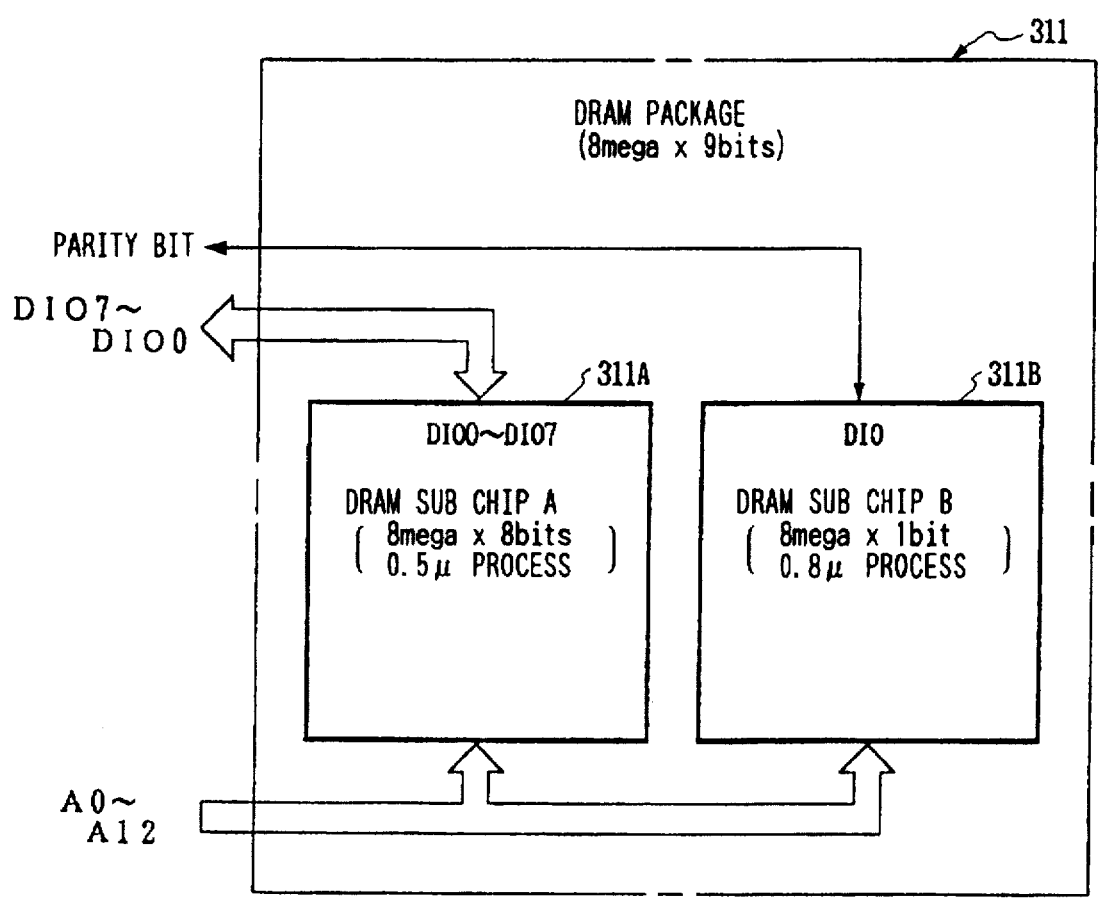
FIG. 62 is a block diagram showing an example of a DRAM package consisting of two bit-divided sub chips.

FIG. 62 is a block diagram showing a second example of a DRAM package consisting of two different semiconductor chips. In FIG. 61, the DRAM package 311, indicated at 311, comprises two sub chips 311A (third sub chip) and 311B (fourth sub chip) as a basic configuration. The sub chip 311A is a DRAM chip of a relatively high integration density having a bit configuration of 8M×8 bits and is formed by the 0.5μ manufacturing process. On the other hand, the sub chip 311B is a DRAM chip of a relatively low integration density having a bit configuration of 8M×1 bit and is formed by the 0.8 μm manufacturing process.

The sub chips 311A and 311B are rendered integral with each other to constitute a single DRAM package according to the double chip packaging method. In this case, address input pads A0–A12 of these sub chips are connected in common to address input terminals A0–A12 of the DRAM package. Data input-output pads DIO0–DIO7 of the sub chip 311A are connected to corresponding data input-output terminals DIO0–DIO7 of the DRAM package, while a data input-output pad DIO of the sub chip 311B is connected to a data input-output terminal for parity bit of the DRAM package.

Thus, by dividing the plural constituent blocks of the DRAM package in correspondence to predetermined bits of storage data and making these sub chips integral with each other according to the double chip packaging method there can be easily realized a DRAM package having a non-general bit configuration. Further, the relief of a partial chip can be done by using a partial chip formed according to the same manufacturing process as that for the sub chip 311A, in place of the sub chip 311B.

3.3. Chip Division by Function in Microcomputer Package

Figure 64:
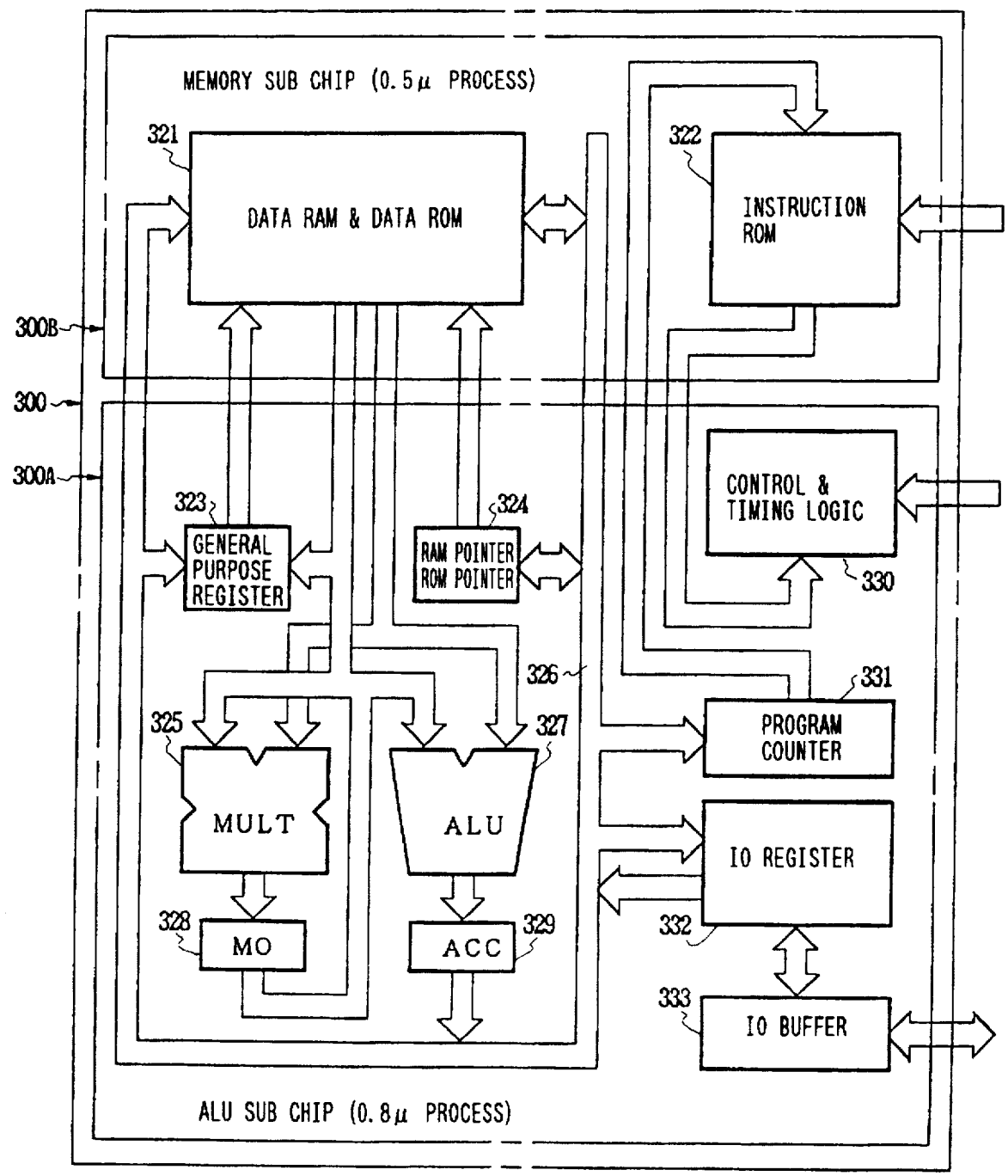
FIG. 64 is a block diagram showing an example of a microcomputer package consisting of two function-divided sub chips.
Figure 65:
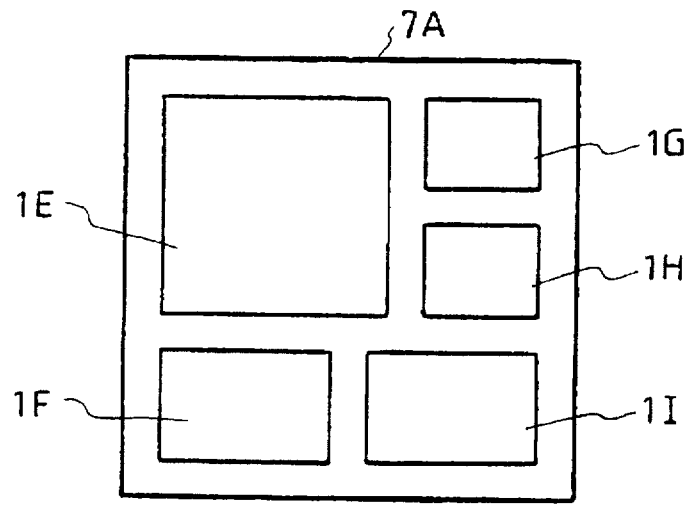
FIG. 65 is a plan view of a substrate in a conventional multi-chip module.
Figure 66:
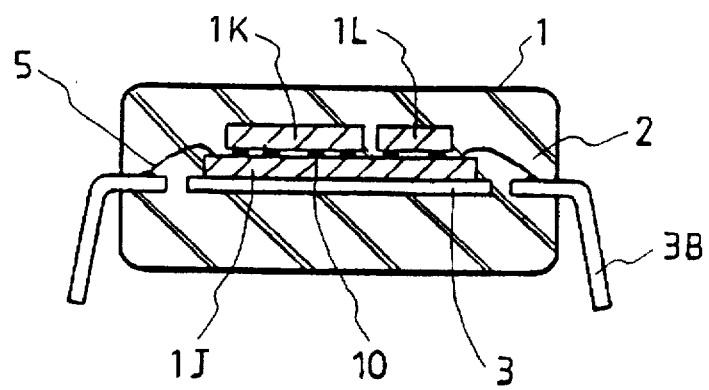
FIG. 66 is a structural sectional view showing another example of a conventional multi-chip module.
Figure 67:
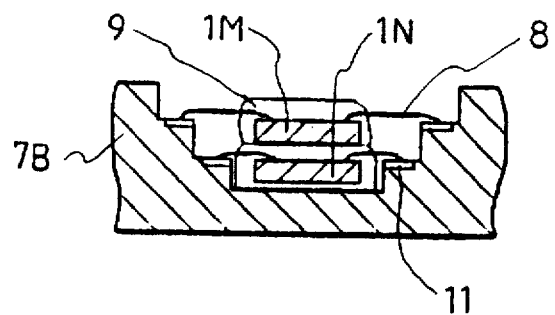
FIG. 67 is a structural sectional view showing a further example of a conventional multi-chip module.

FIG. 64 is a block diagram showing an example of a microcomputer package comprising two different semiconductor chips. In FIG. 64, the microcomputer package, indicated at 320, comprises two sub chips 320A (fifth sub chip) and 320B (sixth sub chip) as a basic configuration. The sub chip 320A is constituted by a block of a relatively high integration density, including a data RAM (data ROM) 321 and an instruction ROM 322. Therefore, the sub chip 320A is named a memory sub chip and is formed by the 0.5 μm manufacturing process. On the other hand, the sub chip 320B is constituted by a block of a relatively low integration density, including arithmetic logical operation unit 327, multiplication unit 325, general-purpose register 323, RAM pointer (ROM pointer) 324, internal bus 326, multiplication unit output register 328, accumulator 329, control (timing) logic 330, program counter 331, IO register 332, and IO buffer 333. Therefore, the sub chip 320B is named an ALU sub chip and is formed by the 0.8 μm manufacturing process.

The sub chips 320A and 320B are made integral with each other to constitute a single microcomputer package according to the double chip packaging method. In this case, these sub chips are connected to external terminals of the microcomputer package by wire bonding through plural pads and are connected to each other through other plural pads.

Figure 63:
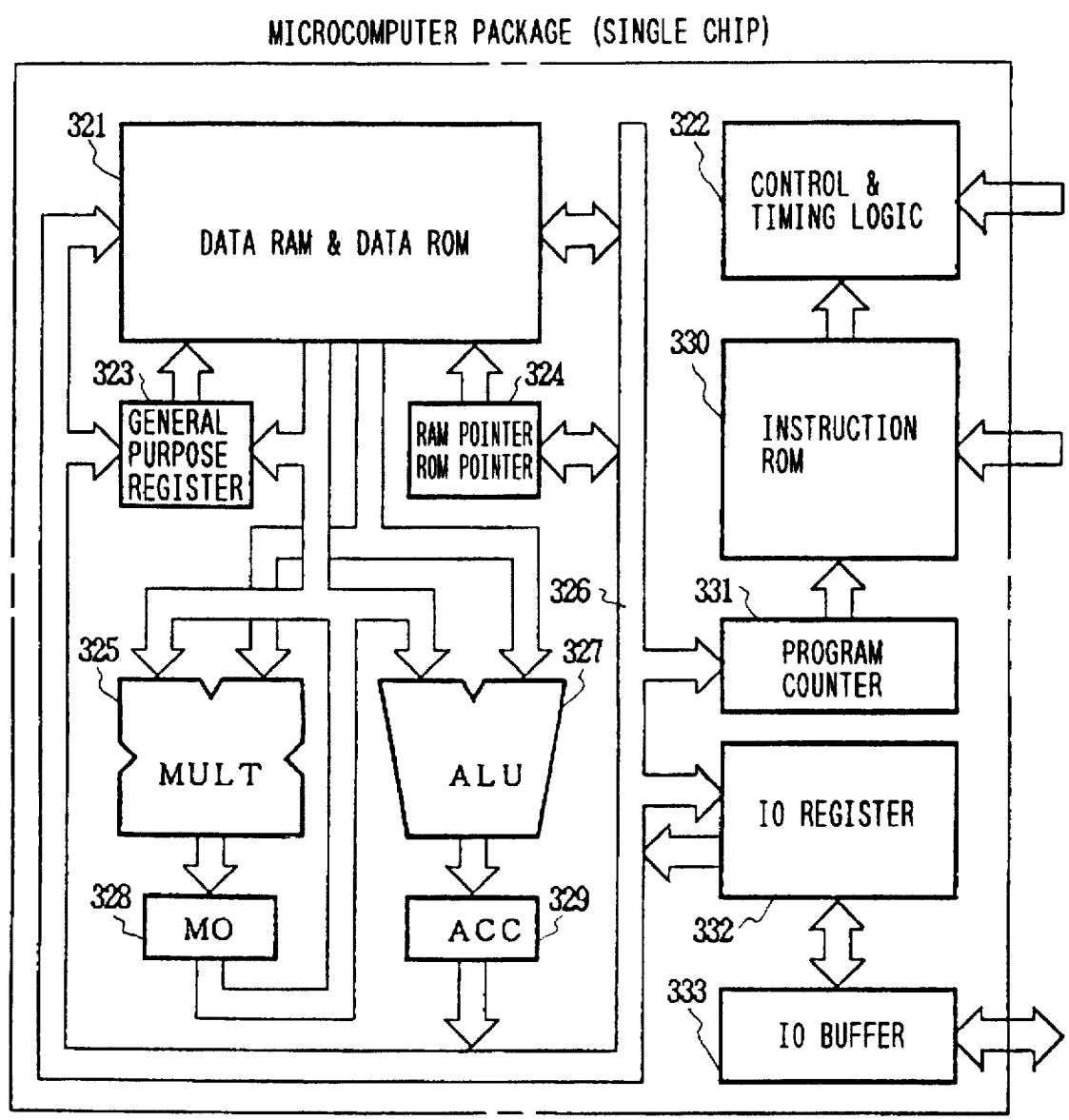
FIG. 63 is a block diagram showing an example of a conventional microcomputer package.

Thus, by functionally dividing the plural constituent blocks of the microcomputer package into plural sub chips according to their integration densities and manufacturing processes and by making these sub chips integral with each other according to the double chip packaging method, it is possible to simplify the manufacturing process while making an optimal functional division of the microcomputer package. The sub chips 320A and 320B are different in the integration density and manufacturing process so are different in the product yield. As shown in FIG. 63, the product yield as the entire microcomputer package is improved in comparison with the conventional microcomputer package having such blocks accommodated in a single semiconductor chip.

The present invention has been described above concretely on the basis of plural embodiments thereof, but it goes without saying that the invention is not limited thereto and that various modifications may be made within the scope not departing from the gist of the invention. For example, in the DRAM package block diagrams of FIG. 1 and other figures, the memory capacity and bit configuration of each sub chip can be set optionally, and the memory capacity and bit configuration as DRAM package are also optional. For example, a 64M DRAM package can be constituted using two 32M DRAM sub chips, and a 256M DRAM package can be constituted using two 128M DRAM sub chips. Further, each sub chip and DRAM package can have a bit configuration of, say, ×16 bits or ×32 bits. In such a multi-bit DRAM package it is possible to considerably reduce the number of bonding pads formed on each sub chip by, for example, accessing two sub chips simultaneously and executing a storage data inputting or outputting operation in a parallel manner. The DRAM package and DRAM sub chips do not require the adoption of an address multiplex mode as an essential condition nor is their block configuration restricted by the above embodiments. Also as to the refresh cycle, parallel test and high-speed column mode for the DRAM package and DRAM sub chips, what method and kind are to be adopted is optional. In FIGS. 5 and 6, the memory array dividing method for each DRAM sub chip can take various other modes, and this is also true of related layout and address allocation. As to the arrangement of bonding pads provided on the semiconductor substrate surface, various modes of arrangement may be adopted on condition that they are arranged in the form of planar symmetry. In FIGS. 13 to 18, the DRAM package can take any other package form than SOJ, and concrete structures thereof are not restricted by the above embodiments. In FIGS. 19 to 23, the DRAM package manufacturing processes using the double chip packaging method are mere examples and the present invention is not limited thereby at all. In the 64M DRAM package block diagrams of FIG. 47 and other figures, there may be used partial chips in each of which one fourth of the row or column address space can function normally. In this case, pads for designating the normal portion and for setting conditions for the selection must be provided accordingly. In the circuit diagrams of FIGS. 39, 48, 49, 51 and 52, the logical configurations of the X and Y address buffers are not restricted by those embodiments, and the combination and polarity of source voltages as well as the conductivity type of MOSFET can take various forms. In FIG. 61, as to the functional division of DRAM package, for example the X address buffer 205 and the Y address buffer 209 may be included in the sub chip 310B. In FIG. 64, the block configuration of the microcomputer is not restricted by the illustrated embodiment and the functional division thereof is optional.

Although in the above description the present invention is applied to DRAM packages and microcomputer packages in the utilization field as the background field, the invention is not limited thereto. For example, the present invention is also applicable to various memory packages including a static type RAM, etc. as a basic configuration and various digital integrated circuit package including a gate array integrated circuit, etc. as a basic configuration. The present invention is widely applicable to semiconductor devices each comprising plural semiconductor chips and also to digital systems each including such semiconductor device.

A pair of DRAM chips are mounted oppositely to each other while wiring means such as lead frames substantially integral with external terminals are put therebetween, then these DRAM chips and lead frames are connected together by the conventional wire bonding pad method, for example. Further, plural pairs of DRAM chips and lead frames thus bonded are stacked and corresponding leads of the lead frames are connected in common to form a laminate. Then, the plural DRAM chips thus mounted are activated selectively in accordance with a predetermined chip selection signal or are allowed to execute a storage data inputting or outputting operation selectively. Utilizing this chip mounting method, a single DRAM package is constituted by combining partial DRAM chips capable of partially functioning normally. Consequently, there can be realized an effective chip mounting method which permits the mounting of plural sub chips of the same size without sacrificing the heat radiation characteristic of package and the product yield; besides, it is possible to attain a large capacity of a DRAM package, etc., promote the reduction of power consumption thereof and simplify the manufacturing process, while suppressing the increase in size of the package. Moreover, it is possible to realize a DRAM package having a memory capacity which is plural times that of a package of the same size and constituted by a single DRAM sub chip, and thus the limit in memory capacity of a DRAM chip, etc. can be expanded. So it is possible to enhance the packaging efficiency of a memory system, etc. including a DRAM package as a basic configuration and reduce the cost thereof. Additionally, partial DRAM chips can be utilized effectively without waste and hence it is possible to improve the substantial product yield of DRAM chips, etc.

What is claimed is:

1. A stacked arrangement of semiconductor devices, comprising:
   a first semiconductor device, including
   (i) a first semiconductor substrate having a first main surface and a second main surface, opposing said first surface;
   (ii) a first row of bonding pads provided in a central portion of said first main surface of said first semiconductor substrate, said first row of bonding pads consisting of at least a first and a second bonding pad; and
   (iii) a first lead electrically connected to said first bonding pad and arranged over said first main surface at one side of said first row of bonding pads, and a second lead electrically connected to said second bonding pad and arranged over said first main surface at the other side of said first row of bonding pads, and
   a second semiconductor device, including
   (i) a second semiconductor substrate having a first main surface and a second main surface, opposing said first surface;
   (ii) a second row of bonding pads having a same bonding pad arrangement as that of said first row of bonding pads and provided in a central portion of said first main surface of said second semiconductor substrate, said second row of bonding pads consisting of at least a third and a fourth bonding pad; and
   (iii) a third lead electrically connected to said fourth bonding pad and arranged over said first main surface at one side of said second row of bonding pads, and a fourth lead electrically connected to said third bonding pad and arranged over said first main surface at the other side of said second row of bonding pads,
   wherein said first and second semiconductor devices are stacked in a manner such that the second surfaces of said first and second semiconductor substrates are positioned to be facing toward each other, and
   wherein said first lead is electrically connected to said fourth lead, and said second lead is electrically connected to said third lead.

2. A stacked arrangement of semiconductor devices according to claim 1,
   wherein said first and second semiconductor substrates are rectangular shaped and each has a first main surface area defined by a first pair of opposing edge sides and a second, relatively longer pair of opposing edge sides,
   wherein said first row and said second row of bonding pads are arrayed along a direction of said second pair of opposing edge sides of said first and second semiconductor substrates, respectively, and
   wherein said first and second leads and said third and fourth leads are extended in a direction of said first pair of opposing edge sides of said first and second semiconductor substrates, respectively.

3. A stacked arrangement of semiconductor devices according to claim 2,
   wherein the stacked arrangement of said first and second semiconductor devices is sealed in a molding resin package.

4. A stacked arrangement of semiconductor devices according to claim 2,
   wherein said first and second semiconductor substrates, said first and second rows of bonding pads and the electrical connections effected between the first and fourth leads and between the second and third leads are sealed within a molding resin package.

5. A stacked arrangement of semiconductor devices according to claim 4,
   wherein said molding resin package is rectangle-shaped and is provided with a first group of external leads and a second group of external leads, said first group of external leads and said second group of external leads protrude outwardly from different ones of a pair of opposing outer side surface thereof, said first group of external leads being contiguous with a first group of inner leads provided within the package and said second group of external leads being contiguous with a second of inner leads provided within said package, and
   wherein each leads in said first and second group of inner leads is extended inwardly and is contiguous with one of the electrical connections made between one or more bonding pads of said first semiconductor substrate with that of one or more bonding pads of said second semiconductor substrate.

6. A stacked arrangement of semiconductor devices according to claim 5,
   wherein said pair of opposing outer side surfaces which have said external leads protruding therefrom correspond to those surfaces of the package which are substantially parallel to said second pair of opposing edge sides of said first and second semiconductor substrates in the stacked arrangement.

7. A stacked arrangement of semiconductor devices according to claim 6,
   wherein said first and second semiconductor substrates constitute first and second semiconductor chips, and
   wherein said first row of bonding pads is aligned with said second row of bonding pads, in the stacked arrangement, such that similarly functioning bonding pads are located in the same relative position in both of said first and second semiconductor chips for facilitating an electrical connection between them.

8. A stacked arrangement of semiconductor devices according to claim 7,
   wherein said first and second semiconductor chips are memory chips.

9. A sealed stacked arrangement of semiconductor devices, comprising:

a first semiconductor device, including
- (i) a first rectangle-shaped semiconductor chip having a front surface and a rear surface, and having a first pair of edge sides and a second, longer pair of edge sides;
- (ii) a first row of bonding pads, provided at a central portion of said front surface of said first semiconductor chip, being arranged in a direction parallel to the longer edge sides of said first semiconductor chip and consisting of first bonding pads and second bonding pads;
- (iii) first leads electrically connected to said first bonding pads, all of said first leads being arranged over said front surface of the first chip, at one side of said first row of bonding pads, and being extended toward one of the pair of longer edge sides thereof; and
- (iv) second leads electrically connected to said second bonding pads, all of said second leads being arranged over said front surface of the first chip, at the other side of said first row of bonding pads, and being extended toward the other of the pair of longer edge sides thereof; and a second semiconductor device, including
- (i) a second rectangle-shaped semiconductor chip having a first, front surface and a second, rear surface, and having a first pair of edge sides and a second, longer pair of edge sides;
- (ii) a second row of bonding pads having a same bonding pad arrangement as that of said first row of bonding pads and provided at a central portion of said front surface of said second semiconductor chip, said second row of bonding pads being directioned in parallel to the longer edge sides of said second semiconductor chip and consisting of third bonding pads and fourth bonding pads;
- (iii) third leads electrically connected to said fourth bonding pads, all of said third leads being arranged over said front surface of the chip, at one side of said second row of bonding pads, and being extended toward one of the pair of longer edge sides thereof; and
- (iv) fourth leads electrically connected to said third bonding pads, all of said fourth leads being arranged over said front surface of the second chip, at the other side of said second row of bonding pads, and being extended toward the other of the pair of longer edge sides, wherein said first and second semiconductor devices are stacked in a manner such that the rear surfaces of said first and second semiconductor chips are positioned so as to be facing toward each other, and wherein each of said first leads is electrically connected to one of said fourth leads, and each of said second leads is electrically connected to one of said third leads.

10. A sealed stacked arrangement of semiconductor devices according to claim 9, wherein the stacked arrangement of said first and second semiconductor devices is sealed in a molding resin package.

11. A sealed stacked arrangement of semiconductor devices according to claim 9, wherein said first and second semiconductor chips, said first and second rows of bonding pads and the electrical connections effected between said first leads and said fourth leads and between said second leads and said third leads are sealed within a rectangle-shaped molding resin package.

12. A sealed stacked arrangement of semiconductor devices according to claim 11, wherein said rectangle-shaped molding resin package is provided with a first group of external leads and a second group of external leads, said first group of external leads and said second group of external leads protrude outwardly from different ones of a pair of opposing outer side surfaces thereof, said first group of external leads being contiguous with a first group of inner leads provided within the package and said second group of external leads being contiguous with a second group of inner leads provided within said package, and wherein each lead in said first and second groups of inner leads is extended inwardly and is contiguous with one of the electrical connections made between one or more bonding pads of said first semiconductor chip with that of one or more bonding pads of said second semiconductor chip.

13. A sealed stacked arrangement of semiconductor devices according to claim 12, wherein said pair of opposing outer side surfaces which have said external leads protruding therefrom correspond to those surfaces of the package which are substantially parallel to said second pair of opposing edge sides of said first and second semiconductor chips in the stacked arrangement.

14. A sealed stacked arrangement of semiconductor devices according to claim 13, wherein said first and second semiconductor chips have a similar function and are aligned back-to-back in a manner such that said first row of bonding pads is aligned with said second row of bonding pads, in the stacked arrangement, such that similarly functioning bonding pads are located in the same relative position in both of said first and second chips for facilitating electrical connection between them.

15. A sealed stacked arrangement of semiconductor devices according to claim 14, wherein said first and second semiconductor chips are memory chips.

16. A sealed stacked arrangement of semiconductor devices according to claim 9, wherein said first and second semiconductor chips are memory chips.

* * * * *